(12) United States Patent
Yoo et al.

(10) Patent No.: US 9,909,058 B2
(45) Date of Patent: Mar. 6, 2018

(54) PHOSPHOR, PHOSPHOR MANUFACTURING METHOD, AND WHITE LIGHT EMITTING DEVICE

(75) Inventors: Jae Soo Yoo, Seoul (KR); Kyung Pil Kim, Seoul (KR); Hyun Ju Lee, Seoul (KR); Chang Soo Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 976 days.

(21) Appl. No.: 12/991,745

(22) PCT Filed: Sep. 2, 2010

(86) PCT No.: PCT/KR2010/005955
§ 371 (c)(1),
(2), (4) Date: Nov. 9, 2010

(87) PCT Pub. No.: WO2011/028033
PCT Pub. Date: Mar. 10, 2011

(65) Prior Publication Data
US 2011/0180780 A1 Jul. 28, 2011

(30) Foreign Application Priority Data

Sep. 2, 2009 (KR) .................. 10-2009-0082417
Aug. 10, 2010 (KR) .................. 10-2010-0077071

(51) Int. Cl.
*H01L 33/06* (2010.01)
*C09K 11/08* (2006.01)
(Continued)

(52) U.S. Cl.
CPC ...... *C09K 11/0883* (2013.01); *C09K 11/7734* (2013.01); *H01L 33/502* (2013.01);
(Continued)

(58) Field of Classification Search
USPC ............... 257/76, 89, 98, 301.4 F, E33.061, 257/E33.034; 313/503, 512
See application file for complete search history.

(56) References Cited

U.S. PATENT DOCUMENTS 5,076,860 A * 12/1991 Ohba et al. ................. 148/33.1
6,069,440 A    5/2000 Shimizu et al. ............. 313/486
(Continued)

FOREIGN PATENT DOCUMENTS

JP    2003-206481 A    7/2003
JP    2003-336059 A    11/2003
(Continued)

OTHER PUBLICATIONS

"Blue-emitting AlN:Eu2+ nitride phosphor for field emission displays" by Xie et al. Applied Physics Letters 91, 061101_2007.*
(Continued)

*Primary Examiner* — Marc Armand
*Assistant Examiner* — Sue Tang
(74) *Attorney, Agent, or Firm* — KED & Associates, LLP

(57) ABSTRACT

Provided are a phosphor, a phosphor manufacturing method, and a white light emitting device. The phosphor is represented as a chemical formula of $aMO\text{-}bAl_2O_3\text{-}cSi_3N_4$, which uses light having a peak wavelength in a wavelength band of about 350 nm to about 480 nm as an excitation source to emit visible light having a peak wavelength in a wavelength band of about 480 nm to about 680 nm (where M is one kind or two kinds of elements selected from Mg, Ca, Sr, and Ba ($0.2 \leq a/(a+b) \leq 0.9$, $0.05 \leq b/(b+c) \leq 0.85$, $0.4 \leq c/(c+a) \leq 0.9$)).

18 Claims, 33 Drawing Sheets

(51) Int. Cl.
*C09K 11/77* (2006.01)
*H01L 33/50* (2010.01)

(52) U.S. Cl.
CPC .. *H01L 33/504* (2013.01); *H01L 2224/48091* (2013.01); *H01L 2224/48257* (2013.01); *H01L 2224/49107* (2013.01); *H01L 2224/8592* (2013.01); *H01L 2924/181* (2013.01); *Y02B 20/181* (2013.01)

(56) References Cited

U.S. PATENT DOCUMENTS

| | | | |
|---|---|---|---|
| 7,061,024 B2 | 6/2006 | Schmidt et al. | 257/98 |
| 7,075,116 B2 | 7/2006 | Okazaki | 257/98 |
| 7,345,418 B2 | 3/2008 | Nagatomi et al. | 313/503 |
| 7,524,437 B2 | 4/2009 | Sakane et al. | 252/301.4 F |
| 7,541,206 B2 | 6/2009 | Yoon et al. | 438/29 |
| 7,791,265 B2 | 9/2010 | Fiedler et al. | 313/503 |
| 7,820,074 B2 | 10/2010 | Kim et al. | 252/301.4 R |
| 7,868,343 B2 | 1/2011 | Negley et al. | 257/99 |
| 7,887,718 B2 | 2/2011 | Nagatomi et al. | 252/301.4 |
| 7,888,670 B2 | 2/2011 | Han et al. | 257/13 |
| 7,946,724 B2 | 5/2011 | Shin et al. | 362/97.3 |
| 8,183,557 B2 | 5/2012 | Iza et al. | 257/22 |
| 8,222,805 B2 | 7/2012 | Zhang et al. | 313/503 |
| 8,294,165 B2 | 10/2012 | Hattori et al. | 257/98 |
| 8,344,400 B2 | 1/2013 | Kim et al. | 257/98 |
| 8,372,309 B2 | 2/2013 | Nagatomi et al. | 252/301.4 F |
| 8,685,277 B2 * | 4/2014 | Fukuda et al. | 252/301.4 F |
| 2003/0030038 A1 | 2/2003 | Mitomo et al. | 252/500 |
| 2003/0094893 A1 | 5/2003 | Ellens et al. | 313/503 |
| 2004/0183085 A1 | 9/2004 | Okazaki | 257/98 |
| 2004/0217692 A1 | 11/2004 | Cho et al. | 313/503 |
| 2004/0245532 A1* | 12/2004 | Maeda et al. | 257/89 |
| 2005/0001225 A1 | 1/2005 | Yoshimura et al. | 257/98 |
| 2005/0057145 A1* | 3/2005 | Shieh et al. | 313/503 |
| 2005/0224829 A1 | 10/2005 | Negley et al. | 257/99 |
| 2006/0076883 A1* | 4/2006 | Himaki et al. | 313/503 |
| 2006/0197439 A1 | 9/2006 | Sakane et al. | 313/503 |
| 2007/0040152 A1 | 2/2007 | Oshio | 252/301.16 |
| 2007/0131954 A1 | 6/2007 | Murayama et al. | 257/98 |
| 2007/0194685 A1 | 8/2007 | Hirosaki | 313/485 |
| 2007/0278930 A1 | 12/2007 | Takahashi et al. | 313/485 |
| 2007/0278935 A1 | 12/2007 | Harada | 313/503 |
| 2008/0003160 A1 | 1/2008 | Kim et al. | 423/305 |
| 2008/0054282 A1 | 3/2008 | Shioi | 257/98 |
| 2008/0087906 A1 | 4/2008 | Murase et al. | 257/96 |
| 2008/0143246 A1* | 6/2008 | Hirosaki et al. | 313/503 |
| 2008/0150412 A1 | 6/2008 | Yoshimatsu | 313/486 |
| 2008/0180948 A1 | 7/2008 | Yoon et al. | 362/230 |
| 2008/0211386 A1 | 9/2008 | Choi et al. | 313/503 |
| 2008/0251781 A1* | 10/2008 | Han et al. | 257/13 |
| 2009/0033201 A1 | 2/2009 | Shimooka et al. | 313/483 |
| 2009/0050846 A1 | 2/2009 | Becker et al. | 252/301.4 |
| 2009/0072262 A1 | 3/2009 | Iza et al. | 257/98 |
| 2009/0146549 A1 | 6/2009 | Kimura et al. | 313/503 |
| 2009/0166584 A1 | 7/2009 | Shimooka et al. | 252/301.4 F |
| 2009/0236963 A1 | 9/2009 | Nagatomi et al. | 313/483 |
| 2010/0052513 A1 | 3/2010 | Xia et al. | 313/503 |
| 2010/0081218 A1 | 4/2010 | Hardin | 438/7 |
| 2010/0164367 A1 | 7/2010 | Shioi et al. | 313/503 |
| 2010/0237357 A1 | 9/2010 | Tsai et al. | 257/79 |
| 2011/0146779 A1 | 6/2011 | Chang et al. | 136/256 |
| 2011/0180780 A1 | 7/2011 | Yoo et al. | 257/13 |
| 2011/0248296 A1 | 10/2011 | Choi et al. | 257/89 |
| 2011/0309399 A1 | 12/2011 | Shinohara et al. | 257/98 |
| 2012/0119234 A1 | 5/2012 | Shioi et al. | 257/88 |
| 2013/0026908 A1 | 1/2013 | Nagatomi et al. | 313/503 |

FOREIGN PATENT DOCUMENTS

| | | |
|---|---|---|
| JP | 2004-186278 A | 7/2004 |
| JP | 2005-048105 A | 2/2005 |
| JP | 2006-063233 A | 3/2006 |
| JP | 2006-070088 A | 3/2006 |
| JP | 2007-169452 A | 7/2007 |
| JP | 2007-326914 A | 12/2007 |
| JP | 2008050462 A * | 3/2008 |
| JP | 2008-150549 A | 7/2008 |
| JP | 2008-199053 A | 8/2008 |
| KR | 10-2006-0109431 A | 10/2006 |
| KR | 10-2007-0041703 A | 4/2007 |
| KR | 10-2007-0088613 A | 8/2007 |
| KR | 10-2007-0115951 A | 12/2007 |
| KR | 10-2008-0061565 A | 7/2008 |
| KR | 10-2008-0077008 A | 8/2008 |
| KR | 10-2008-0114561 A | 12/2008 |
| KR | 10-2009-0048589 A | 5/2009 |
| KR | 10-2009-0052337 A | 5/2009 |

OTHER PUBLICATIONS ("Crystal, electronic and luminescence properties of Eu2+-doped Sr2Al2_xSi1+xO7_xNx" Science and Technology of Advanced Materials 8 (2007) 607-616) by Li et al.*

Sohn, Kee-Sun, et al.; "Luminescence of $Sr_2SiO_{4-x}N_{2x/3}$:$Eu^{2+}$ Phosphors Prepared by Spark Plasma Sintering"; Journal of the Electrochemical Society; vol. 155; Dec. 12, 2007; pp. J58-J61.

Bachmann, Volker, et al.; "Color Point Tuning for (Sr,CA,BA)$Si_2O_2N_2$:$Eu^{2+}$ for White Light LEDs"; Chemistry Material; vol. 21; Dec. 29, 2009; pp. 316-325.

Korean Office Action dated Mar. 31, 2011 issued in Application No. 10-2009-0065028.

PCT International Search Report dated Apr. 22, 2011 issued in Application No. PCT/KR2010/005244.

Korean Office Action dated Apr. 29, 2011 issued in Application No. 10-2009-0082417.

PCT International Search Report dated May 30, 2011 issued in Application No. PCT/KR2010/005955.

Li, Yuan Qiang, et al.; "Crystal, Electronic and Luminescence Properties of $Eu^{2+}$-doped $Sr_2Al_{2-x}Si_{1+x}O_{7-x}N_x$"; Science and Technology of Advanced Materials, vol. 8; Aug. 2007; pp. 607-616.

Korean Office Action dated Aug. 26, 2011 issued in Application No. 10-2010-003560.

United States Office Action dated Dec. 26, 2012 issued in U.S. Appl. No. 12/991,772.

U.S. Appl. No. 12/991,752, filed Nov. 9, 2010.

United States Notice of Allowance dated Oct. 11, 2013 issued in U.S. Appl. No. 12/991,752.

United States Office Action dated Oct. 23, 2013 issued in U.S. Appl. No. 12/991,772.

U.S. Pat. No. 8,653,549, Feb. 18, 2014, U.S. Appl. No. 12/991,752, filed Nov. 9, 2010.

U.S. Appl. No. 12/991,772, filed Nov. 9, 2010.

United States Final Office Action dated Jun. 24, 2014 issued in U.S. Appl. No. 12/991,772.

PCT International Search Report dated Sep. 14, 2011 issued in Application No. PCT/KR2010/005956.

Korean Office Action dated Nov. 17, 2011 issued in Application No. 10-2010-0077071.

United States Final Office Action dated Apr. 23, 2013 issued in U.S. Appl. No. 12/991,772.

United States Office Action dated May 21, 2013 issued in U.S. Appl. No. 12/991,752.

* cited by examiner

【Figure 1】
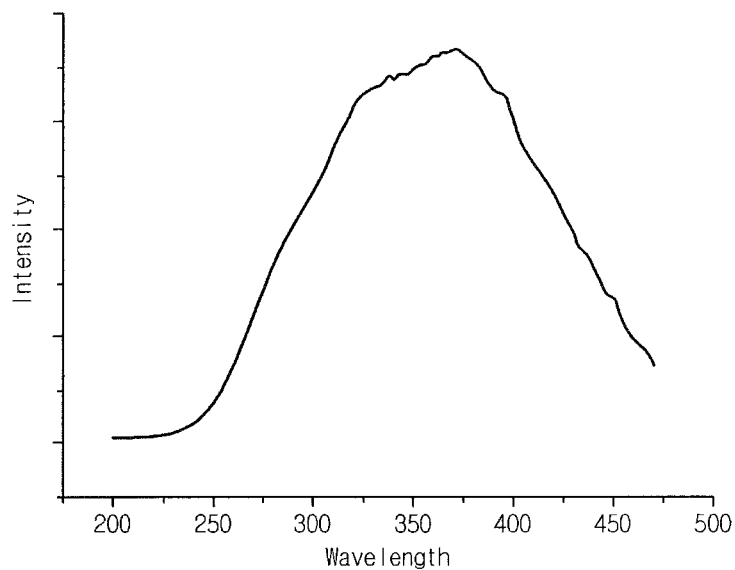
【Figure 2】
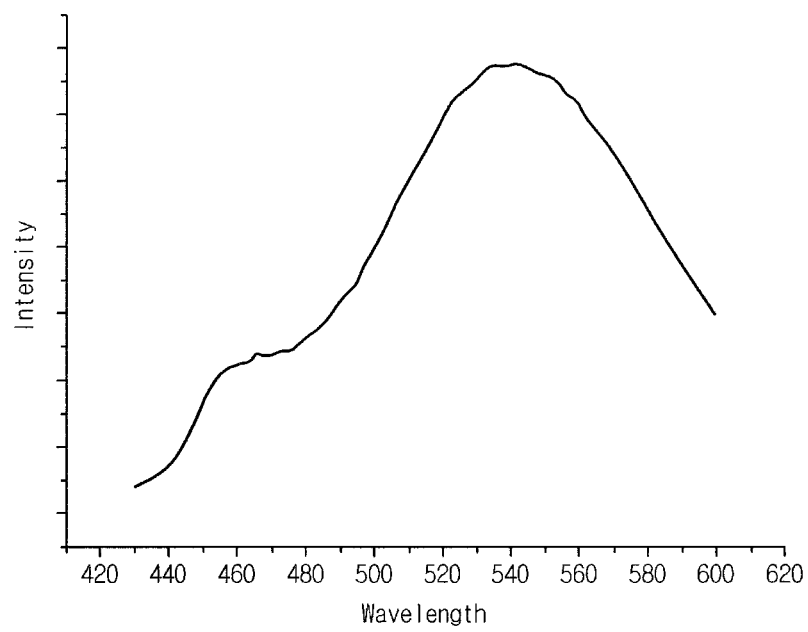

[Figure 3]
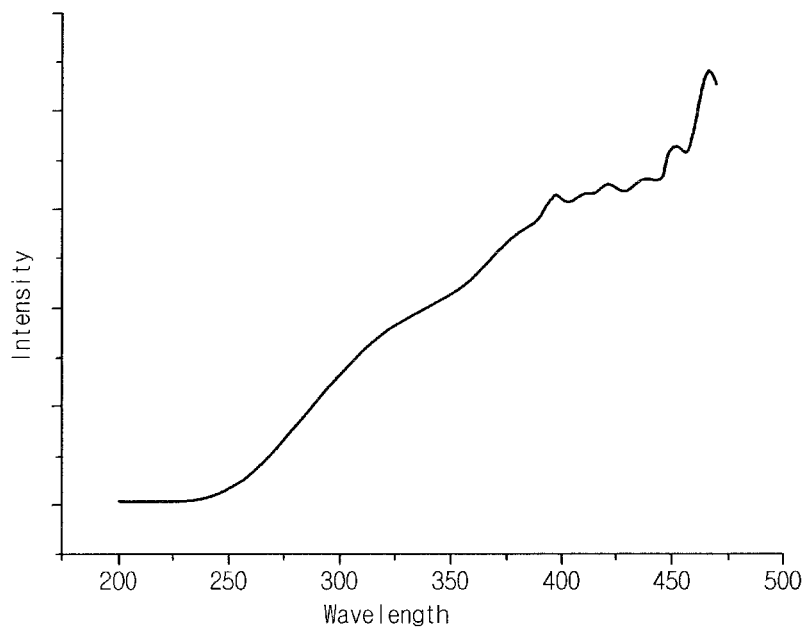
[Figure 4]
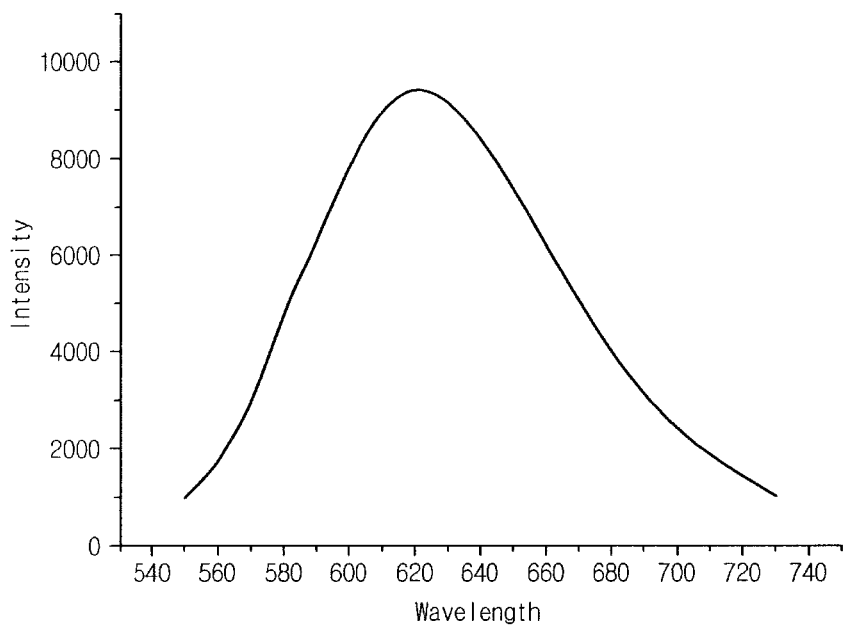

【Figure 5】
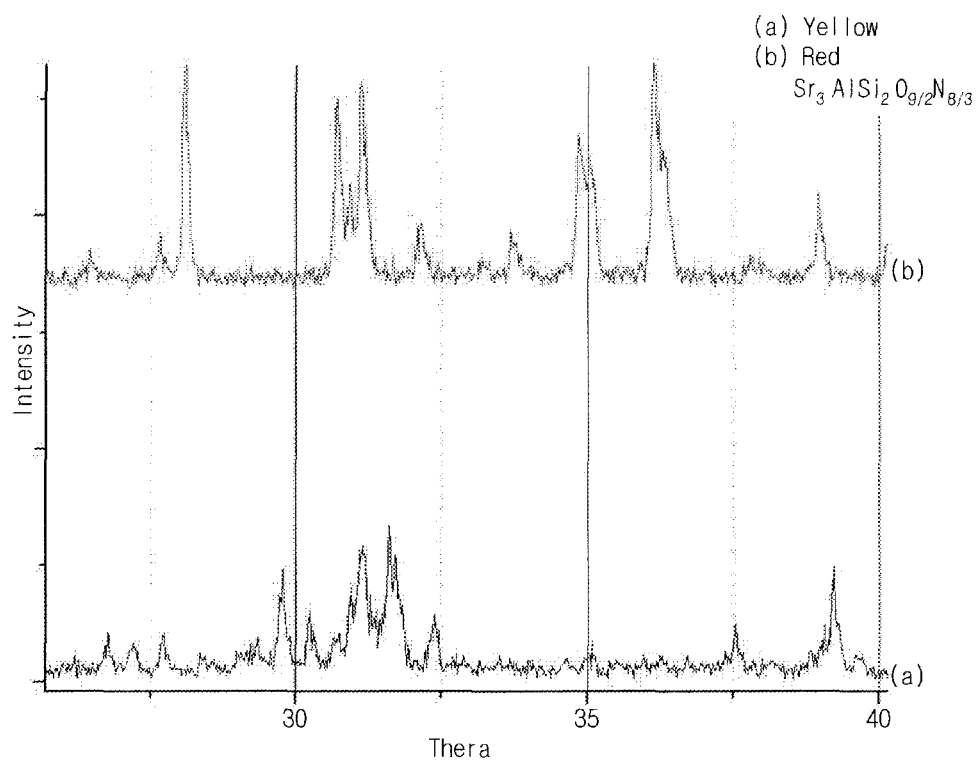
【Figure 6】
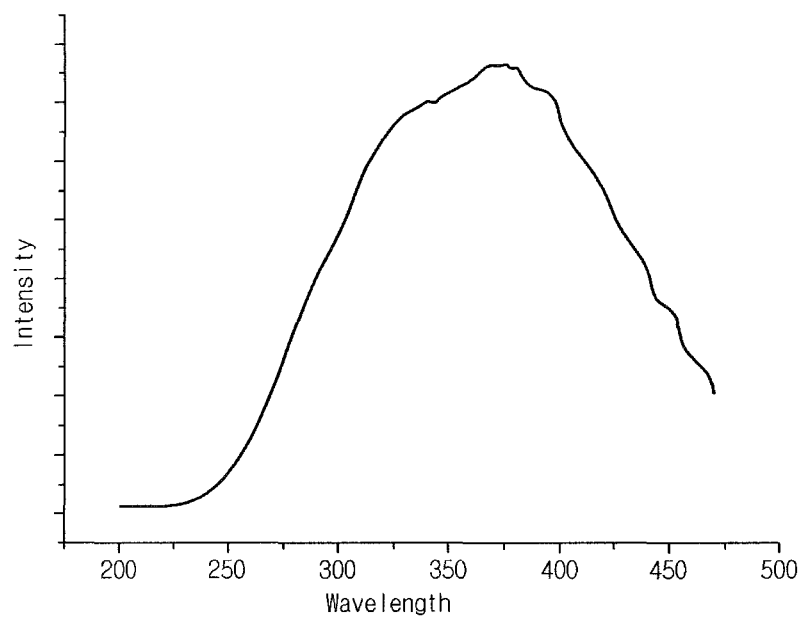

[Figure 7]
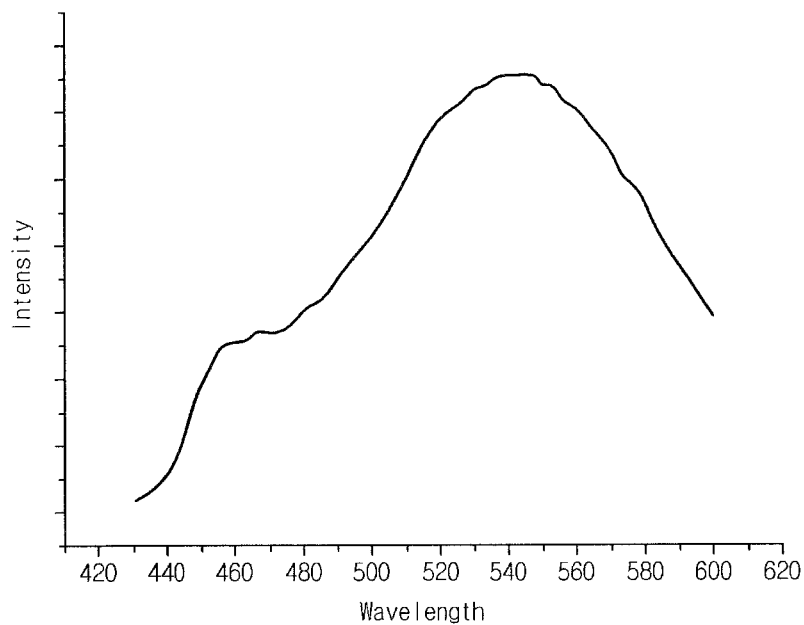
[Figure 8]
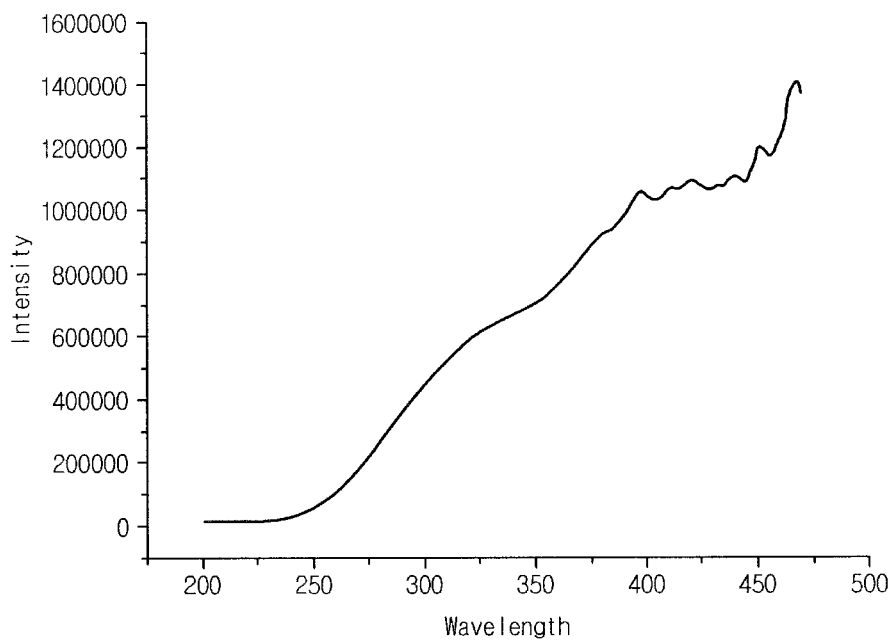

【Figure 9】
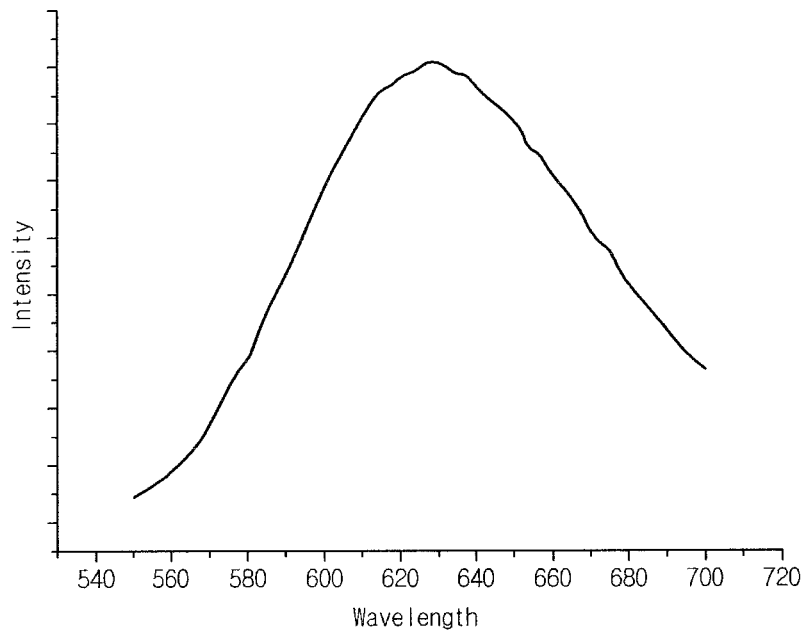
【Figure 10】
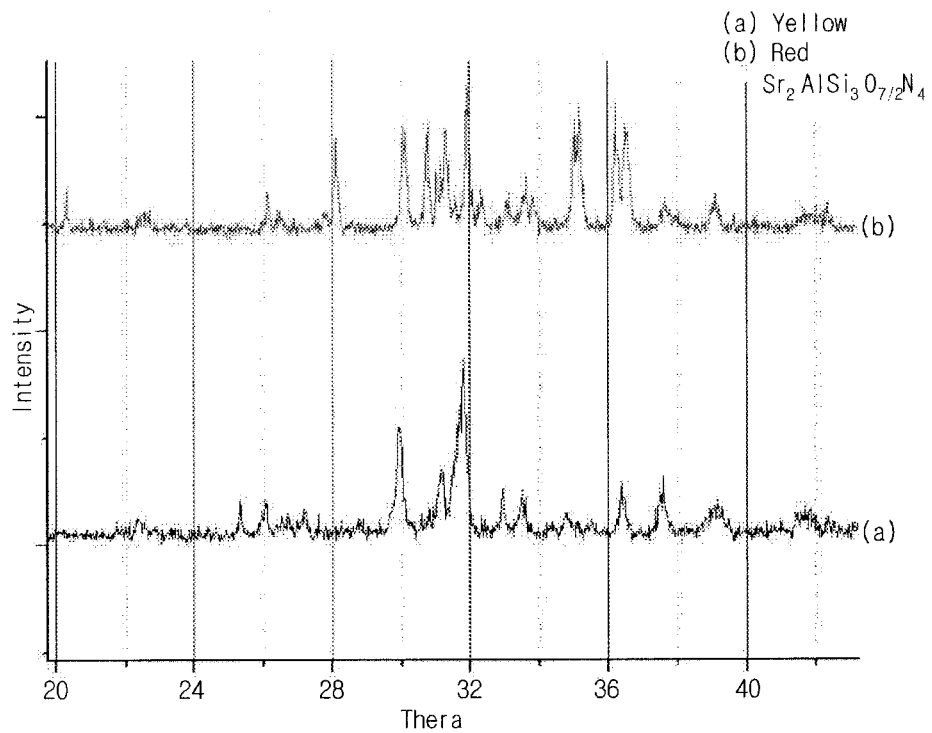

【Figure 11】
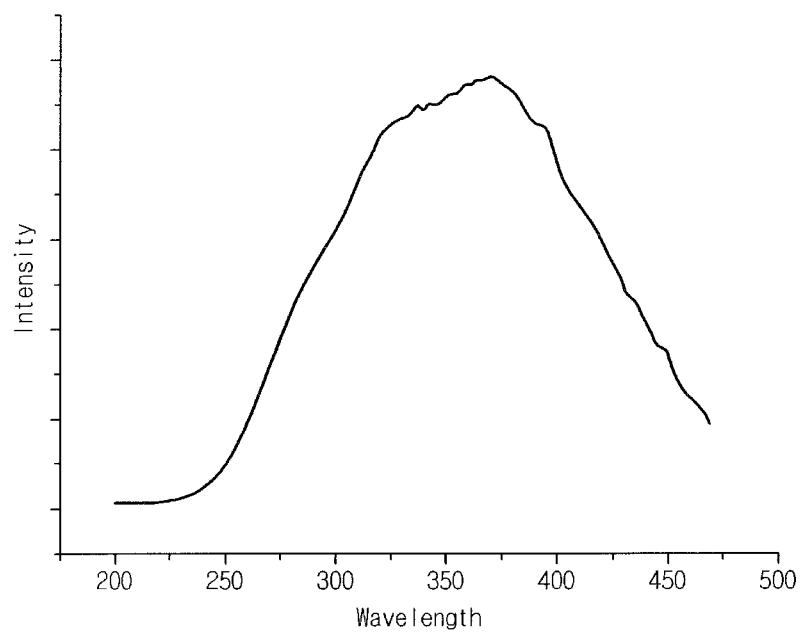
【Figure 12】
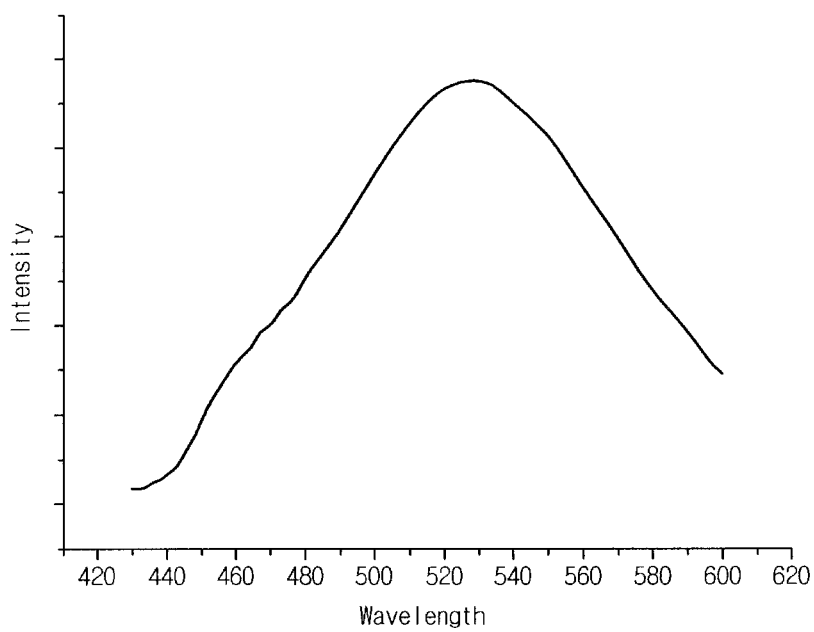

[Figure 13]
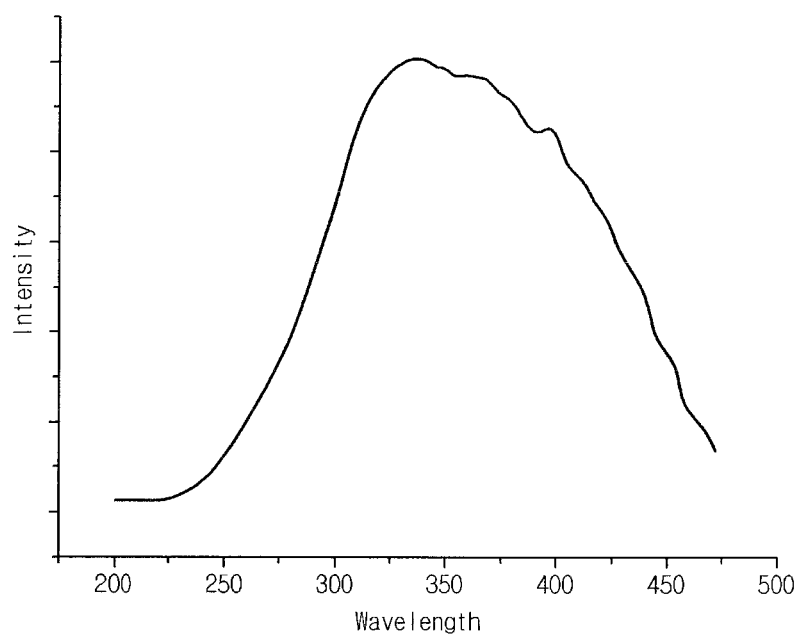
[Figure 14]
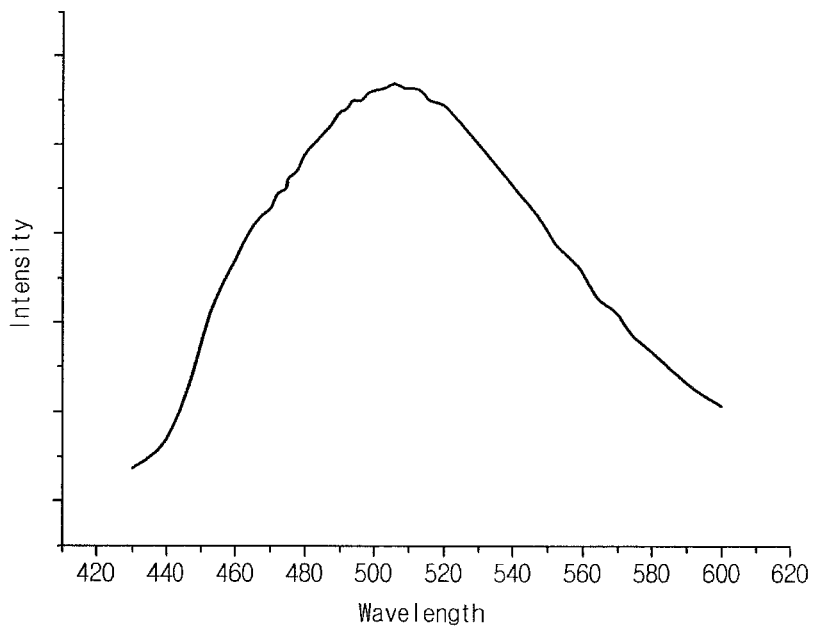

【Figure 15】
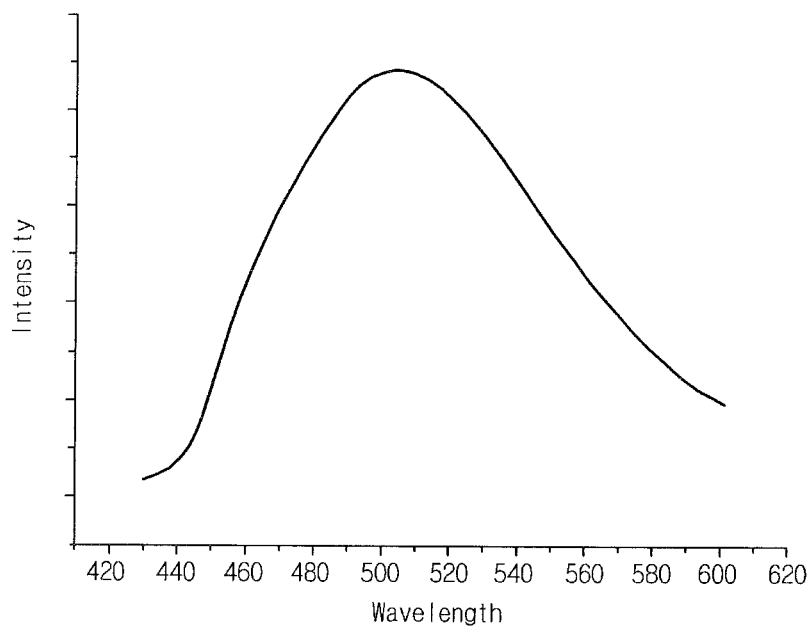
【Figure 16】
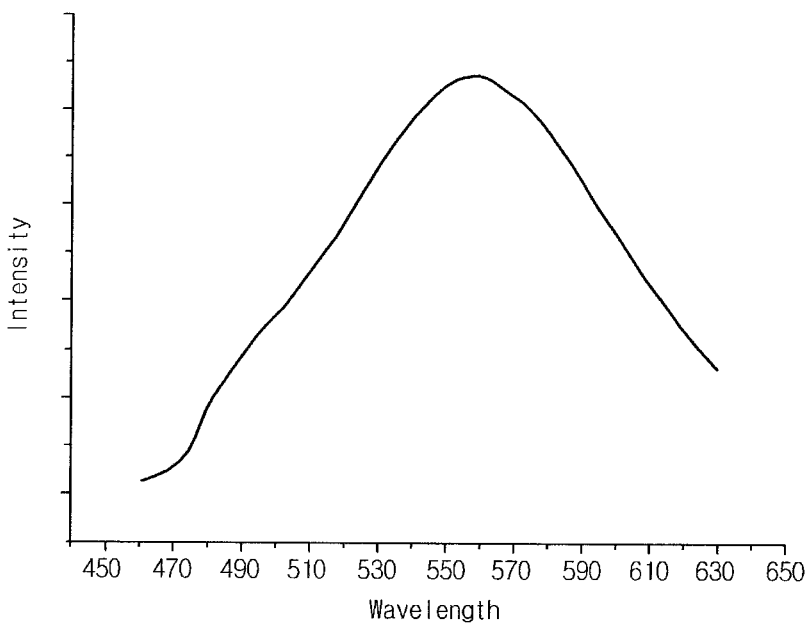

[Figure 17]
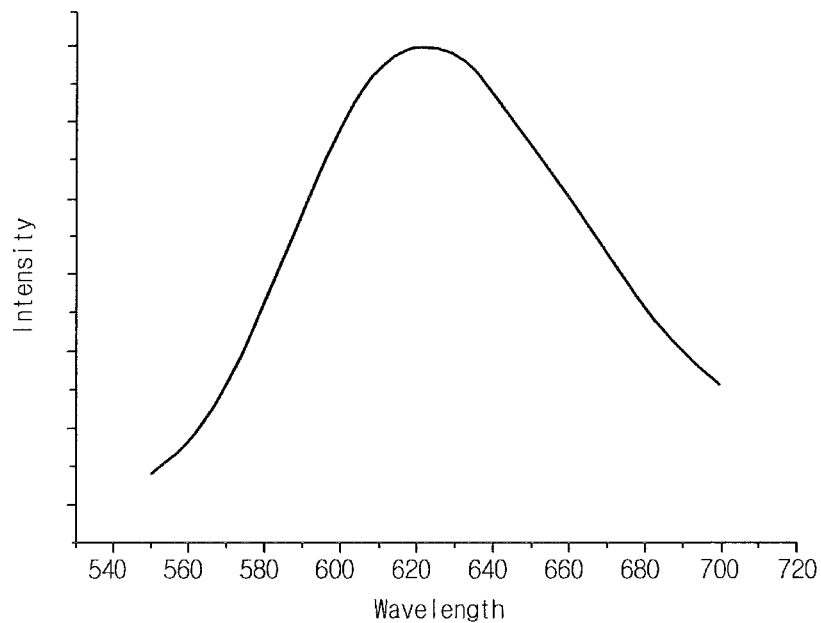
[Figure 18]
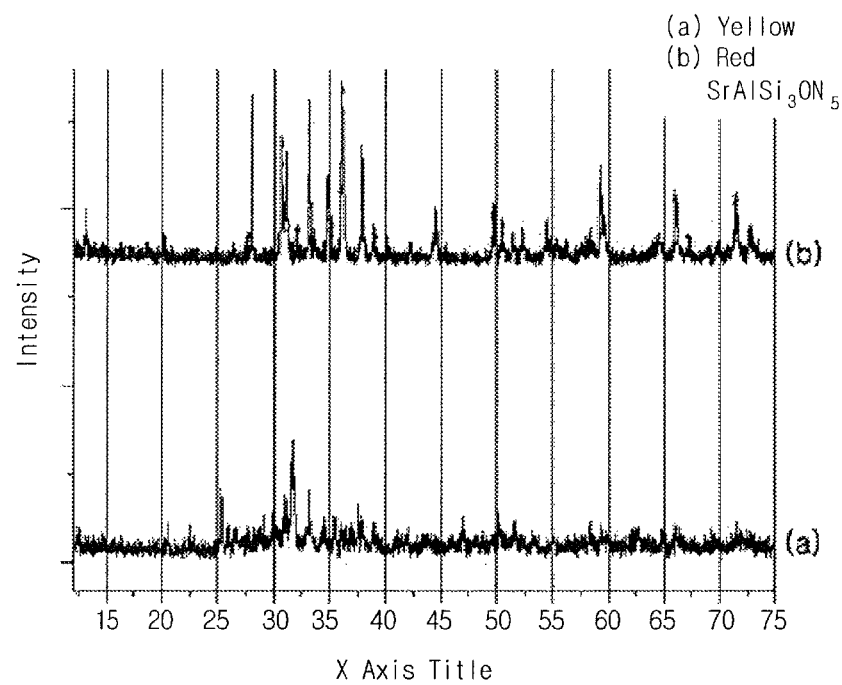

【Figure 19】
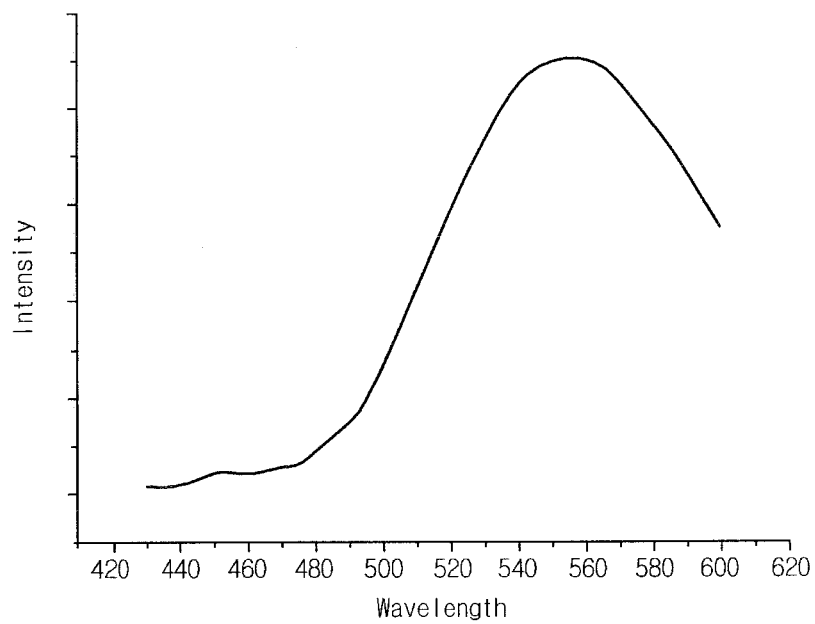
【Figure 20】
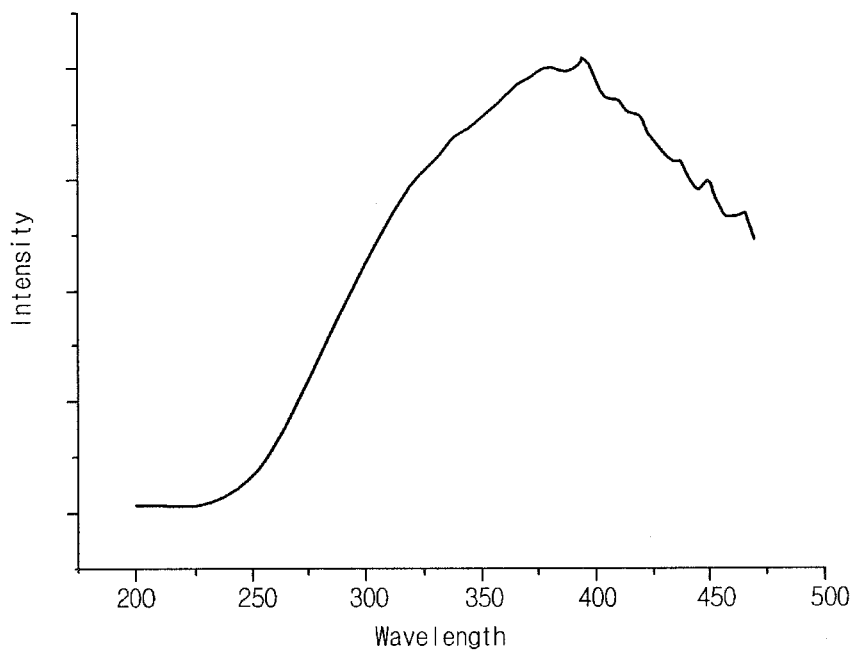

【Figure 21】
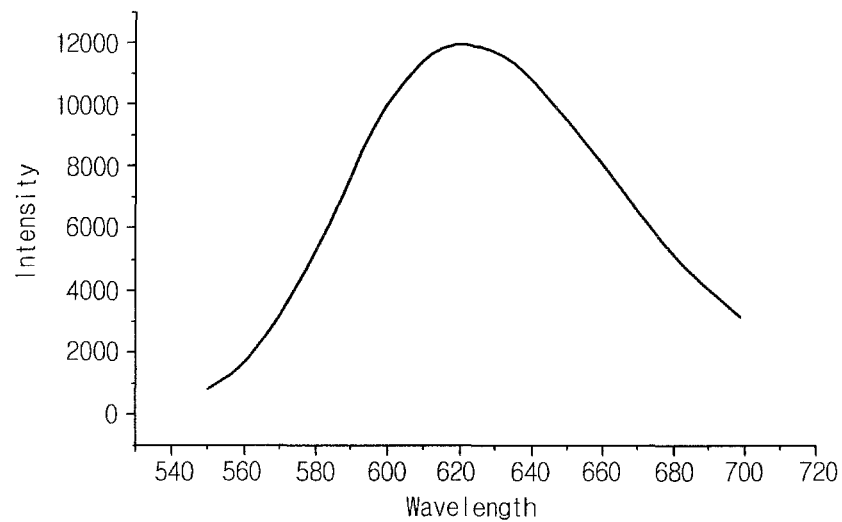
【Figure 22】
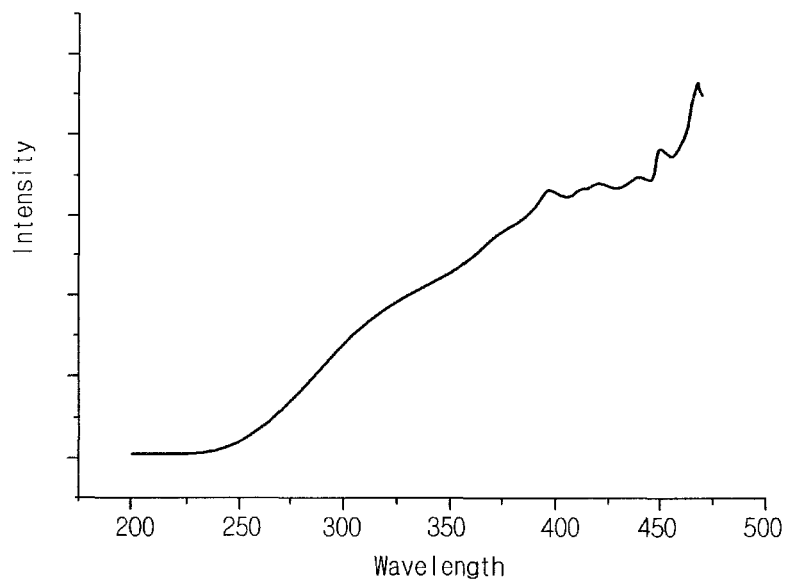

[Figure 23]
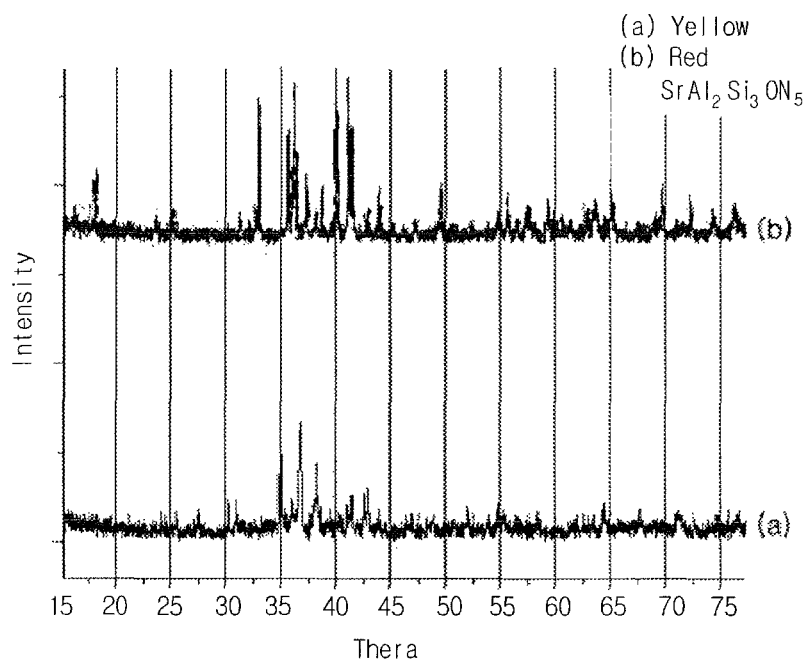
[Figure 24]
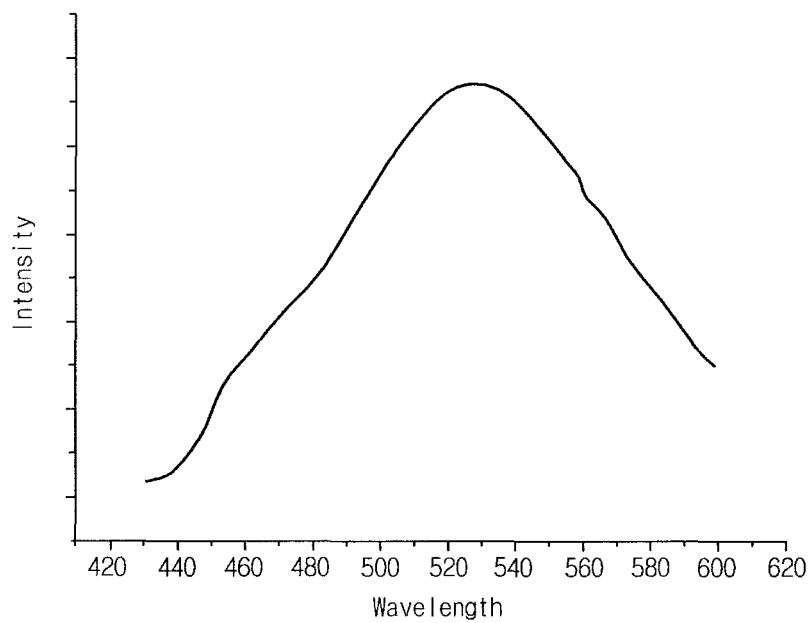

【Figure 25】
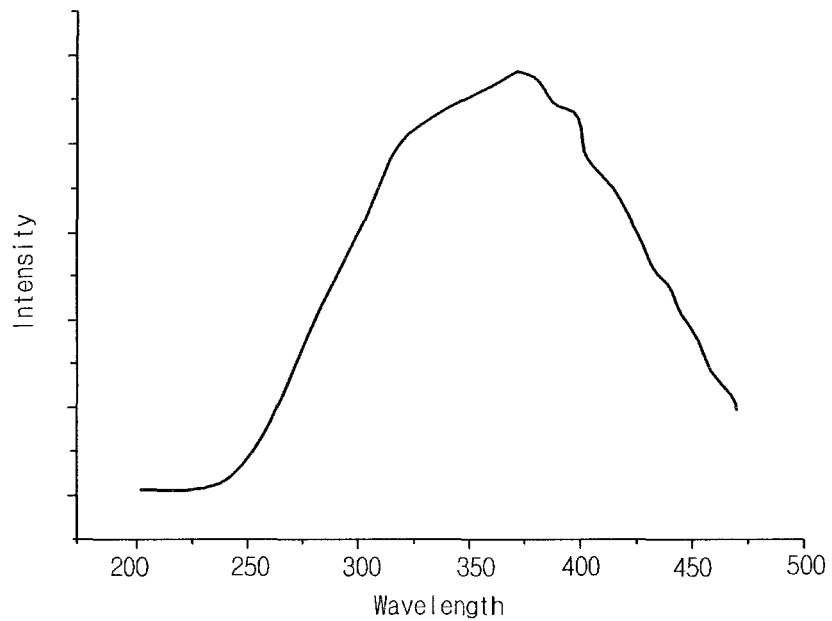
【Figure 26】
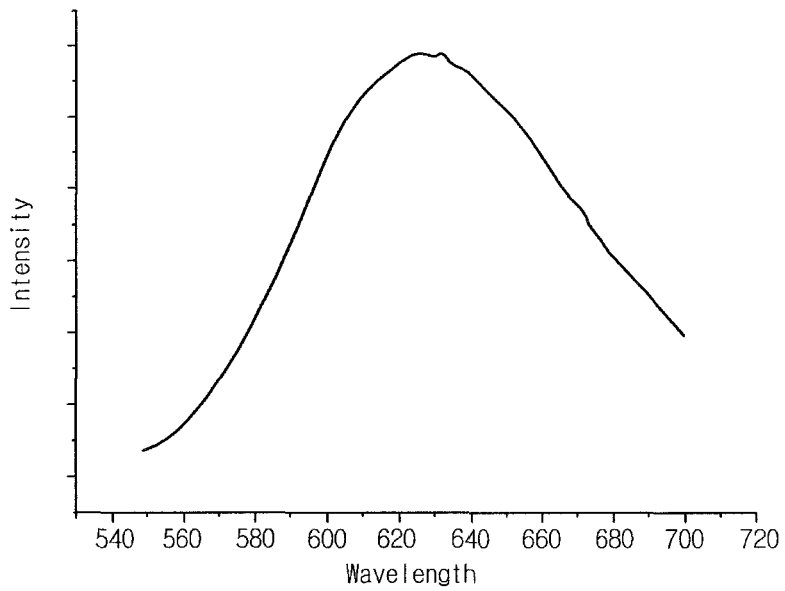

[Figure 27]
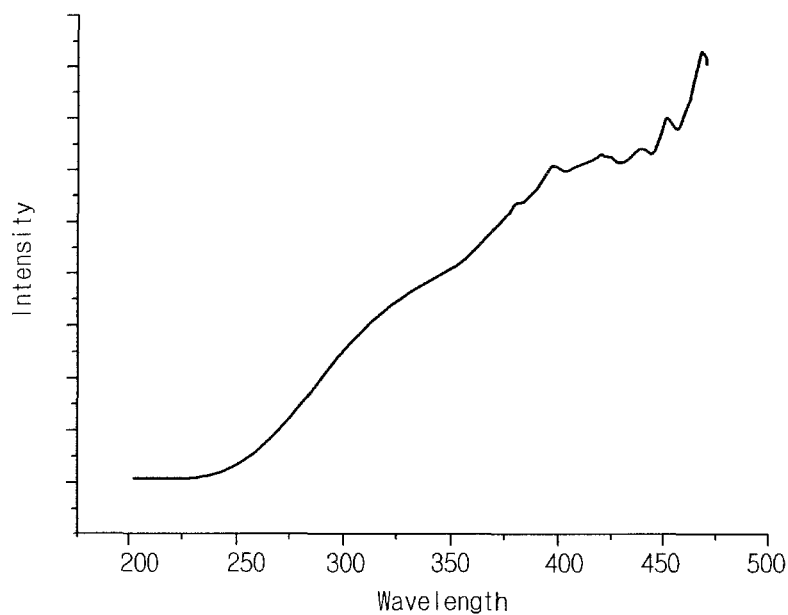
[Figure 28]
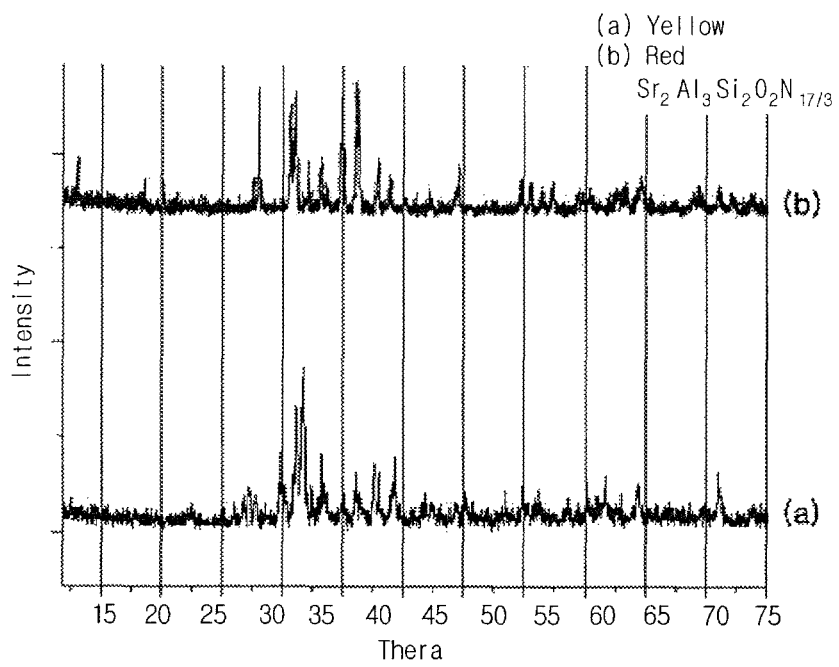

[Figure 29]
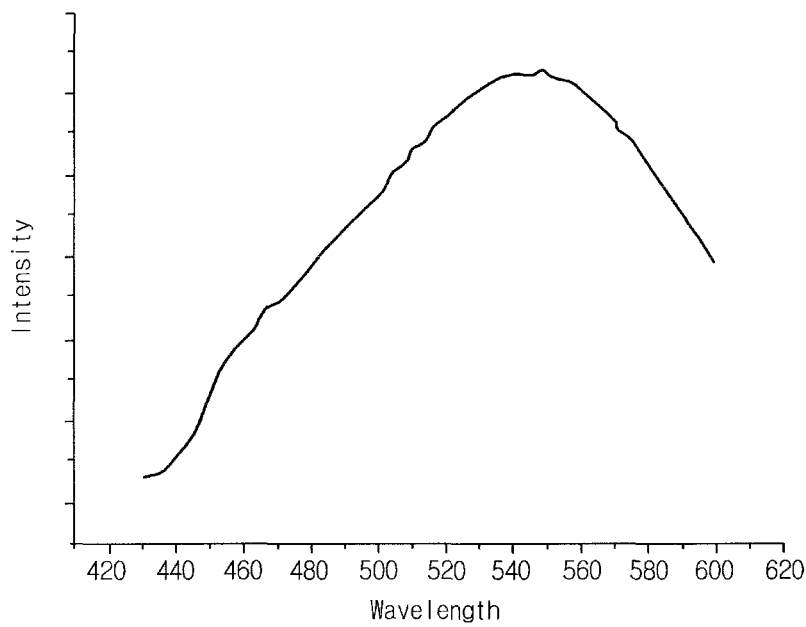
[Figure 30]
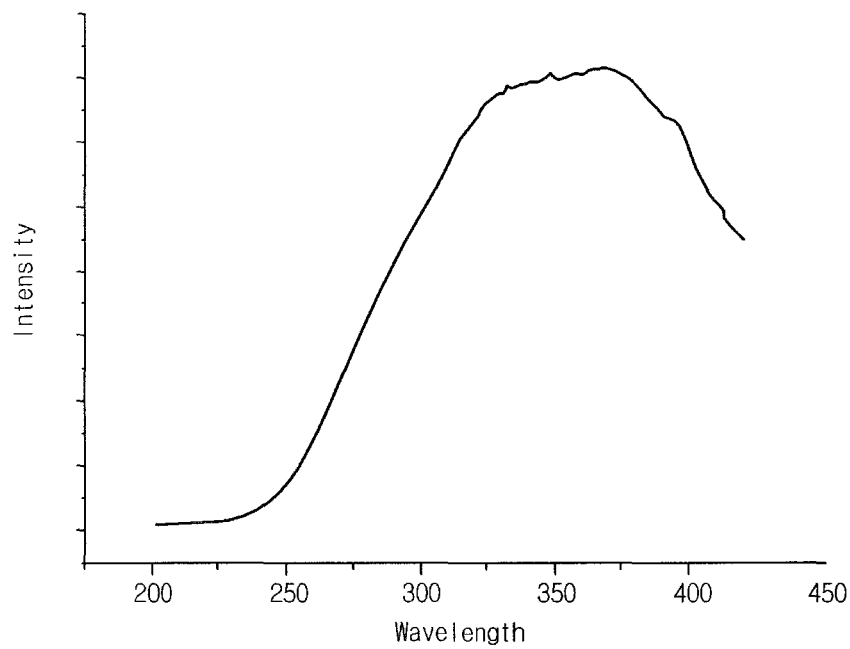

[Figure 31]
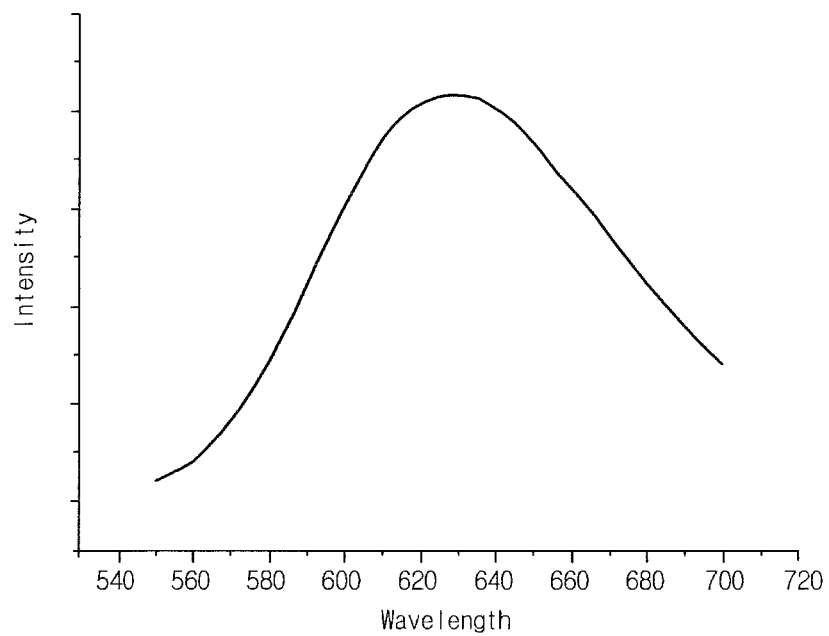
[Figure 32]
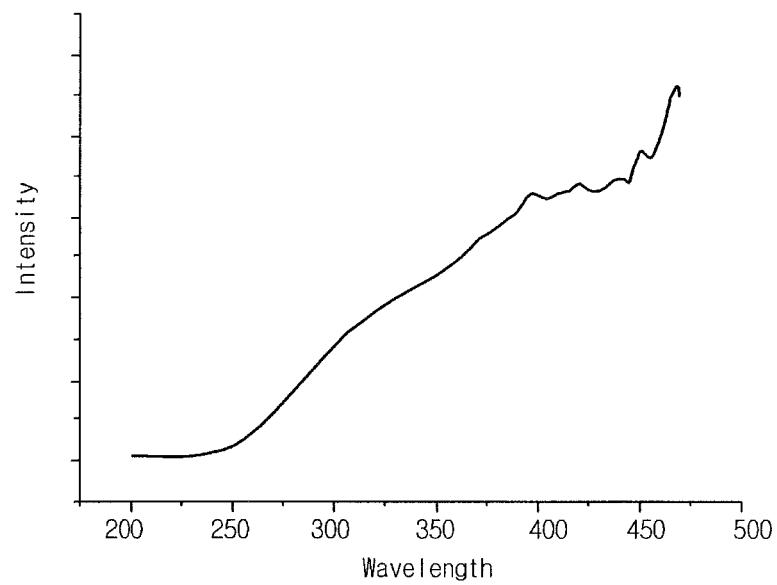

【Figure 33】
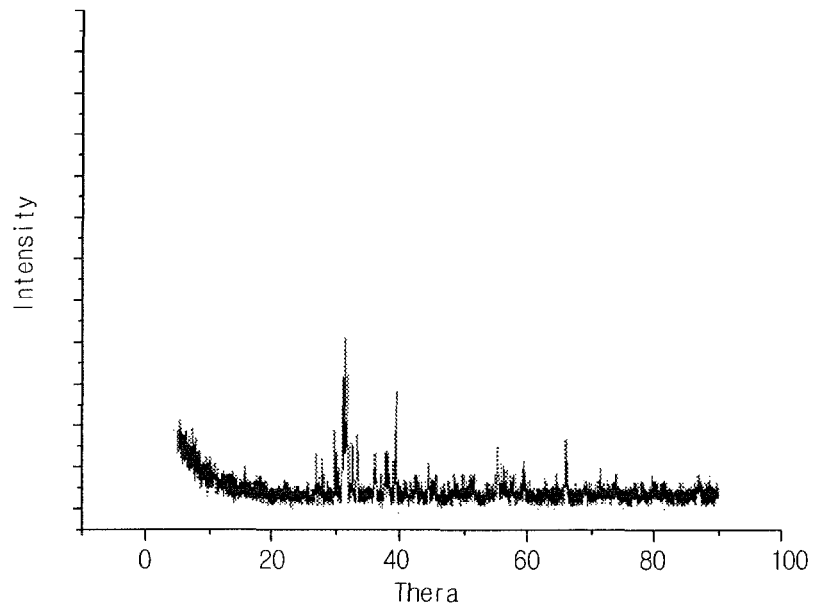
【Figure 34】
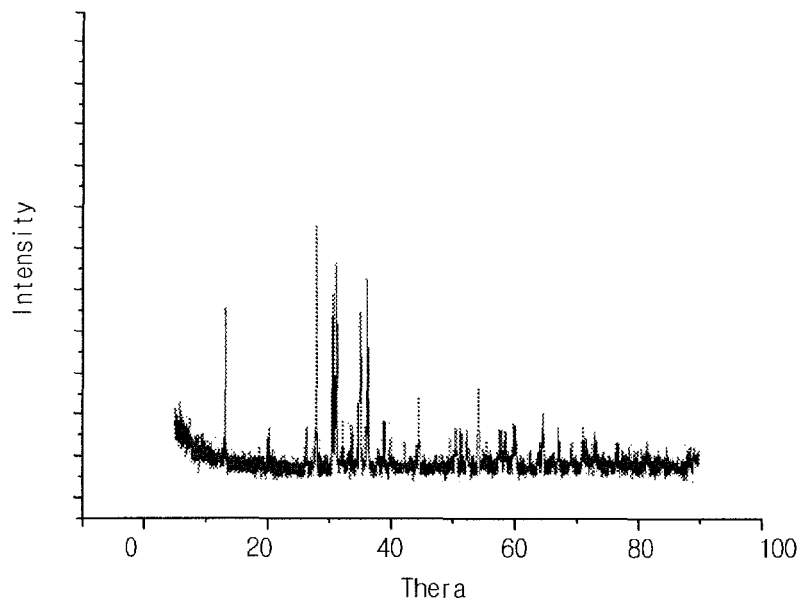

[Figure 35]
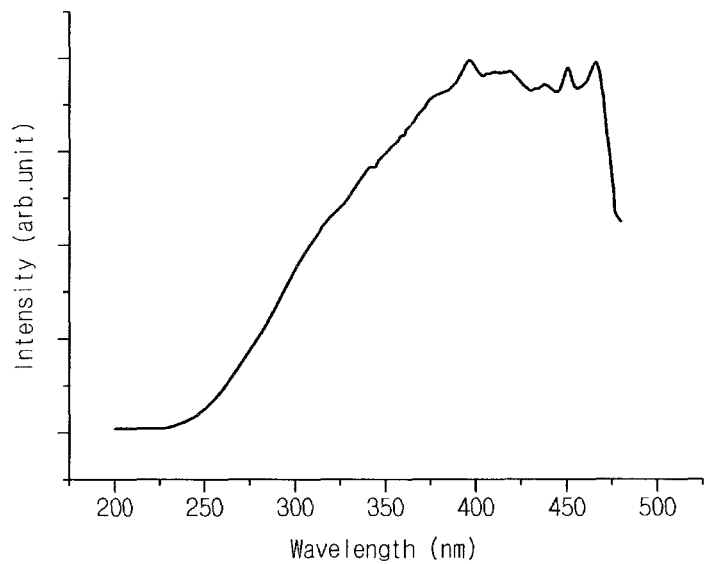
[Figure 36]
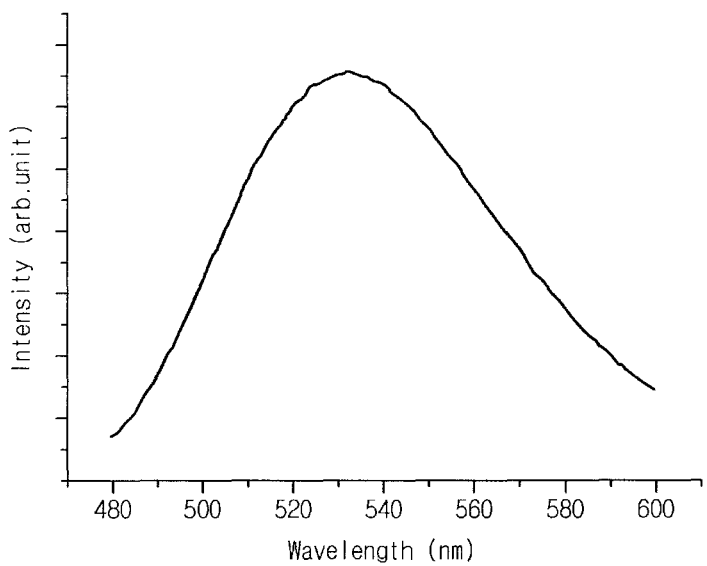

[Figure 37]
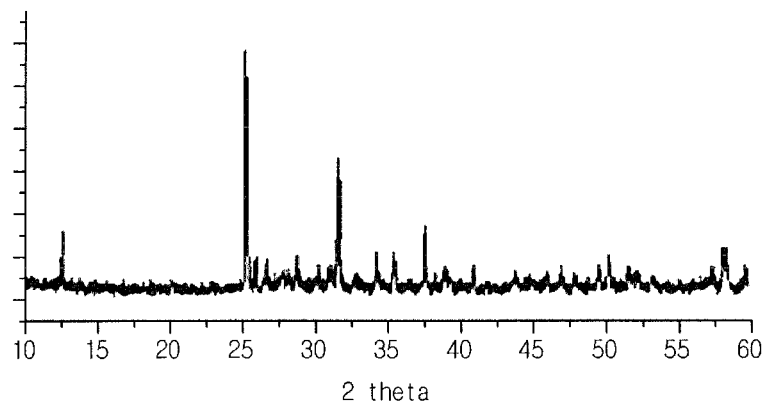
[Figure 38]
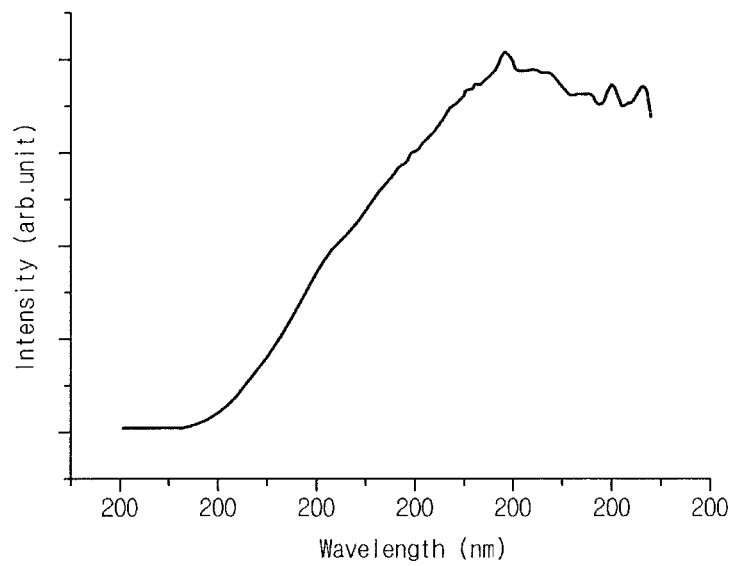

[Figure 39]
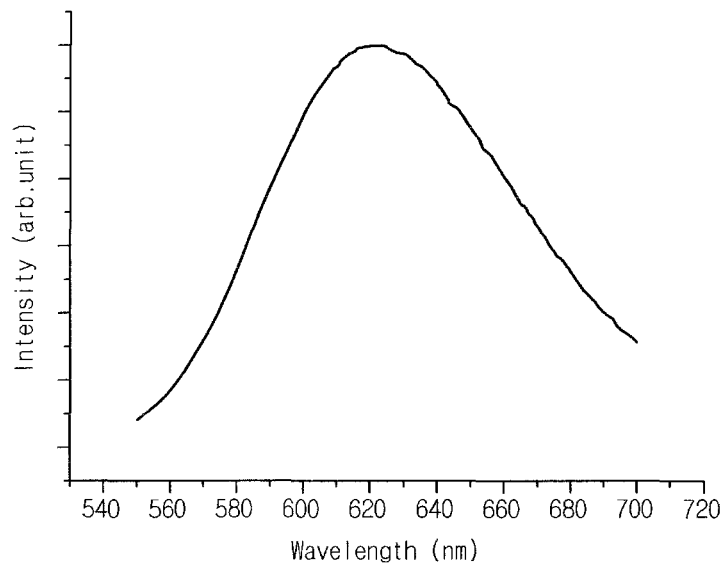
[Figure 40]
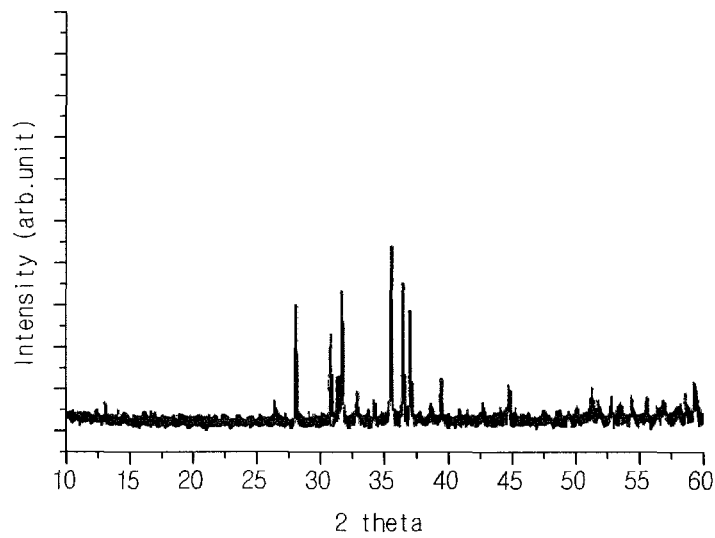

[Figure 41]
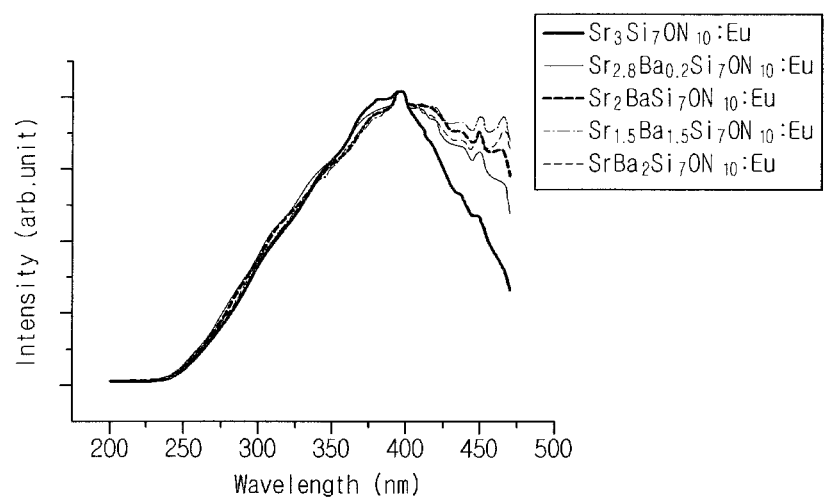
[Figure 42]
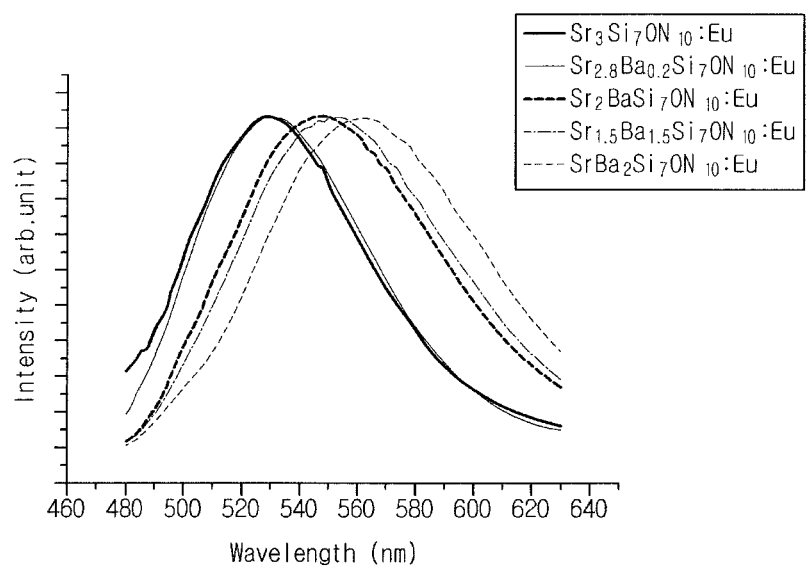

[Figure 43]
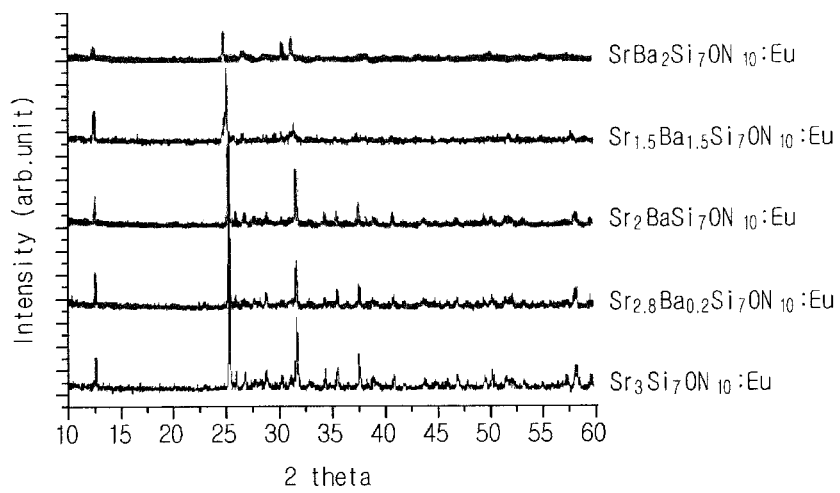
[Figure 44]
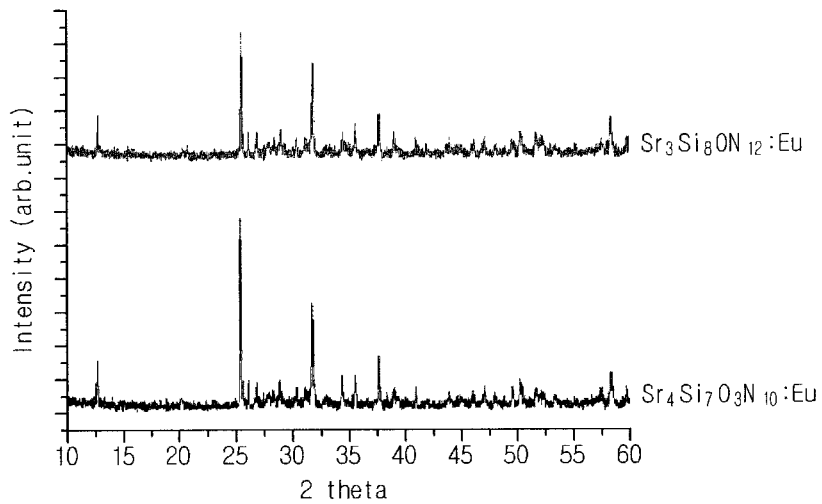

【Figure 45】
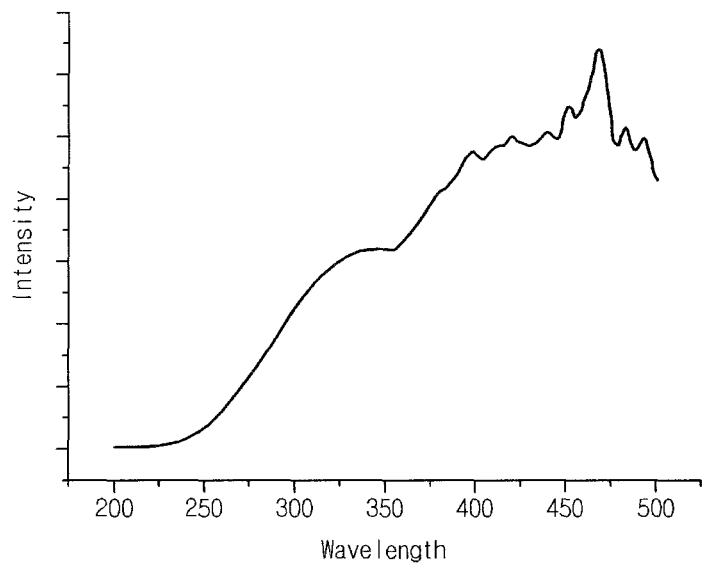
【Figure 46】
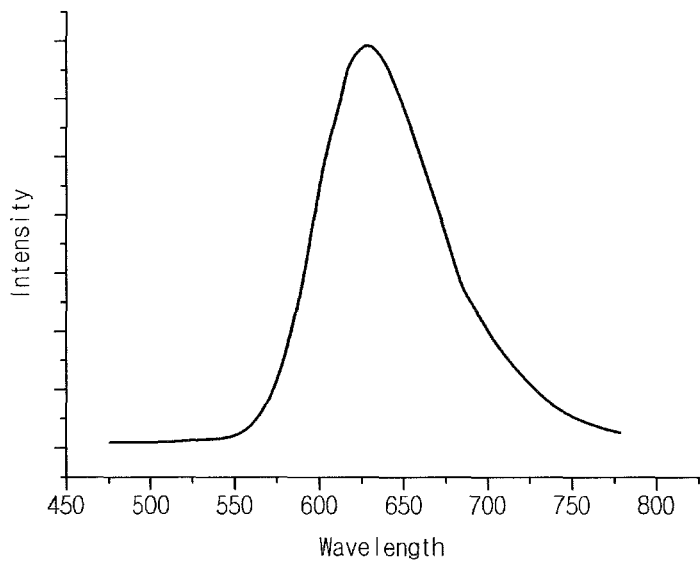

[Figure 47]
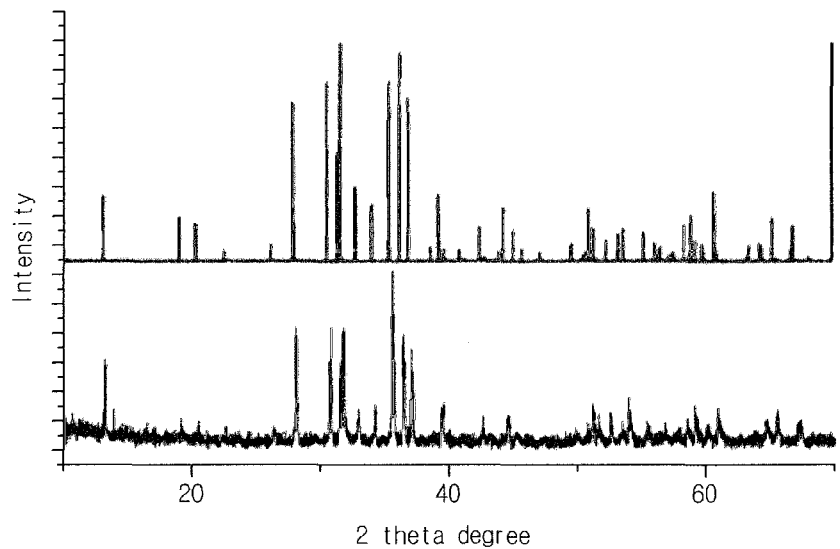
[Figure 48]
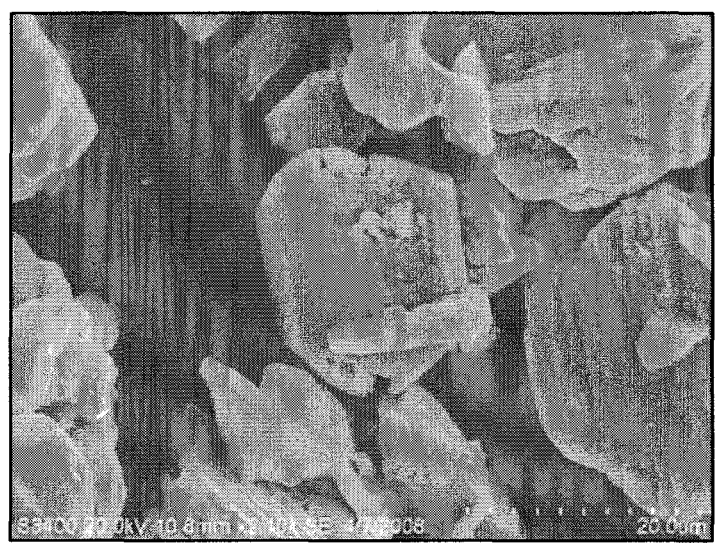

【Figure 49】
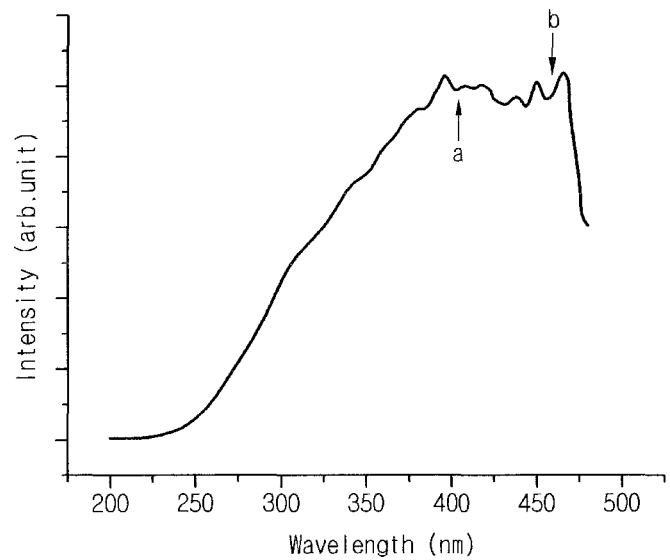
【Figure 50】
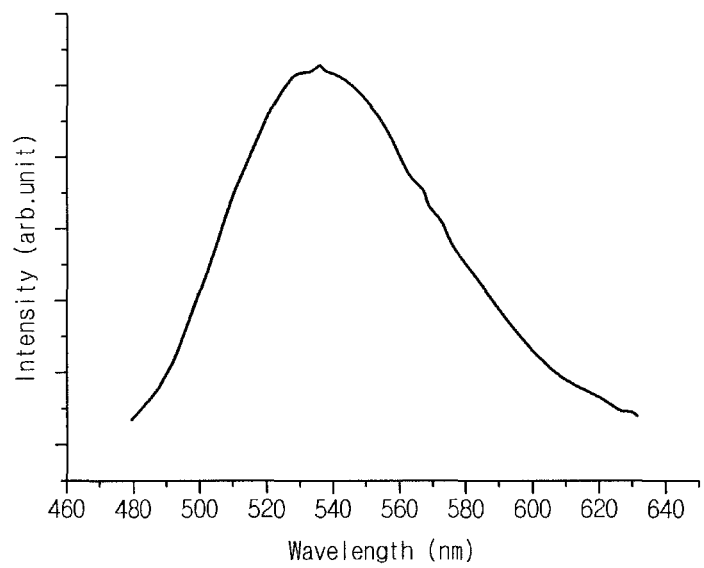

[Figure 51]
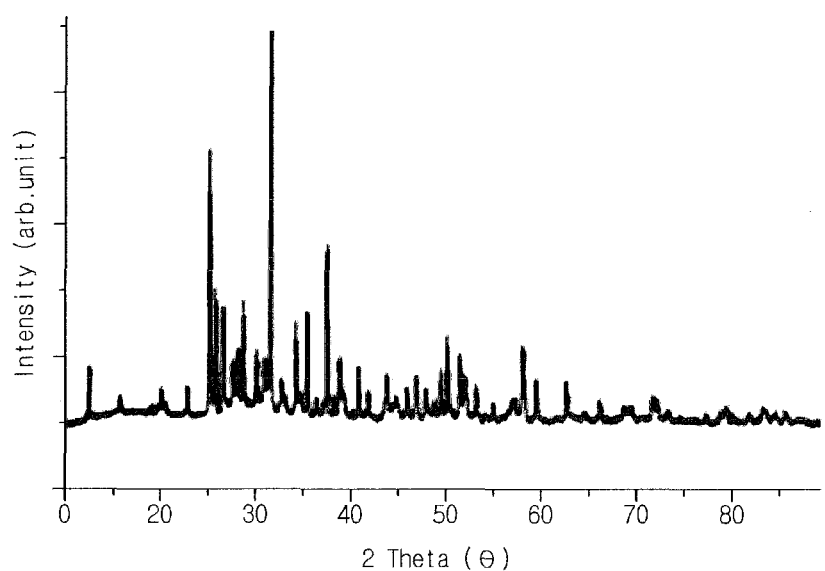
[Figure 52]
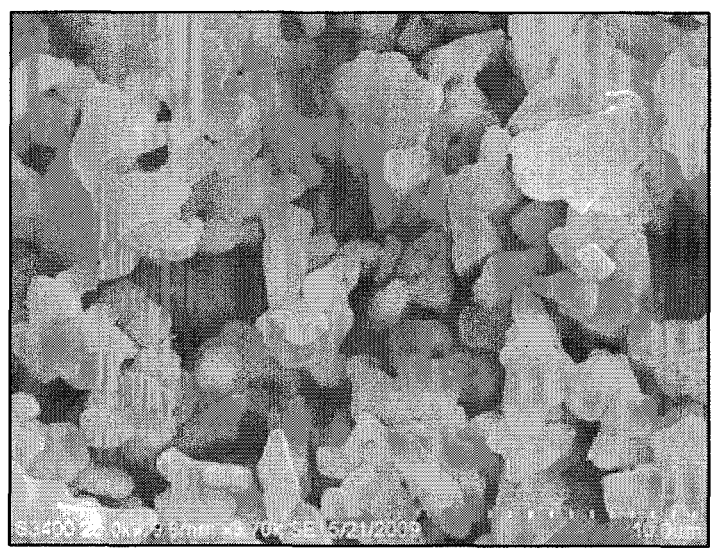

【Figure 53】
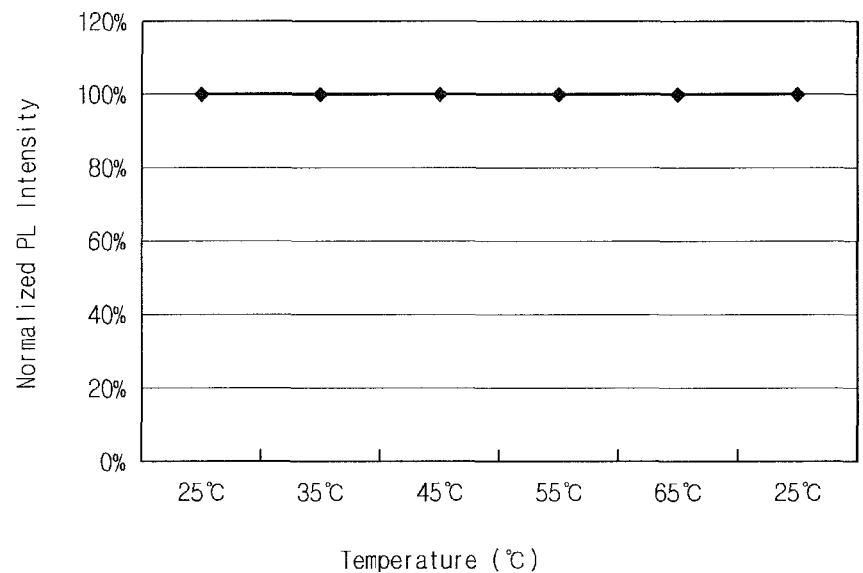
【Figure 54】
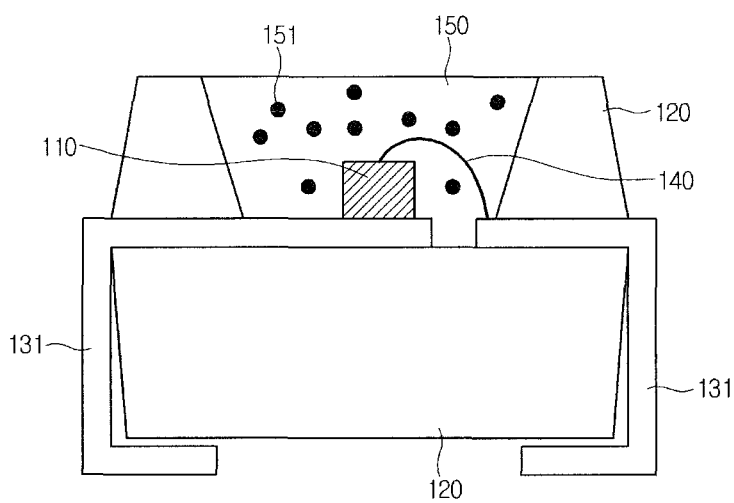

[Figure 55]
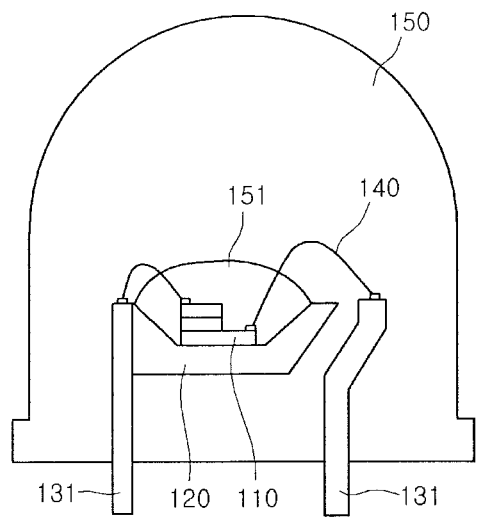
[Figure 56]
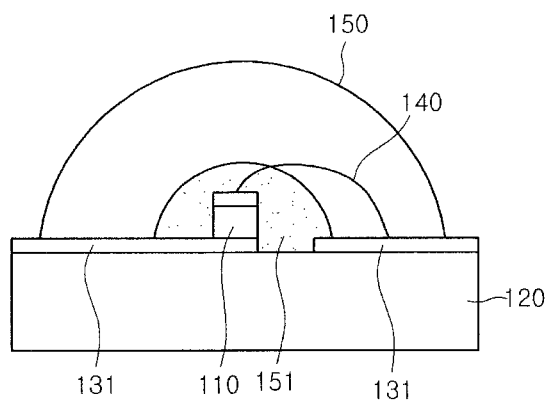

【Figure 57】
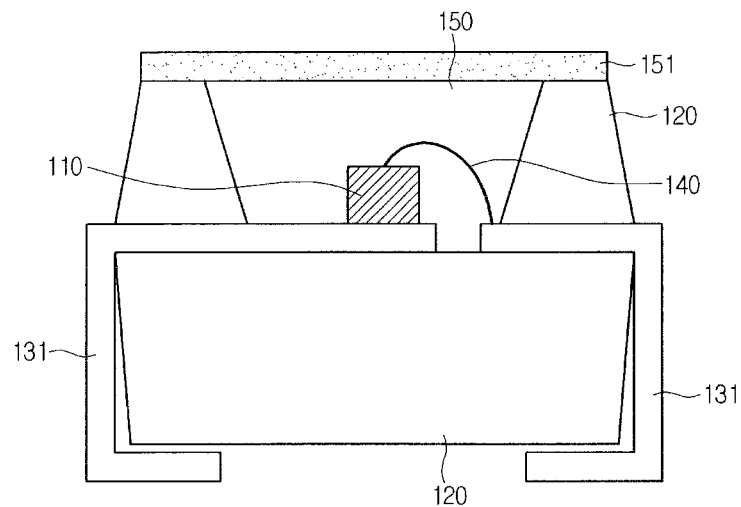
【Figure 58】
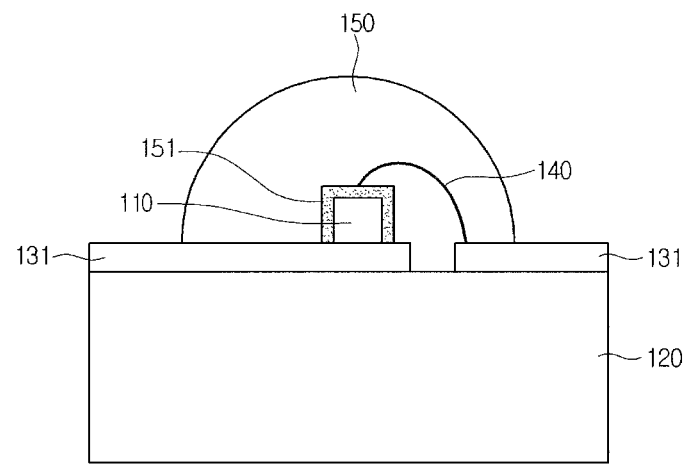

[Figure 59]
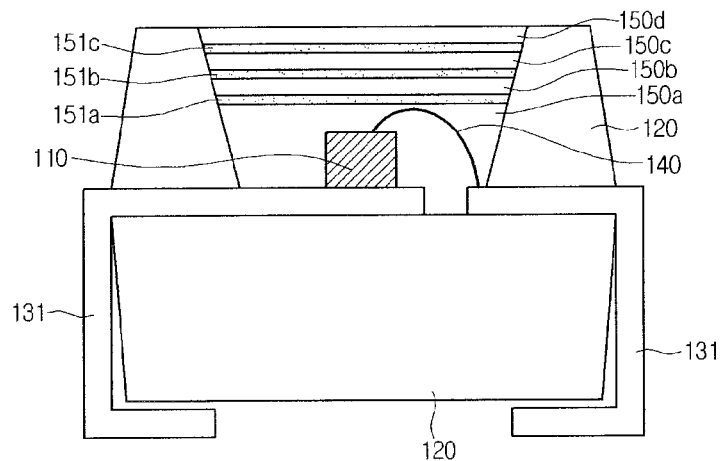
[Figure 60]
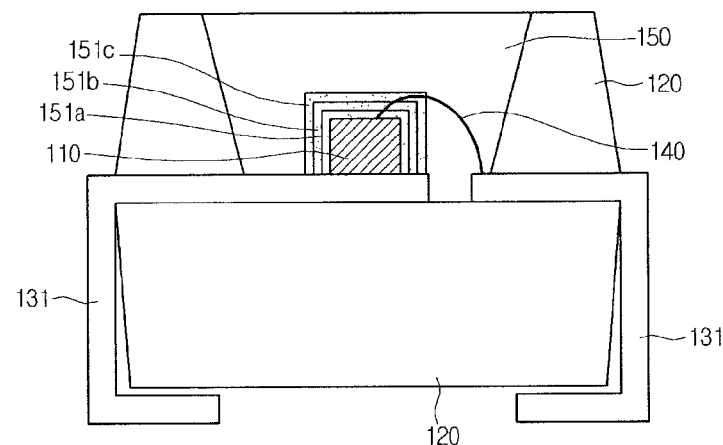
[Figure 61]
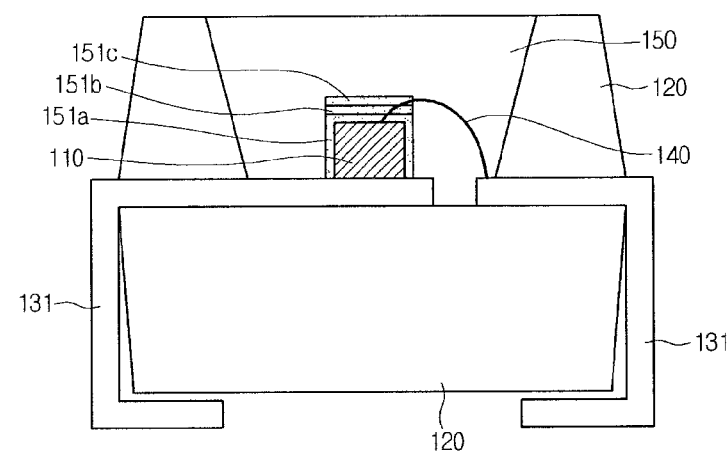

【Figure 62】
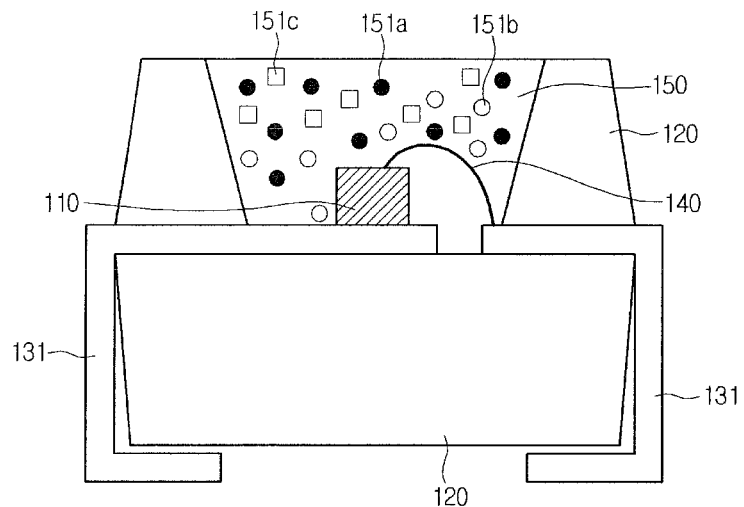
【Figure 63】
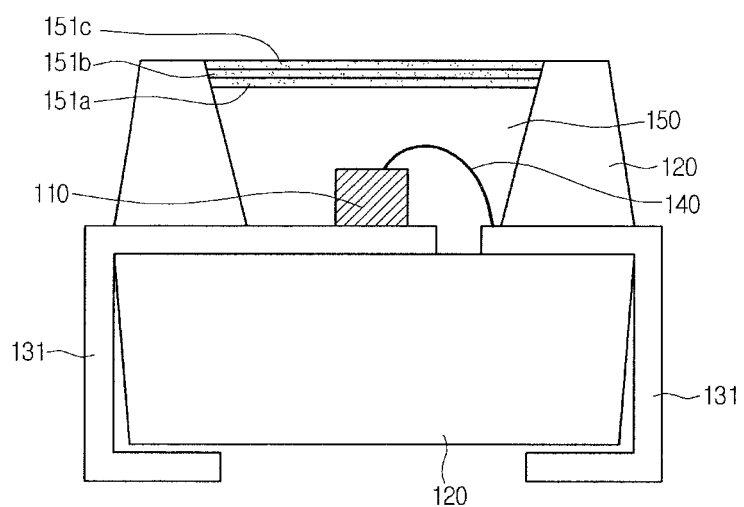

[Figure 64]
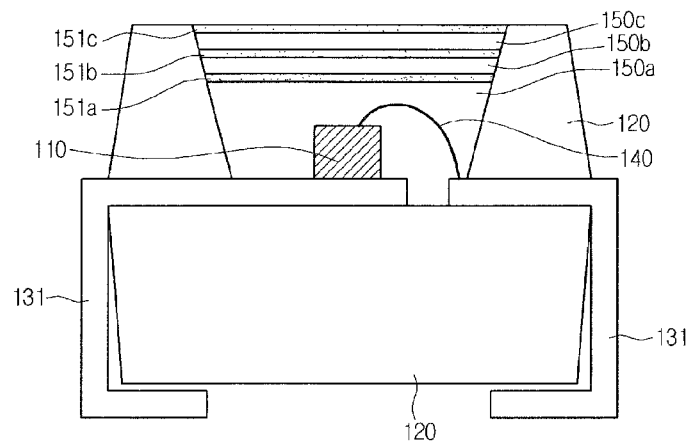
[Figure 65]
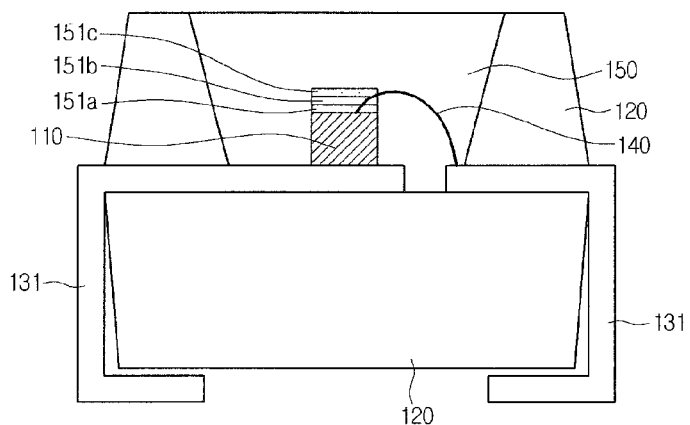
[Figure 66]
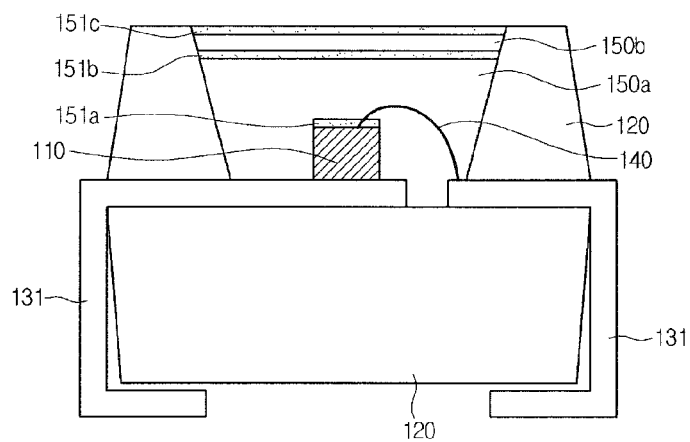

【Figure 67】
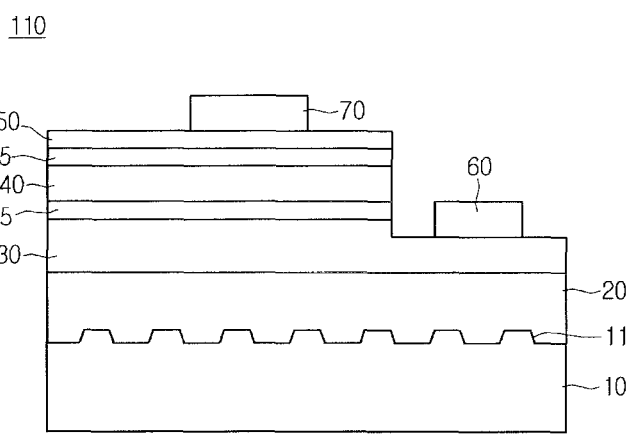
【Figure 68】
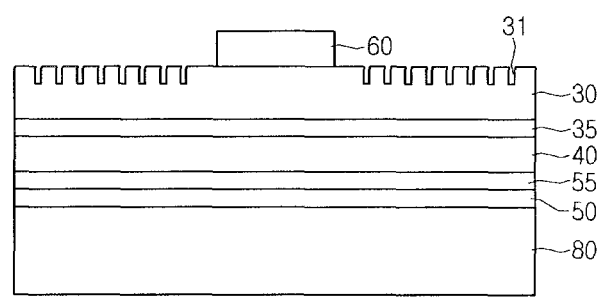

PHOSPHOR, PHOSPHOR MANUFACTURING METHOD, AND WHITE LIGHT EMITTING DEVICE

CROSS-REFERENCE TO RELATED PATENT APPLICATIONS

This application is a U.S. National Stage Application under 35 U.S.C. § 371 of PCT Application No. PCT/KR2010/005955 filed on Sep. 2, 2010, which claims priority to Korean Patent Application No. 10-2009-0082417, filed Sep. 2, 2009, and Korean Patent Application No. 10-2010-0077071, filed Aug. 10, 2010.

TECHNICAL FIELD

The present disclosure relates a phosphor, a phosphor manufacturing method, and a white light emitting device.

BACKGROUND ART

A phosphor serves as a medium, which converts energy of an excitation source into energy of visible light. Thus, the phosphor is a necessary component for realizing an image on various display devices, and simultaneously, the phosphor is a main element directly related to efficiency of display products.

Three is a light emitting device using a blue light emitting diode, which is one of light emitting devices that emit white light. The light emitting device using the blue light emitting diode uses blue light as the excitation source and coats a yellow phosphor emitting yellow light onto a light emitting diode emitting the blue light. Thus, the blue light emitted from the blue light emitting diode and the yellow light emitted from the yellow phosphor are mixed with each other to realize the white light.

That is, the white light emitting device obtains the while light through a method in which the phosphor is coated on the blue light emitting diode to mix the blue light emitted from the blue light emitting diode with secondary light emitted from the phosphor, for example, a YAG:Ce phosphor emitting the yellow light is coated on the blue light diode to emit the white light.

However, according to the foregoing method, there are limitations that quantum deficits generated by using the secondary light and the reduction of optical efficiency due to re-radiation efficiency may occur, and it is difficult to realize superior color rendering. Thus, according to a related art white light emitting device, since a blue light emitting diode and a yellow phosphor are combined with each other, green and red color components are insufficient to display unnatural colors. As a result, the related art white light emitting diode has been used in limited fields such as screens of portable terminals, notebooks, personal computers (PCs), etc. Nevertheless, the related art white light emitting diode is being widely used because of easy driving operation a significantly low price.

Generally, it is widely known that silicates, phosphates, aluminates, or sulfides are used as phosphors for a mother material, and transition metals or rear earth metals are used as phosphors for luminescent center.

A phosphor, which is excited by an excitation source having high energy such as ultraviolet or blue light to emit visible light has been mainly developed in a white light emitting device field. However, when a related art phosphor is exposed to an excitation source, there is a limitation that luminance is reduced. In recent, researches with respect to a phosphor having a small luminance reduction, e.g., a host crystal of a silicon nitride-related ceramic are being progressed. As a result, a material, which has a stable crystal structure and shifts excitation light or emission light into a long wavelength, i.e., nitride or oxide nitride phosphor in the spotlight as the phosphor for the white light emitting device.

Particularly, an α-SiAlON:Eu yellow phosphor having photoluminescence emission superior than that of a YAG phosphor has been developed in 2002. Also, a $CaAlSiN_3$:Eu red phosphor that is pure nitride has been developed in August, 2004, and a β-SiAlON:Eu green phosphor has been developed in March, 2005. When these phosphors are combined with the blue light emitting diode, colors having good color purity may be emitted. Particularly, since the light emitting diode has superior durability and small temperature variation, life cycle and reliability of a light source of the light emitting diode may be improved.

According to a novel light emitting device that is developed in recent, the blue light emitting diode, the β-SiAlON:Eu green phosphor, and the $CaAlSiN_3$:Eu red phosphor may be improved and combined to convert light having a wavelength of about 460 nm and emitted through the blue light emitting diode into light having a wavelength of about 540 nm to about 570 nm and emitted through the green or yellow phosphors and light having a wavelength of about 650 nm and emitted through the red phosphor, thereby emitting three primary color light.

DISCLOSURE

Technical Problem

Embodiments provide a phosphor, a phosphor manufacturing method, and a white light emitting device.

Embodiments also provide a phosphor, which emits one of green light, yellow light, and red light according to a manufacturing process, a phosphor manufacturing method, and a white light emitting device.

Embodiments also provide a white light emitting device in which at least two kinds of phosphors are combined to emit white light.

Technical Solution

In one embodiment, a phosphor represented as a chemical formula of $aMO\text{-}bAl_2O_3\text{-}cSi_3N_4$, which uses light having a peak wavelength in a wavelength band of about 350 nm to about 480 nm as an excitation source to emit visible light having a peak wavelength in a wavelength band of about 480 nm to about 680 nm. (where M is one kind or two kinds of elements selected from Mg, Ca, Sr and Ba ($0.2 \leq a/(a+b) \leq 0.9$, $0.05 \leq b/(b+c) \leq 0.85$, $0.4 \leq c/(c+a) \leq 0.9$)

In another embodiment, a method of manufacturing a phosphor comprises: using inorganic compounds having an $aMO\text{-}bAl_2O_3\text{-}cSi_3N_4$ three-component system as a main component and weighing the inorganic compounds within a range of $0.2 \leq a/(a+b) \leq 0.9$, $0.05 \leq b/(b+c) \leq 0.85$, $0.4 \leq c/(c+a) \leq 0.9$ to mix them with each other, thereby preparing a source salt; and thermally treating the mixed source salt at a temperature of about 1,300° C. to about 1,400° C. under a reducing atmosphere of a reducing gas with a flow rate of about 100 sccm to about 400 sccm.

In further another embodiment, a method of manufacturing a phosphor comprises: using inorganic compounds having an $aMO\text{-}bAl_2O_3\text{-}cSi_3N_4$ three-component system as a main component and weighing the inorganic compounds within a range of $0.2 \leq a/(a+b) \leq 0.9$, $0.05 \leq b/(b+c) \leq 0.85$, $0.4 \leq c/(c+a) \leq 0.9$ to mix them with each other, thereby preparing a source salt; and thermally treating the mixed source salt at a temperature of about 1,500° C. to about 1,700° C. under a reducing atmosphere of a reducing gas with a flow rate of about 400 sccm to about 1,000 sccm.

In still further another embodiment, a light emitting device comprises: a body; a light emitting diode on the body; and a phosphor contained in a light transmission resin on the light emitting diode, wherein the phosphor uses light having a peak wavelength in a wavelength band of about 350 nm to about 480 nm as an excitation source and comprises at least one of a green phosphor having a peak wavelength in a wavelength band of about 510 nm to about 550 nm, a yellow phosphor having a peak wavelength in a wavelength band of about 550 nm to about 580 nm, and a red phosphor having a peak wavelength in a wavelength band of about 590 nm to about 650 nm, wherein at least one of the green phosphor, the yellow phosphor, and the red phosphor comprises one kind or two kinds of elements selected from Mg, Ca, Sr and Ba, and Al, Si, O, and N.

In even further another embodiment, a light emitting device comprises: a body; an electrode on the body: a light emitting diode disposed on the body, the light emitting diode being electrically connected to the electrode; and a phosphor and an encapsulant on the light emitting diode, wherein the phosphor comprises at least first and second phosphors, and the encapsulant comprises a light transmission resin, wherein at least one of the first and second phosphors comprises one kind or two kinds of elements selected from Mg, Ca, Sr and Ba, and Al, Si, O, and N.

The details of one or more embodiments are set forth in the accompanying drawings and the description below. Other features will be apparent from the description and drawings, and from the claims.

Advantageous Effects

Embodiments provide the phosphor, the phosphor manufacturing method, and the white light emitting device.

Embodiments provide the phosphor, which emits one of the green light, the yellow light, and the red light according to the manufacturing process, the phosphor manufacturing method, and the white light emitting device.

Embodiments provide the white light emitting device in which at least two kinds of phosphors are combined to emit the white light.

DESCRIPTION OF DRAWINGS

FIG. 1 is a graph illustrating an excitation spectrum of a yellow phosphor realized by a $Sr_3AlSi_2O_{9/2}N_{8/3}$:Eu phosphor of Example 1 according to a first embodiment.

FIG. 2 is a graph illustrating an emission spectrum of the yellow phosphor realized by the $Sr_3AlSi_2O_{9/2}N_{8/3}$:Eu phosphor of Example 1 according to the first embodiment.

FIG. 3 is a graph illustrating an excitation spectrum of a red phosphor realized by the $Sr_3AlSi_2O_{9/2}N_{8/3}$:Eu phosphor of Example 1 according to the first embodiment.

FIG. 4 is a graph illustrating an emission spectrum of the red phosphor realized by the $Sr_3AlSi_2O_{9/2}N_{8/3}$:Eu phosphor of Example 1 according to the first embodiment.

FIG. 5 is a graph illustrating a result obtained from an X-ray diffraction (XRD) spectrum of the $Sr_3AlSi_2O_{9/2}N_{8/3}$:Eu phosphor prepared according to a sintering condition in Example 1 according to the first embodiment.

FIGS. 6 and 7 are graphs illustrating an excitation spectrum and an emission spectrum of a yellow phosphor realized by a $Sr_2AlSi_3O_{7/2}N_4$:Eu phosphor prepared by Example 2 according to the first embodiment, respectively.

FIGS. 8 and 9 are graphs illustrating an excitation spectrum and an emission spectrum of a red phosphor realized by the $Sr_2AlSi_3O_{7/2}N_4$:Eu phosphor prepared by Example 2 according to the first embodiment, respectively.

FIG. 10 is a graph illustrating an XRD spectrum of the $Sr_2AlSi_3O_{7/2}N_4$:Eu phosphor prepared according to a sintering condition in Example 2 according to the first embodiment.

FIGS. 11 and 12 are graphs illustrating an excitation spectrum and an emission spectrum of a green phosphor realized by a $Sr_2Al_3Si_2O_{13/2}N_{8/3}$:Eu phosphor prepared by Example 3 according to the first embodiment, respectively.

FIGS. 13 and 14 are graphs illustrating an excitation spectrum and an emission spectrum of a green phosphor realized by a $Sr_2Al_3Si_2O_{13/2}N_{4/3}$:Eu phosphor prepared by Example 4 according to the first embodiment, respectively.

FIG. 15 is a graph illustrating an emission spectrum of a green phosphor realized by a $SrAlSi_3ON_5$:Eu phosphor of Example 1 according to a second embodiment.

FIG. 16 is a graph illustrating an emission spectrum of a yellow phosphor realized by the $SrAlSi_3ON_5$:Eu phosphor of Example 1 according to the second embodiment.

FIG. 17 is a graph illustrating an emission spectrum of a red phosphor realized by the $SrAlSi_3ON_5$:Eu phosphor of Example 1 according to the second embodiment.

FIG. 18 is a graph illustrating an XRD spectrum of the yellow phosphor and the red phosphor obtained according to manufacturing processes 1 and 2 and realized by the $SrAlSi_3ON_5$:Eu phosphor of Example 1 according to the second embodiment.

FIG. 19 is a graph illustrating an emission spectrum of a yellow phosphor emitting greenish yellow light and realized by a $SrAl_2Si_3ON_6$:Eu phosphor of Example 2 according to the second embodiment.

FIG. 20 is a graph illustrating an excitation spectrum of the yellow phosphor emitting the greenish yellow light and realized by the $SrAl_2Si_3ON_6$:Eu phosphor of Example 2 according to the second embodiment.

FIG. 21 is a graph illustrating an emission spectrum of a red phosphor realized by the $SrAl_2Si_3ON_6$:Eu phosphor of Example 2 according to the second embodiment.

FIG. 22 is a graph illustrating an excitation spectrum of the red phosphor realized by the $SrAl_2Si_3ON_6$:Eu phosphor of Example 2 according to the second embodiment.

FIG. 23 is a graph illustrating an XRD spectrum of the yellow phosphor and the red phosphor obtained according to manufacturing processes 1 and 2 and realized by the $SrAl_2Si_3ON_6$:Eu phosphor of Example 2 according to the second embodiment.

FIG. 24 is a graph illustrating an emission spectrum of a green phosphor realized by a $Sr_2Al_3Si_2O_2N_{17/3}$:Eu phosphor of Example 3 according to the second embodiment.

FIG. 25 is a graph illustrating an excitation spectrum of the green phosphor realized by the $Sr_2Al_3Si_2O_2N_{17/3}$:Eu phosphor of Example 3 according to the second embodiment.

FIG. 26 is a graph illustrating an emission spectrum of a red phosphor realized by the $Sr_2Al_3Si_2O_2N_{17/3}$:Eu phosphor of Example 3 according to the second embodiment.

FIG. 27 is a graph illustrating an excitation spectrum of the red phosphor realized by the $Sr_2Al_3Si_2O_2N_{17/3}$:Eu phosphor of Example 3 according to the second embodiment.

FIG. 28 is a graph illustrating an XRD spectrum of the green phosphor and the red phosphor obtained according to manufacturing processes 1 and 2 and realized by the $Sr_2Al_3Si_2O_2N_{17/3}$:Eu phosphor of Example 3 according to the second embodiment.

FIG. 29 is a graph illustrating an emission spectrum of a green phosphor realized by a $Sr_2Al_2Si_2O_2N_{14/3}$:Eu phosphor of Example 4 according to the second embodiment.

FIG. 30 is a graph illustrating an excitation spectrum of the green phosphor realized by the $Sr_2Al_2Si_2O_{02}N_{14/3}$:Eu phosphor of Example 4 according to the second embodiment.

FIG. 31 is a graph illustrating an emission spectrum of a red phosphor realized by the $Sr_2Al_2Si_2O_2N_{14/3}$:Eu phosphor of Example 4 according to the second embodiment.

FIG. 32 is a graph illustrating an excitation spectrum of the red phosphor realized by the $Sr_2Al_2Si_2O_2N_{14/3}$:Eu phosphor of Example 4 according to the second embodiment.

FIGS. 33 and 34 are a graph illustrating XRD spectrums of the green phosphor and the red phosphor obtained according to manufacturing processes 1 and 2 and realized by the $Sr_2Al_2Si_2O_2N_{14/3}$:Eu phosphor of Example 4 according to the second embodiment, respectively.

FIG. 35 is a graph illustrating an excitation spectrum of a green phosphor realized by a $Sr_2Si_4ON_6$:Eu phosphor of Example 1 according to a third embodiment.

FIG. 36 is a graph illustrating an emission spectrum of the green phosphor realized by the $Sr_2Si_4ON_6$:Eu phosphor of Example 1 according to the third embodiment.

FIG. 37 is a graph illustrating a result obtained from an XRD spectrum of the green phosphor realized by the $Sr_2Si_4ON_6$:Eu phosphor of Example 1 of according to the third embodiment.

FIG. 38 is a graph illustrating an excitation spectrum of a red phosphor realized by the $Sr_2Si_4ON_6$:Eu phosphor of Example 1 according to the third embodiment.

FIG. 39 is a graph illustrating an emission spectrum of the red phosphor prepared by the $Sr_2Si_4ON_6$:Eu phosphor of Example 1 according to the third embodiment.

FIG. 40 is a graph illustrating a result obtained from an XRD spectrum of the red phosphor realized by the $Sr_2Si_4ON_6$:Eu phosphor of Example 1 according to the third embodiment.

FIG. 41 is a graph illustrating an excitation spectrum depending on a variation of a molar ratio of an alkaline earth metal in a $(Sr,Ba)_3Si_7ON_{10}$:Eu green phosphor of Example 2 according to the third embodiment.

FIG. 42 is a graph illustrating an emission spectrum depending on the variation of the molar ratio of the alkaline earth metal in the $(Sr,Ba)_3Si_7ON_{10}$:Eu green phosphor of Example 2 according to the third embodiment.

FIG. 43 is a graph illustrating a result obtained from an XRD spectrum depending on the variation of the molar ratio of the alkaline earth metal in a $(Sr,Ba)_3Si_7ON_{10}$:Eu green phosphor of Example 2 according to the third embodiment.

FIG. 44 is a graph illustrating a result obtained by comparing an XRD spectrum of a $Sr_3Si_6ON_{12}$:Eu green phosphor of Example 3 to an XRD spectrum of a $Sr_4Si_7O_3N_{10}$:Eu green phosphor of Example 4 according to the third embodiment.

FIG. 45 is a graph illustrating an excitation spectrum of a $Sr_2Si_3O_2N_4$:Eu red phosphor of Example 5 according to the third embodiment.

FIG. 46 is a graph illustrating an emission spectrum of the $Sr_2Si_3O_2N_4$:Eu red phosphor of Example 5 according to the third embodiment.

FIG. 47 is a graph illustrating a result obtained by comparing an XRD spectrum of $Sr_2Si_3O_2N_4$:Eu red phosphor of Example 5 to a $Sr_2Si_5N_8$:Eu commercial phosphor according to the third embodiment.

FIG. 48 is a scanning electronic microscope (SEM) photograph of $Sr_2Si_3O_2N_4$:Eu red phosphor particles of Example 5 according to the third embodiment.

FIG. 49 is a graph illustrating an excitation spectrum of a $Sr_{2.6}Ba_{0.2}Si_6O_3N_8$:$Eu_{0.2}$ green phosphor of Example 6 according to the third embodiment.

FIG. 50 is a graph illustrating an emission spectrum of the $Sr_{2.6}Ba_{0.2}Si_6O_3N_8$:$Eu_{0.2}$ green phosphor of Example 6 according to the third embodiment.

FIG. 51 is a graph illustrating a result obtained from an XRD spectrum of the $Sr_{2.6}Ba_{0.2}Si_6O_3N_8$:$Eu_{0.2}$ green phosphor of Example 6 according to the third embodiment.

FIG. 52 is a SEM photograph of $Sr_{2.6}Ba_{0.2}Si_6O_3N_8$:$Eu_{0.2}$ green phosphor particles of Example 6 according to the third embodiment.

FIG. 53 is a graph illustrating a temperature characteristic of the $Sr_{2.6}Ba_{0.2}Si_6O_3N_8$:$Eu_{0.2}$ green phosphor of Example 6 according to the third embodiment.

FIGS. 54 to 66 are sectional views of a white light emitting device according to the embodiments.

FIGS. 67 and 68 are sectional views of a light emitting diode used for the white light emitting device according to the embodiments.

MODE FOE INVENTION

Hereinafter, a phosphor, a phosphor manufacturing method, and a light emitting device using the phosphor according to embodiments will be described in detail.

First Embodiment

According to a first embodiment, provided is a phosphor emitting light having a peak wavelength in a wavelength band of about 480 nm to about 680 nm using light having a peak wavelength in a wavelength band of about 350 nm to about 480 nm as an excitation source. Here, the phosphor uses inorganic compounds of an $aMO-bAl_2O_3-cSi_3N_4$ three-component system as a main component. Furthermore, M is one kind or two kinds of elements selected from a group consisting of Mg, Ca, Sr, and Ba ($0.2 \leq a/(a+b) \leq 0.9$, $0.05 \leq b/(b+c) \leq 0.85$, and $0.4 \leq c/(c+a) \leq 0.9$).

The phosphor according to the first embodiment has a stable crystal structure. In addition, although the phosphor is exposed to an excitation source for a long time or used for a long time, luminance reduction of the phosphor may be minimized.

The phosphor according to the first embodiment includes a $Sr_3AlSi_2O_{9/2}N_{8/3}$:Eu phosphor, a $Sr_2AlSi_3O_{7/2}N_4$:$Eu_2$ phosphor, a $Sr_2Al_3Si_2O_{13/2}N_{8/3}$:$Eu_2$ phosphor, and a $Sr_2Al_3SiO_{13/2}N_{4/3}$:$Eu_2$ phosphor. Although the phosphor are formed of the same composition, the phosphor may be manufactured as one of a green phosphor, a yellow phosphor, and a red phosphor, which emit the light having the peak wavelength in the wavelength band of about 480 nm to about 680 nm, using the light having the peak wavelength in the wavelength band of the 350 nm to about 480 nm as the excitation source.

In more detail, the $Sr_3AlSi_2O_{9/2}N_{8/3}$:Eu phosphor disclosed in Example 1 according to the first embodiment may be manufactured according to different conditions for each process to prepare a greenish-yellow phosphor (see FIG. 2) having an excitation spectrum having a peak wavelength in a wavelength band of about 350 nm to about 430 nm and having a peak wavelength in a wavelength band of about 520 nm to about 570, or a red phosphor (see FIG. 4) having a peak wavelength in a wavelength band of about 600 nm to about 650 nm. Thus, phosphors having the same composition and peak wavelengths in different wavelength bands from each other may be realized. Here, when crystal structures of the phosphors having the different peak wavelengths are compared to each other, it may be confirmed that the phosphors have significant different crystal structures (see FIG. 3). Also, the phosphor has a crystal structure in which a portion of a Si—N bonding of a silicon nitride is substituted for an Al—N bonding or an Al—O bonding. That is, metal elements are inserted into lattices to stabilize the crystal structure.

Also, the other phosphor disclosed in the first embodiment may include a $Sr_2AlSi_3O_{7/2}N_4$:$Eu_2$ phosphor (see FIGS. 6 to 10), a $Sr_2Al_3Si_2O_{13/2}N_{8/3}$:Eu phosphor (see FIGS. 11 and 12), and a $Sr_2Al_3SiO_{13/2}N_{4/3}$:$Eu_2$ phosphor (see FIGS. 13 and 14). Here, the phosphor may have the same composition, and also selectively realize a green phosphor, a yellow phosphor, and a red phosphor.

A compound that may product an oxidized substance of a metal element M, a silicon compound, an aluminum compound, and a compound containing a light emitting center ion formation element, which are used as source salts for preparing the phosphor according to the first embodiment may react with each other under reducing gas atmosphere to manufacture the phosphor.

Here, although the compound capable of producing the oxidized substance of the metal element M is not limited to a specific compound, the compound capable of producing the oxidized substance of the metal element M may be at least one alkaline earth metal compound selected from carbonate, oxalate, nitrate, sulfate, acetate, oxide, peroxide, and hydroxide, which have advantages in terms of availability of high purity compounds, handlability in ambient air, and their prices. Furthermore, the compound capable of producing the oxidized substance of the metal element M may be carbonate, oxalate, oxide, and hydroxide of the alkaline earth metal. Particularly, the alkaline earth metal compound may be used in an oxide or $MCO_3$ phase.

Although the alkaline earth metal compound is not limited to its phase, the alkaline earth metal compound may have a powder phase rather than a lump phase to manufacture a phosphor having high performance.

Also, $Si_3N_4$, and $Al_2O_3$ used as the source salts according to the present embodiment except the alkaline earth metal compound may have also the powder phase to manufacture the phosphor having the high performance. Also, to improve reactivity between the source salts, a flux may be added. Alkali metal compounds ($Na_2CO_3$, NaCl, and LiF) or halogen compounds ($SrF_2$, $CaCl_2$, etc), and phosphate-based or sulfide-based materials may be adequately selected and used as the flux.

The silicon compound used for preparing the phosphor according to the first embodiment may be a silicon compound capable of preparing the phosphor compositions of Examples according to the first embodiment, but is not limited thereto. For example, $Si_3N_4$, or $Si(NH)_2$, particularly, $Si_3N_4$ may be used as the silicon compound to manufacture the high-performance phosphor.

In addition, $Al_2O_3$, which is easily available and inexpensive than AlN may be used as the aluminum oxide of the first embodiment instead of AlN to manufacture a phosphor, which may realize performance equal to that of the phosphor in case where the AlN is used. Thus, since $Al_2O_3$ is used as the source salt to provide the high-purity phosphor, a related art expensive material may be replaced to reduce manufacturing costs.

In the phosphor according to the first embodiment, various rare earth or transition metals or compounds thereof may be used as source materials for adding the light emitting center ions. These elements may include lanthanide or transition metals having an atomic number ranging from 58 to 60 or 62 to 71, i.e., Ce, Pr, Eu, Tb, and Mn. Also, oxides of the lanthanide or transition metals, nitrides, hydroxides, carbonates, oxalates, nitrates, sulfates, halogenated compounds, or phosphates may be used as a compound containing the elements. For example, the compound containing the elements may include cerium carbonate, europium oxide, europium nitride, metal terbium, or manganese carbonate. Also, the compound containing the elements may have a reducing atmosphere to generate a large amount of the light emitting center ions, i.e., ions such as $Ce^{3+}$, $Eu^{2+}$, $Tb^{3+}$, or $Mn^{2+}$.

The phosphor according to the first embodiment uses the inorganic compounds of the $aMO$-$bAl_2O_3$-$cSi_3N_4$ three-component system as the main component. According to the phosphor manufacturing process of the first embodiment, provided is a method of manufacturing a high-purity phosphor in which a sintering temperature and a flow rate of a reducing gas may be controlled and performed for each process to selectively emit light having a desired wavelength among green light, yellow light, and red light through the phosphor having the same composition.

Accordingly, in the method of manufacturing the phosphor according to the first embodiment, a first manufacturing method includes 1) using inorganic compounds of an $aMO$-$bAl_2O_3$-$cSi_3N_4$ three-component system as a main component to weigh the inorganic compounds within a range of $0.2 \leq a/(a+b) \leq 0.9$, $0.05 \leq b/(b+c) \leq 0.85$, $0.4 \leq (c+a) \leq 0.9$ and then mix them, thereby preparing a source salt; and 2) thermally treating the mixed source salt at a temperature of about 1,300° C. to about 1,400° C. under a reducing atmosphere of a reducing gas with a flow rate of about 100 sccm to about 400 sccm to manufacture a yellow phosphor selectively emitting greenish-yellow light having a peak wavelength in a wavelength band of about 510 nm to about 580 nm.

Also, in the method of manufacturing the phosphor according to the first embodiment, a second manufacturing method includes 2) additionally thermally treating the greenish-yellow phosphor manufactured in the process 2) of the first manufacturing method at a temperature of about 1,500° C. to about 1,700° C. under a reducing atmosphere of a reducing gas with a flow rate of about 400 sccm to about 1,000 sccm to manufacture a red phosphor emitting light having a peak wavelength in a wavelength band of about 590 nm to about 650 nm.

Alternatively, in the method of manufacturing the phosphor according to the first embodiment, a third manufacturing method includes 1) using inorganic compounds having an $aMO$-$bAl_2O_3$-$cSi_3N_4$ three-component system as a main component to weigh the inorganic compounds within a range of $0.2 \leq a/(a+b) \leq 0.9$, $0.05 \leq b/(b+c) \leq 0.85$, $0.4 \leq c/(c+a) \leq 0.9$ and then mix them, thereby preparing a source salt; and 2) thermally treating the mixed source salt at a temperature of about 1,500° C. to about 1,700° C. under a reducing atmosphere of a reducing gas with a flow rate of about 400 sccm to about 1,000 sccm to manufacture an oxide-nitride-based red phosphor selectively emitting red light.

In a general phosphor manufacturing process, a sintering process is performed at a temperature of about 1,300° C. to about 2,000° C. Furthermore, to obtain the high-performance phosphor, the sintering process may be performed at a temperature of about 1,600° C. to about 2,000° C., and more particularly, at a temperature of about 1,700° C. to about 1,900° C. For example, for mass production, the sintering process may be performed at a temperature of about 1,400° C. to about 1,800° C., and more particularly, at a temperature of about 1,600° C. to about 1,700° C.

On the other hand, in the first embodiment, a general sintering process may be performed for each process and optimize a flow rate of the reducing gas to phosphors having crystal structures different from each other even though they have the same composition. Particularly, a high-purity phosphor, which selectively emits green light, yellow light, and red light may be manufactured.

That is, according to the first embodiment, when the inorganic compounds having the $aMO-bAl_2O_3-cSi_3N_4$ three-component system are used as the main component and the sintering process is performed at a temperature of about 1,300° C. to about 1,400° C. under the reducing atmosphere of the reducing gas with a flow rate of about 100 sccm to about 400 sccm, the yellow phosphor having optimum color density efficiency may be manufactured. Here, when the sintering temperature and the flow rate of the reducing gas are less than the foregoing conditions, the reaction and reducing effects are not sufficient to reduce color purity. Thus, it is difficult to obtain a high-quality phosphor.

Also, according to the first embodiment, the inorganic compounds of the $aMO-bAl_2O_3-cSi_3N_4$ three-component system are used as the main component, and the sintering process is performed at a temperature of about 1,500° C. to about 1,700° C. under the reducing atmosphere of the reducing gas with a flow rate of about 400 sccm to about 1,000 sccm to manufacture the red phosphor.

In the manufacturing method according to the first embodiment, the sintering temperature may be controlled for each process and the flow rate of the reducing gas may be optimized to manufacture a phosphor selectively emitting light having a desired color of a green color, a yellow color, and a red color.

That is, the sintering temperature and the flow rate of the reducing gas may be controlled for each process or individually controlled to easily manufacture a phosphor having desired emission efficiency and emission wavelength. Furthermore, when the yellow phosphor manufactured at the sintering temperature of about 1,300° C. to about 1,400° C. under the reducing atmosphere with the flow rate of about 100 sccm to about 400 sccm may be thermally treated again a sintering temperature of about 1,500° C. to about 1,700° C. under a reducing atmosphere of a reducing gas with a flow rate of about 400 sccm to about 1,000 sccm, the high-purity red phosphor may be manufactured.

Alternatively, even though the source material may be used as a starting material to perform a sintering process at a temperature of about 1,500° C. to about 1,700° C. under a reducing atmosphere of a reducing gas with a flow rate of about 400 sccm to about 1,000 sccm, the high-purity red phosphor may be manufactured.

Particularly, according to the first embodiment, the mixed source material is sintered under a reducing atmosphere, i.e., under a reducing atmosphere with a mixed gas of nitrogen and hydrogen and an atmospheric condition. Here, the mixed gas of nitrogen and hydrogen may have a mixing ratio of about 95:5 to about 90:10. Furthermore, the color density and efficiency of the phosphor may be controlled according to the sintering temperature and a supply velocity of the mixed gas. In the manufacturing method according to the present embodiment, when considering productivity, the sintering process may be performed within a time ranging from about 300 minutes to about 12 hours.

Also, in the manufacturing method according to the first embodiment, a compound containing $Eu^{2+}$ ions may have a molar concentration of 0.001 to 0.95.

According to the manufacturing method of the first embodiment, a phosphor capable of selectively controlling a desired light emitting region may be manufactured using a relatively simple method. Particularly, a phosphor, which selectively emits one of the three primary color light of the green light, the yellow light, and the red light may be manufactured.

Accordingly, the first embodiment may provide a white light emitting device having superior color purity and color rendition using the phosphor selectively emitting the green color, the yellow color, and the red color.

Hereinafter, the first embodiment will be described in detail with reference to Examples.

The first embodiment will be described more fully by Examples, and the scope of the present disclosure is not limited to Examples.

<Example 1> $Sr_3AlSi_2O_{9/2}N_{8/3}$:Eu Manufacture

Process 1. Yellow Phosphor Manufacture

SrO, $Al_2O_3$, $Si_3N_4$, $Eu_2O_3$ used as source salts are quantified to oxidation-treat the source salts at a temperature of about 800° C. to about 1,200° C. for a time period of about 2 hours. Then, the oxidation-treated source salts are put into a ball mill container to ball-mill the source salts for a time period of about 2 hours to about 24 hours using acetone as a solvent, and then to dry the ball-milled source salts. Thereafter, the dried source salts are sintered at a temperature of about 1,300° C. for a time period of about 4 hours to about 10 hours under a reducing atmosphere in which a supply velocity of a hydrogen/nitrogen gas (95:5 v/v) is controlled at a flow rate of about 100 sccm to 300 sccm to manufacture a $Sr_3AlSi_2O_{9/2}N_{8/3}$:Eu greenish-yellow phosphor. Here, europium (Eu) contains about 0 mole % by weight to about 50 mole % by weight.

FIG. 1 is a graph illustrating an excitation spectrum of the $Sr_3AlSi_2O_{9/2}N_{8/3}$:Eu phosphor manufactured in Example 1, and FIG. 2 is a graph illustrating an emission spectrum of the $Sr_3AlSi_2O_{9/2}N_{8/3}$:Eu phosphor. Here, it has been confirmed that a greenish-yellow phosphor is manufactured.

The yellow phosphor may have an emission spectrum having a full width at half maximum (FWHM) ranging from about 80 nm to about 120 nm.

Process 2. Red Phosphor Manufacture

After the $Sr_3AlSi_2O_{9/2}N_{8/3}$:Eu yellow phosphor manufactured in the process 1 is dried, the dried yellow phosphor is sintered at a temperature of about 1,500° C. for a time period of about 4 hours to about 10 hours under a reducing atmosphere in which the supply velocity of the hydrogen/nitrogen gas (95:5 v/v) is controlled at a flow rate of about 400 sccm or more.

FIG. 3 is a graph illustrating an excitation spectrum of a phosphor realized by the $Sr_3AlSi_2O_{9/2}N_{8/3}$:Eu phosphor, and FIG. 4 is a graph illustrating an emission spectrum of the phosphor realized by the $Sr_3AlSi_2O_{9/2}N_{8/3}$:Eu phosphor. Here, it has been confirmed that a red phosphor is manufactured.

The red phosphor may have an emission spectrum having a FWHM ranging from about 80 nm to about 120 nm.

Also, FIG. 5 is a graph illustrating a result obtained from an X-ray diffraction (XRD) spectrum of the $Sr_3AlSi_2O_{9/2}N_{8/3}$:Eu yellow phosphor manufactured in the process 1 to the $Sr_3AlSi_2O_{9/2}N_{8/3}$:Eu red phosphor manufactured in the process 2. Here, in spite of the same composition, it has been confirmed that the $Sr_3AlSi_2O_{9/2}N_{8/3}$:Eu yellow phosphor and the $Sr_3AlSi_2O_{9/2}N_{8/3}$:Eu red phosphor have crystal structures different from each other.

<Example 2> $Sr_2AlSi_3O_{7/2}N_4$:$Eu_2$ Manufacture

Process 1. Yellow Phosphor Manufacture

The same process as that of Example 1, except that a stoichiometric ratio of a metal salt containing Sr, Si, Al, and Eu ions to an alkaline metal salt is varied to respectively weigh the varied ratios, thereby to perform a sintering process at a temperature of about 1,300° C. for a time period of about 4 hours to about 10 hours under a reducing atmosphere in which a mixed gas (90:10 v/v) of hydrogen/nitrogen is maintained at a flow rate of about 100 sccm to about 300 sccm, is performed to manufacture a $Sr_2AlSi_3O_{7/2}N_4$:$Eu_2$ phosphor.

Here, according to the results (see FIGS. 6 and 7) observed from the excitation and emission spectrums of the manufactured $Sr_2AlSi_3O_{7/2}N_4$:$Eu_2$ phosphor, it has been confirmed that a greenish-yellow phosphor is manufactured. The yellow phosphor may have an emission spectrum having a FWHM ranging from about 100 nm to about 140 nm.

Process 2. Red Phosphor Manufacture

The same process as that of Example 1, except that the $Sr_2AlSi_3O_{7/2}N_4$:$Eu_2$ yellow phosphor manufactured in the process 1 is dried, and then the dried yellow phosphor is sintered at a temperature of about 1,500° C. for a time period of about 4 hours to about 10 hours under a reducing atmosphere in which the supply velocity of the hydrogen/nitrogen gas (95:5 v/v) is controlled at a flow rate of about 400 sccm or more, is performed.

Here, according to the results (see FIGS. 8 and 9) observed from the excitation and emission spectrums of the $Sr_2AlSi_3O_{7/2}N_4$:$Eu_2$ phosphor manufactured in the process 2, it has been confirmed that a high-purity red phosphor is manufactured. The red phosphor may have an emission spectrum having a FWHM ranging from about 80 nm to about 120 nm.

FIG. 10 is a graph illustrating an XRD spectrum of the $Sr_2AlSi_3O_{7/2}N_4$:Eu phosphor. According to the result of FIG. 10, it has been confirmed that the yellow phosphor and the red phosphor, which are clearly distinguished from each other in optical spectrum and crystal structure, are selectively manufactured according to the sintering temperature and the flow rate of the reducing gas during the manufacture even though the phosphors have the same composition as each other.

<Example 3> $Sr_2Al_3Si_2O_{13/2}N_{8/3}$:$Eu_2$ Manufacture

Process 1. Green Phosphor Manufacture

The same process as that of Example 1, except that a source composition containing Sr, Si, Al, and Eu ions is used and the sintering process is performed at a temperature of about 1,300° C. for a time period of about 10 hours under a reducing atmosphere in which the mixed gas (90:10 v/v) of hydrogen/nitrogen is maintained at a flow rate of about 100 sccm to about 300 sccm, is performed to manufacture a $Sr_2Al_3Si_2O_{13/2}N_{8/3}$:$Eu_2$ phosphor.

FIGS. 11 and 12 are graphs illustrating an excitation spectrum and an emission spectrum of a $Sr_2Al_3Si_2O_{13/2}N_{8/3}$:Eu phosphor prepared by the process 1 of Example 3, respectively. Here, according to the results of FIGS. 11 and 12, it has been confirmed that a green phosphor is manufactured. The green phosphor may have an emission spectrum having a FWHM ranging from about 90 nm to about 130 nm.

Process 2. Red Phosphor Manufacture

The same process as that of Example 1, except that a source composition containing Sr, Si, Al, and Eu ions is used and the sintering process is performed at a temperature of about 1,500° C. for a time period of about 12 hours under a reducing atmosphere in which the mixed gas (90:10 v/v) of hydrogen/nitrogen is maintained at a flow rate of about 500 sccm or more, is performed to manufacture a $Sr_2Al_3Si_2O_{13/2}N_{8/3}$:$Eu_2$ red phosphor (not shown).

<Example 4> $Sr_2Al_3SiO_{13/2}N_{4/3}$:$Eu_2$ Manufacture

Process 1. Green Phosphor Manufacture

The same process as that of Example 1, except that $SrCO_3$, $Al_2O_3$, $Si_3N_4$, $Eu_2O_3$ are respectively weighed to use them as a source composition, and a sintering process is performed at a temperature of about 1,300° C. for a time period of about 10 hours under a reducing atmosphere in which a mixed gas (90:10 v/v) of hydrogen/nitrogen is maintained at a flow rate of about 100 sccm to about 300 sccm, is performed to manufacture a $Sr_2Al_3SiO_{13/2}N_{4/3}$:$Eu_2$ phosphor.

According to an emission spectrum and an excitation spectrum illustrated in FIGS. 13 and 14, it has been confirmed that the $Sr_2Al_3SiO_{13/2}N_{4/3}$:$Eu_2$ phosphor manufactured in the process 1 is a green phosphor. The green phosphor may have an emission spectrum having a FWHM ranging from about 90 nm to about 130 nm.

Process 2. Red Phosphor Manufacture

The same process as that of Example 1, except that the $Sr_2Al_3SiO_{13/2}N_{4/3}$:$Eu_2$ green phosphor manufactured in the process 1 is dried, and then the dried green phosphor is sintered at a temperature of about 1,500° C. for a time period of about 12 hours under a reducing atmosphere in which a mixed gas (90:10 v/v) of hydrogen/nitrogen is maintained at a flow rate of about 500 sccm or more, is performed to manufacture a $Sr_2Al_3SiO_{13/2}N_{4/3}$:$Eu_2$ red phosphor.

As described above, the phosphors using the inorganic compounds of the $aMO-bAl_2O_3-cSi_3N_4$ three-component system as the main component are provided in the first embodiment. In addition, even though the phosphors have the same composition as each other, each of the phosphors may be manufactured as a phosphor, which selectively emits light having a desired color among three primary colors of green color, yellow color, and red color, through the control of the phosphor manufacturing process.

The first embodiment provides a method in which related-art sintering temperature conditions are performed for each process and a flow rate of the reducing gas is optimized during the manufacturing process to manufacture phosphors, which have the same composition and selectively emit light having a peak wavelength in a desired wavelength band among wavelength bands of the green color, yellow color, and red color.

Second Embodiment

According to a second embodiment, provided is a phosphor emitting light having a peak wavelength in a wavelength band of about 480 nm to about 680 nm using light having a peak wavelength in a wavelength band of about 350 nm to about 480 nm as an excitation source. Here, the phosphor is formed of a composition having an aMO-bAlN-cSi$_3$N$_4$ three-component system as a main component. Furthermore, M is one selected from alkaline earth metals and uses a composition satisfying conditions of $0.2 \leq a/(a+b) \leq 0.9$, $0.05 \leq b/(b+c) \leq 0.85$, $0.4 \leq c/(c+a) \leq 0.9$ as a mother material.

The phosphor according to the second embodiment may be manufactured to emit light having a peak wavelength in a desired wavelength band among wavelength bands of the green color, yellow color, and red color.

According to the phosphor disclosed in the second embodiment, a SrAlSi$_3$ON$_5$:Eu phosphor uses a light source, which emits the light having the peak wavelength in the wavelength band of about 350 nm to about 480 nm, as the excitation source. The SrAlSi$_3$ON$_5$:Eu phosphor may be a green phosphor emitting light having a peak wavelength in a wavelength band of about 510 nm to about 550 nm, a yellow phosphor emitting light having a peak wavelength in a wavelength band of about 550 nm to about 580, or a red phosphor emitting light having a peak wavelength in a wavelength band of about 590 nm to about 650 nm (see FIGS. 15 to 17). The green, yellow, or red phosphor having the SrAlSi$_3$ON$_5$:Eu composition has a stable crystal structure (see FIG. 18). Here, the crystal structure may be a structure in which a portion of a Si—N bonding of a silicon nitride is substituted for an Al—N bonding or an Al—O bonding. Thus, metal elements are inserted into crystal lattices to stabilize the crystal structure.

Also, other phosphors disclosed in the second embodiment may include a SrAl$_2$Si$_3$ON$_6$:Eu phosphor (see FIGS. 19 to 23), a Sr$_2$Al$_3$Si$_2$O$_2$N$_{17/3}$:Eu phosphor (see FIGS. 24 to 28), and a Sr$_2$Al$_2$Si$_2$O$_2$N$_{14/3}$:Eu phosphor (see FIGS. 29 to 34). The phosphors may have the same composition as each other and selectively realize the phosphor, the yellow phosphor, or the red phosphor. In addition, the green, yellow, or red phosphor has a stable crystal structure.

Here, the phosphor according to the second embodiment is formed of the compositions having the aMO-bAlN-cSi$_3$N$_4$ three-component system as the mother material ($0.2 \leq a/(a+b) \leq 0.9$, $0.05 \leq b/(b+c) \leq 0.85$, $0.4 \leq c/(c+a) \leq 0.9$).

Here, a compound that products an oxidized substance of a metal element M, a silicon compound, an aluminum compound, and a compound containing a light emitting center ion formation element, which are used as source salts for preparing the mother material of the phosphor according to the second embodiment react with each other under reducing gas atmosphere to manufacture the phosphor.

Here, although the compound capable of producing the oxidized substance of the metal element M is not limited to a specific compound, the compound capable of producing the oxidized substance of the metal element M may be at least one alkaline earth metal compound selected from carbonate, oxalate, nitrate, sulfate, acetate, oxide, peroxide, and hydroxide, which have advantages in terms of availability of high purity compounds, handlability in ambient air, and their prices. Furthermore, the compound capable of producing the oxidized substance of the metal element M may be carbonate, oxalate, oxide, and hydroxide of the alkaline earth metal. Particularly, the alkaline earth metal compound may be used in an MCO$_3$ phase.

Although the alkaline earth metal compound is not limited to its phase, the alkaline earth metal compound may have a powder phase rather than a lump phase to manufacture a phosphor having high performance.

Also, Si$_3$N$_4$, and Al$_2$O$_3$ used as the source salts according to the present embodiment except the alkaline earth metal compound may have also the powder phase to manufacture the phosphor having the high performance. Also, to improve reactivity between the source salts, a flux may be added. Alkali metal compounds (Na$_2$CO$_3$, NaCl, and LiF) or halogen compounds (SrF$_2$, CaCl$_2$, etc), and phosphate-based or sulfide-based materials may be adequately selected for being used as the flux.

The silicon compound used for preparing the phosphor according to the second embodiment may be a silicon compound capable of preparing the phosphor compositions of Examples according to the second embodiment, but is not limited thereto. For example, Si$_3$N$_4$, or Si(NH)$_2$, particularly, Si$_3$N$_4$ may be used as the silicon compound to manufacture a high-performance phosphor.

Also, if the aluminum compound is a compound that is capable of forming the composition of the phosphor according to the second embodiment, it is not limited to a specific material. For example, AlN may be used to manufacture the high-performance phosphor.

In the phosphor according to the first embodiment, various rare earth or transition metals or compounds thereof may be used as source materials for adding the light emitting center ions. These elements may include lanthanide or transition metals having an atomic number ranging from 58 to 60 or 62 to 71, i.e., Ce, Pr, Eu, Tb, and Mn. Also, oxides of the lanthanide or transition metals, nitrides, hydroxides, carbonates, oxalates, nitrates, sulfates, halogenated compounds, or phosphates may be used as a compound containing the elements. For example, the compound containing the elements may include cerium carbonate, europium oxide, europium nitride, metal terbium, or manganese carbonate. Also, the compound containing the elements may have a reducing atmosphere to generate a large amount of the light emitting center ions, i.e., ions such as Ce$^{3+}$, Eu$^{2+}$, Tb$^{3+}$, or Mn$^{2+}$.

The phosphor according to the second embodiment is formed of the inorganic compounds having the aMO-bAlN-cSi$_3$N$_4$ three-component system as the main component. According to the second embodiment, provided is a method of manufacturing phosphors, which have the same composition and selectively emit light having a desired color among green, yellow, and red colors according to their manufacturing process.

Accordingly, in the method of manufacturing the phosphor according to the second embodiment, a first manufacturing method includes 1) using inorganic compounds having an aMCO$_3$-bAlN-cSi$_3$N$_4$ three-component system as a main component to weigh the inorganic compounds within a range of $0.2 \leq a/(a+b) \leq 0.9$, $0.05 \leq b/(b+c) \leq 0.85$, $0.4 \leq c/(c+a) \leq 0.9$ and then mix them, thereby preparing a source salt; and 2) thermally treating the mixed source salt at a temperature of about 1,300° C. to about 1,400° C. under a reducing atmosphere of a reducing gas with a flow rate of about 100 sccm to about 400 sccm to manufacture a yellow phosphor selectively emitting greenish-yellow light having a peak wavelength in a wavelength band of about 510 nm to about 580 nm.

Also, in the method of manufacturing the phosphor according to the second embodiment, a second manufacturing method includes 2) additionally thermally treating the oxide-nitride-based phosphor manufactured in the process 2) of the first manufacturing method at a temperature of about 1,500° C. to about 1,700° C. under a reducing atmosphere of a reducing gas with a flow rate of about 400 sccm to about 1,000 sccm to manufacture a red phosphor emitting light having a peak wavelength in a wavelength band of about 590 nm to about 650 nm.

Alternatively, in the method of manufacturing the phosphor according to the second embodiment, a third manufacturing method includes 1) weighing compositions having an $aMCO_3$-$bAlN$-$cSi_3N_4$ three-component system within a range of $0.2 \leq a/(a+b) \leq 0.9$, $0.05 \leq (b+c) \leq 0.85$, $0.4 \leq c/(c+a) \leq 0.9$ and then mix them to prepare a source salt; and 2) thermally treating the mixed source salt at a temperature of about 1,500° C. to about 1,700° C. under a reducing atmosphere of a reducing gas with a flow rate of about 400 sccm to about 1,000 sccm to manufacture a red light.

In a general phosphor manufacturing process, a sintering process is performed at a temperature of about 1,300° C. to about 2,000° C. Furthermore, to obtain the high-performance phosphor, the sintering process may be performed at a temperature of about 1,600° C. to about 2,000° C., and more particularly, at a temperature of about 1,700° C. to about 1,900° C. For example, for mass production, the sintering process may be performed at a temperature of about 1,400° C. to about 1,800° C., and more particularly, at a temperature of about 1,600° C. to about 1,700° C.

On the other hand, in the second embodiment, a general sintering process may be performed for each process and control a flow rate of the reducing gas to phosphors having crystal structures different from each other. Particularly, a high-purity phosphor, which selectively emits green light, yellow light, and red light may be manufactured.

That is, according to the second embodiment, when the compositions having the $aMO$-$bAlN$-$cSi_3N_4$ three-component system are used as the mother material and the sintering process is performed at a temperature of about 1,300° C. to about 1,400° C. under the reducing atmosphere of the reducing gas with a flow rate of about 100 sccm to about 400 sccm, the green or yellow phosphor having optimum density efficiency of the green or yellow color may be manufactured. Here, when the sintering temperature and the flow rate of the reducing gas are less than the foregoing conditions, the reaction and reducing effects are not sufficient to reduce color purity. Thus, it is difficult to obtain a high-quality phosphor.

Also, according to the second embodiment, when the compositions having the $aMO$-$bAl_2O_3$-$cSi_3N_4$ three-component system are used as the mother material and the sintering process is performed at a temperature of about 1,500° C. to about 1,700° C. under the reducing atmosphere of the reducing gas with a flow rate of about 400 sccm to about 1,000 sccm, a red phosphor may be manufactured.

In the manufacturing method according to the second embodiment, the sintering temperature and the flow rate of the reducing gas may be controlled for each process or individually controlled to easily manufacture a phosphor having desired emission efficiency and emission wavelength. Furthermore, when the yellow phosphor manufactured at the sintering temperature of about 1,300° C. to about 1,400° C. under the reducing atmosphere with the flow rate of about 100 sccm to about 400 sccm may be thermally treated again a sintering temperature of about 1,500° C. to about 1,700° C. under a reducing atmosphere of a reducing gas with a flow rate of about 400 sccm to about 1,000 sccm, the high-purity red phosphor may be manufactured. Alternatively, even though the source material may be used as a starting material to perform a sintering process at a temperature of about 1,500° C. to about 1,700° C. under a reducing atmosphere of a reducing gas with a flow rate of about 400 sccm to about 1,000 sccm, the high-purity red phosphor may be manufactured.

Particularly, according to the second embodiment, the mixed source material is sintered under a reducing atmosphere, i.e., under a reducing atmosphere with a mixed gas of nitrogen and hydrogen and an atmospheric condition. Here, the mixed gas of nitrogen and hydrogen may have a mixing ratio of about 95:5 to about 90:10. Furthermore, the color density and efficiency of the phosphor may be controlled according to the sintering temperature and a supply velocity of the mixed gas. In the manufacturing method according to the second embodiment, when considering productivity, the sintering process may be performed within a time ranging from about 300 minutes to about 12 hours.

Also, in the phosphor manufacturing method according to the second embodiment, a compound containing $Eu^{2+}$ ions may have a molar concentration of 0.001 to 0.95.

According to the phosphor manufacturing method of the second embodiment, a phosphor capable of selectively controlling a desired light emitting region may be manufactured using a relatively simple method. Particularly, a phosphor, which selectively emits one of the three primary color light of the green light, the yellow light, and the red light may be manufactured.

Accordingly, the first embodiment may provide a white light emitting device having superior color purity and color rendition using the phosphor selectively emitting the green color, the yellow color, and the red color.

Hereinafter, the phosphor according to the second embodiment will be described in detail with reference to Examples.

The second embodiment will be described more fully by Examples, and the scope of the present disclosure is not limited to Examples.

<Example 1> $SrAlSi_3ON_5$:Eu Manufacture

Process 1. Green Phosphor Manufacture $SrCO_3$, $Si_3N_4$, AlN, $Eu_2O_3$ used as source salts are quantified to oxidation-treat the source salts at a temperature of about 800° C. to about 1,200° C. for a time period of about 2 hours. Then, the oxidation-treated source salts are put into a ball mill container to ball-mill the source salts for a time period of about 2 hours to about 24 hours using acetone as a solvent, and then to dry the ball-milled source salts. Thereafter, the dried source salts are sintered at a temperature of about 1,300° C. for a time period of about 4 hours to about 10 hours under a reducing atmosphere in which a supply velocity of a hydrogen/nitrogen gas (95:5 v/v) is controlled at a flow rate of about 100 sccm to 300 sccm to manufacture a $SrAlSi_3ON_5$:Eu green phosphor. Here, europium (Eu) contains about 0 mole % by weight to about 50 mole % by weight.

Process 2. Yellow Phosphor Manufacture

After the $SrAlSi_3ON_5$:Eu green phosphor manufactured in the process 1 is dried, the dried yellow phosphor is sintered at a temperature of about 1,350° C. for a time period of about 6 hours under a reducing atmosphere in which the supply velocity of the hydrogen/nitrogen gas (95:5 v/v) is controlled at a flow rate of about 100 sccm to 300 sccm to manufacture a $SrAlSi_3ON_5$:Eu yellow phosphor. Here, europium (Eu) is substituted for a Sr site to contain about 15 mole % by weight.

Process 3. Red Phosphor Manufacture

After the $SrAlSi_3ON_5$:Eu green phosphor manufactured in the process 1 is dried, the dried yellow phosphor is sintered at a temperature of about 1,500° C. for a time period of about 4 hours to about 10 hours under a reducing atmosphere in which the supply velocity of the hydrogen/nitrogen gas (95:5 v/v) is controlled at a flow rate of about 400 sccm or more.

FIGS. 15, 16, and 17 illustrate emission spectrums of the green, yellow, and red phosphors realized by the manufactured $SrAlSi_3ON_5$:Eu phosphor, respectively. Thus, in the second embodiment, it has been confirmed that an oxide-nitride-based phosphor having a desired light emitting peak wavelength in wavelength bands of three primary colors of the green, yellow, and red colors is manufactured according to their manufacturing process even though the phosphors have the same composition. The green phosphor may have an emission spectrum having a FWHM ranging from about 80 nm to about 120 nm. The yellow phosphor may have an emission spectrum having a FWHM ranging from about 90 nm to 130 nm. The red phosphor may have an emission spectrum having a FWHM ranging from about 80 nm to about 120 nm.

FIG. 18 is a graph illustrating a result obtained from an X-ray diffraction (XRD) spectrum of the $SrAlSi_3ON_5$:Eu yellow and red phosphors manufactured in the processes 1 and 2. Here, it has been confirmed that the yellow and red phosphors have crystal structures different from each other.

<Example 2> $SrAl_2Si_3ON_6$:Eu Manufacture

Process 1. Yellow Phosphor Manufacture

The same process as that of Example 1, except that $SrCO_3$, $Si_3N_4$, AlN, $Eu_2O_3$ are respectively weighed to use them as a source material composition and a sintering process is performed as a temperature of about 1,300° C. for a time period of about 4 hours to about 10 hours under a reducing atmosphere in which a mixed gas (90:10 v/v) of hydrogen/nitrogen is maintained at a flow rate of about 100 sccm to about 300 sccm, is performed to manufacture a $SrAl_2Si_3ON_6$:Eu phosphor.

Here, according to the results observed from the emission spectrum (see FIG. 19) and the excitation spectrum (see FIG. 20) of the manufactured $SrAl_2Si_3ON_6$:Eu phosphor, it has been confirmed that a high-purity greenish-yellow phosphor. The yellow phosphor may have an emission spectrum having a FWHM ranging from about 80 nm to about 120 nm.

Process 2. Red Phosphor Manufacture

The same process as that of Example 1, except that the $SrAl_2Si_3ON_6$:Eu greenish-yellow phosphor manufactured in the process 1 is dried, and then a sintering process is performed at a temperature of about 1,500° C. for a time period of about 4 hours to about 10 hours under a reducing atmosphere in which a mixed gas (90:10 v/v) of hydrogen/nitrogen is maintained at a flow rate of about 400 sccm or more, is performed.

According to the results (see FIGS. 21 and 22) observed from the emission and excitation spectrums of the $SrAl_2Si_3ON_6$:Eu phosphor manufactured in the process 2, it has been confirmed that a high-purity red phosphor is manufactured. The red phosphor may have an emission spectrum having a FWHM ranging from about 80 nm to about 120 nm.

FIG. 23 is a graph illustrating an XRD spectrum of each of the $SrAl_2Si_3ON_6$:Eu phosphors manufactured in the processes 1 and 2 of Example 2. Here, it has been confirmed that the yellow and red phosphors having crystal structures different from each other are manufactured.

<Example 3> $Sr_2Al_3Si_2O_2N_{17/3}$:Eu Manufacture

Process 1. Green Phosphor Manufacture

The same process as that of Example 1, except that $SrCO_3$, $Si_3N_4$, AlN, $Eu_2O_3$ are respectively weighed to use them as a source composition, and a sintering process is performed at a temperature of about 1,300° C. for a time period of about 10 hours under a reducing atmosphere in which a mixed gas (90:10 v/v) of hydrogen/nitrogen is maintained at a flow rate of about 100 sccm to about 300 sccm, is performed to manufacture a $Sr_2Al_3Si_2O_2N_{17/3}$:Eu phosphor.

According to the results observed from the emission (see FIG. 24) and excitation (see FIG. 25) spectrums of the $Sr_2Al_3Si_2O_2N_{17/3}$:Eu phosphor manufactured in the process 1 of Example 3, it has been confirmed that a high-purity $Sr_2Al_3Si_2O_2N_{17/3}$:Eu green phosphor is manufactured. The green phosphor may have an emission spectrum having a FWHM ranging from about 70 nm to about 110 nm.

Process 2. Red Phosphor Manufacture

The same process as that of Example 1, except that $SrCO_3$, $Si_3N_4$, AlN, $Eu_2O_3$ are respectively weighed to use them as a source composition, and a sintering process is performed at a temperature of about 1,500° C. for a time period of about 12 hours under a reducing atmosphere in which a mixed gas (90:10 v/v) of hydrogen/nitrogen is maintained at a flow rate of about 500 sccm or more, is performed to manufacture a $Sr_2Al_3Si_2O_2N_{17/3}$:Eu phosphor.

According to the results observed from the emission (see FIG. 26) and excitation (see FIG. 27) spectrums of the $Sr_2Al_3Si_2O_2N_{17/3}$:Eu phosphor manufactured in the process 2 of Example 3, it has been confirmed that a high-purity red phosphor is manufactured. The red phosphor may have an emission spectrum having a FWHM ranging from about 70 nm to about 110 nm.

FIG. 28 is a graph illustrating an XRD spectrum of the $Sr_2Al_3Si_2O_2N_{17/3}$:Eu phosphor manufactured in Example 3. Here, a reference numeral (a) is the $Sr_2Al_3Si_2O_2N_{17/3}$:Eu green phosphor, and a reference numeral (b) is the red $Sr_2Al_3Si_2O_2N_{17/3}$:Eu. As a result, it has been confirmed that the green and red phosphors have crystal structures different from each other.

<Example 4> $Sr_2Al_2Si_2O_2N_{14/3}$:Eu Manufacture

Process 1. Green Phosphor Manufacture

The same process as that of Example 1, except that $SrCO_3$, $Si_3N_4$, AlN, $Eu_2O_3$ are respectively weighed to use them as a source composition, and a sintering process is performed at a temperature of about 1,300° C. for a time period of about 10 hours under a reducing atmosphere in which a mixed gas (90:10 v/v) of hydrogen/nitrogen is maintained at a flow rate of about 100 sccm to about 300 sccm, is performed to manufacture a $Sr_2Al_2Si_2O_2N_{14/3}$:Eu phosphor.

According to an emission spectrum of FIG. 29 and an excitation spectrum of FIG. 30, it has been confirmed that the $Sr_2Al_2Si_2O_2N_{14/3}$:Eu phosphor manufactured in the process 1 is a high-purity green phosphor. The green phosphor may have an emission spectrum having a FWHM ranging from about 100 nm to about 140 nm.

Process 2. Red Phosphor Manufacture

The same process as that of Example 1, except that $SrCO_3$, $Si_3N_4$, AlN, $Eu_2O_3$ are respectively weighed to use them as a source composition, and a sintering process is performed at a temperature of about 1,500° C. for a time period of about 12 hours under a reducing atmosphere in which a mixed gas (90:10 v/v) of hydrogen/nitrogen is maintained at a flow rate of about 500 sccm or more, is performed to manufacture a $Sr_2Al_2Si_2O_2N_{14/3}$:Eu phosphor.

FIG. 31 is a view of an emission spectrum of the $Sr_2Al_2Si_2O_2N_{14/3}$:Eu phosphor, and FIG. 32 is a view of an excitation spectrum of the $Sr_2Al_2Si_2O_2N_{14/3}$:Eu phosphor.

Here, it has been confirmed that a high-purity red phosphor is manufactured. Also, according to the XRD spectrum of the green and red phosphors realized by the $Sr_2Al_2Si_2O_2N_{14/3}$:Eu phosphor of Example 4, it has been confirmed that the green and red phosphors have crystal structures different from each other even though them have the same composition (see FIGS. 33 and 34). The red phosphor may have an emission spectrum having a FWHM ranging from about 80 nm to about 120 nm.

As described above, the second embodiment provides the phosphors using the inorganic compounds of the MO—AlN—$Si_3N_4$ three-component system as the mother material. In addition, according to the second embodiment, the phosphors, which have the same composition and emit the light having the peak wavelength in the desired wavelength band among the three primary colors of the green, yellow, and red colors.

The first embodiment provides a method in which related-art sintering temperature conditions are performed for each process and a flow rate of the reducing gas is optimized during the manufacturing process to manufacture phosphors, which have the same composition and selectively emit light having a peak wavelength in a desired wavelength band among the three primary colors of the green color, yellow color, and red color.

Third Embodiment

According to a third embodiment, provided is a $M_aSi_bO_cN_d$: Eu phosphor, which emits light having a peak wavelength in a wavelength band of about 480 nm to about 680 nm using light having a peak wavelength in a wavelength band of about 350 nm to about 480 nm as an excitation source. (where, M is at least one or more alkaline earth metals selected from a group selected from a group consisting of Ra, Ba, Sr, Ca, Mg, and Be ($1 \leq a \leq 7$, $2 \leq b \leq 13$, $1 \leq c \leq 18$, and $0 \leq d \leq 16$))

The SiON-based phosphor disclosed in the third embodiment includes a $Sr_2Si_4ON_6$:Eu phosphor of Example 1, a $Sr_3Si_7ON_{10}$:Eu phosphor of Example 2, a $Sr_3Si_8ON_{12}$:Eu phosphor of Example 3, a $Sr_4Si_7O_3N_{10}$:Eu phosphor of Example 4, a $Sr_2Si_3O_2N_4$:Eu phosphor of Example 5, and a $Sr_{2.6}Ba_{0.2}Si_6O_3N_8$:$Eu_{0.2}$ phosphor of Example 6.

The SiON-based phosphor according to the third embodiment uses light having a peak wavelength in a wavelength band of about 350 nm to about 480 nm as an excitation source. Also, the SiON-based phosphor exhibits an emission spectrum in which a green phosphor emits light having a peak wavelength in a wavelength band of about 510 nm to about 550 nm, a yellow phosphor emits light having a peak wavelength in a wavelength band of about 550 nm to about 580 nm, and a red phosphor emits light having a peak wavelength in a wavelength band of about 590 nm to about 650 nm.

Thus, although the SiON-based phosphor is formed of the same component, the SiON-based phosphor may selectively emit light having a peak wavelength in a desired wavelength band among three primary color light of green light, yellow light, and red light. According to the comparison of results obtained by an XRD spectrum, it was confirmed that crystal structures of the green phosphor and the red phosphor are significantly different from each other. Thus, it has been confirmed that the SiON-based phosphor according to the third embodiment may be selectively emit light having a peak wavelength in a desired wavelength band among three primary color light of green light, yellow light, and red light (See FIGS. 35 to 40).

Even though the phosphors according to the third embodiment are phosphors having the same composition as each other, the phosphor emitting light having a peak wavelength in a desired wavelength band among three primary color light of green light, yellow light, and red light may be selectively manufactured according to phosphor manufacturing processes.

For example, as shown in FIGS. 41 to 43, in case where a molar ratio between alkaline earth metals in alkaline metal salts of the $(Sr,Ba)_3Si_7ON_{10}$:Eu phosphor of the third embodiment, i.e., a molar ratio (n value) of $Sr_{3-n}$ and $Ba_n$ ranges from 0 to 1, it may be confirmed that a high purity green phosphor having the same crystal structure is manufactured.

Particularly, it may be confirmed that the red phosphor having the $Sr_2Si_3O_2N_4$:Eu composition of Example 5 according to the third embodiment has photoluminescence (PL) emission equal to that of a $CaAlSiN_3$:Eu red phosphor that is a commercial phosphor and the $Sr_{2.6}Ba_{0.2}Si_6O_3N_8$:$Eu_{0.2}$ green phosphor of Example 6 maintains well the PL emission in a temperature region of about 75° C. (See FIG. 53).

A metal element M used as a source salt for forming a mother material of the SiON-based phosphor according to the third embodiment is a divalent metal ion of the alkaline earth metal. That is, at least one or more selected from Sr, Ba, and Ca may be used as the divalent metal ion of the alkaline earth metal. Here, the metal element M may include one kind or two or more kinds of ions selected from a group consisting of water soluble metal salts or oxide or nitride containing the water soluble metal salts. Furthermore, although a compound capable of producing oxide of the metal element M is not limited, the compound of the metal element M may be at least one or more alkaline earth metals selected from carbonate, oxalate, nitrate, sulfate, acetate, oxide, peroxide, and hydroxide, which have advantages in terms of availability of high purity compounds, handlability in ambient air, and their prices. Furthermore, the compound of the metal element M may be carbonate, oxalate, oxide, and hydroxide of the alkaline earth metal. In particular, the alkaline earth metal compound is used in $MCO_3$ phase. Also, although the alkaline earth metal compound is not limited to its phase, the alkaline earth metal compound may have a powder phase rather than a lump phase to manufacture a phosphor having high performance.

In addition to the alkaline earth metal compound, $Si_3N_4$, $Si(NH)_2$, or $SiO_2$, which are used as the source salts according to the third embodiment may have also the powder phase to manufacture the phosphor having the high performance. Also, to improve a reaction between the source salts, a flux may be added during a sintering process. Alkali metal compounds ($Na_2CO_3$, NaCl, and LiF) or chloride- or fluoride-based halogen compounds ($SrF_2$, $CaCl_2$, etc), and phosphate-based or sulfide-based materials may be adequately used as the flux. Particularly, when a phosphate-based flux according to the embodiments is used, significantly superior effects may be observed. Here, sulfur may be very usefully used for nitriding the oxide.

A silicon compound according to the third embodiment may be a silicon compound capable of forming the phosphor compositions according to the embodiments, but is not limited thereto. For example, $Si_3N_4$, $Si(NH)_2$, or $SiO_2$ may be used as the silicon compound to manufacture the high-performance phosphor.

In the phosphors according to the third embodiment, various rare earth or transition metals or compounds thereof may be used as source materials for adding emitting center ions. These elements may include lanthanide elements having an atomic number ranging from 58 to 60 or 62 to 71 or the transition metals, i.e., Ce, Pr, Eu, Tb, or Mn. A compound containing the elements may include oxides, nitrides, hydroxides, carbonates, oxalates, nitrates, sulfates, halogenated compounds, or phosphates of the lanthanide elements or transition metals. For example, the compound containing the elements may include cerium carbonate, europium oxide, europium nitride, metal terbium, or manganese carbonate. Also, the compound containing the elements may have a reducing atmosphere to generate a large amount of the emitting center ions, i.e., ions such as $Ce^{3+}$, $Eu^{2+}$, $Tb^{3+}$, or $Mn^{2+}$.

In more detail, an added amount of Eu used in the third embodiment may be ranging from 0.001 mol to 0.95 mol when compared to that of the divalent metal ion of the alkaline earth metal. When the added amount of Eu is less than 0.001 mol, activation may be reduced. Also, when the added amount of Eu exceeds 0.95 mol, concentration quenching may occur to reduce luminance.

The third embodiment provides a method of manufacturing a SiON-based phosphor, which selectively emits light having a peak wavelength in a desired wavelength band among three primary color light of green light, yellow light, and red light according to the process of manufacturing the phosphors having the same composition as each other.

In a manufacturing method according to the third embodiment, a first manufacturing method includes 1) quantifying metal salts containing divalent metal ions of at least one or more alkaline earth metals selected from a group consisting of Ra, Ba, Sr, Ca, Mg, and Be, Si ions, and Eu ions and then mixing the metal salts to prepare a sample; and 2) thermally treating the mixed source salts at a temperature of about 1,300° C. to about 1,400° C. under a reducing atmosphere of a reducing gas with a flow rate of about 100 sccm to about 300 sccm.

Also, in a manufacturing method according to the third embodiment, a second manufacturing method includes 1) additionally thermally treating the SiON-based phosphor manufactured by the process 2) of the first manufacturing method at a temperature of about 1,450° C. to about 1,700° C. under a reducing atmosphere of a reducing gas with a flow rate of about 400 sccm to about 1,000 sccm to manufacture a red phosphor, which emits light having a peak wavelength in a wavelength band of about 610 nm to about 650 nm.

Alternatively, a third manufacturing method includes 1) quantifying metal salts containing divalent metal ions of at least one or more alkaline earth metals selected from a group consisting of Ra, Ba, Sr, Ca, Mg, and Be, Si ions, and Eu ions and then mixing the metal salts to prepare a sample; and 2) thermally treating the mixed source salts at a temperature of about 1,500° C. to about 1,700° C. under a reducing atmosphere of a reducing gas with a flow rate of about 400 sccm to about 1,000 sccm.

In a general phosphor manufacturing process, a sintering process is performed at a temperature of about 1,300° C. to about 2,000° C. Furthermore, to obtain a high-performance phosphor, the sintering process may be performed at a temperature of about 1,600° C. to about 2,000° C., and more particularly, at a temperature of about 1,700° C. to about 1,900° C. For example, for mass production, the sintering process may be performed at a temperature of about 1,400° C. to about 1,800° C., and more particularly, at a temperature of about 1,600° C. to about 1,700° C.

On the other hand, the general sintering process according to the third embodiment may be performed for each stage.

In addition, a flow rate of the reducing gas may be controlled to manufacture the phosphors having crystal structures different from each other. Particularly, a high-purity phosphor, which selectively emits green light, yellow light, and red light may be manufactured.

That is, according to the first manufacturing method of the third embodiment, when the SiON-based phosphor is used as a mother material and the sintering process is performed at a temperature of about 1,300° C. to about 1,400° C. under a reducing atmosphere of a reducing gas with a flow rate of about 100 sccm to about 300 sccm, the green and yellow phosphors having optimum color density efficiency may be manufactured. Here, when the sintering temperature and the flow rate of the reducing gas are less than the foregoing conditions, the reaction and reducing are not sufficient to reduce color purity. As a result, it is difficult to obtain high-quality phosphors.

Sequentially, according to the second manufacturing method of the third embodiment, when the green and yellow phosphors of the SiON-based phosphor having the same composition is thermally treated again at a temperature of about 1,500° C. to about 1,700° C. under a reducing atmosphere of a reducing gas with a flow rate of about 400 sccm to about 1,000 sccm, the red phosphor may be manufactured. That is, the manufactured green phosphor may be converted into the red phosphor by controlling the sintering temperature and the flow rate of the reducing gas in the process.

Also, according to the third manufacturing method of the third embodiment, the high-purity red phosphor may be manufactured through the other method of manufacturing the red phosphor, even though the source material may be used as a starting material and a sintering process may be performed at a temperature of about 1,500° C. to about 1,700° C. under a reducing atmosphere of a reducing gas with a flow rate of about 400 sccm to about 1,000 sccm.

Thus, in the manufacturing methods according to the third embodiment, the sintering temperature of the flow rate of the reducing gas may be controlled for each stage or separately controlled to manufacture the phosphors having desired light emitting efficiency or color density.

Here, the mixed source salts are sintered under the reducing atmosphere, and the sintering process is performed under a reducing gas atmosphere and an atmospheric condition created by a mixed gas of nitrogen and hydrogen.

Here, the mixed gas of nitrogen and hydrogen may have a mixing ratio of about 95:5 to about 90:10. Particularly, the color density and efficiency of the phosphor may be controlled according to the sintering temperature and a supply velocity of the mixed gas. Also, in the manufacturing methods according to the third embodiment, when considering productivity, the sintering process may be performed within a time ranging from about 300 minutes to about 12 hours.

In the manufacturing methods according to the third embodiment, the SiON-based phosphor has a structure in which it is activated by $Eu^{2+}$ ions and a small amount of the $Eu^{2+}$ ions are added, and thereafter, substituted with the alkaline metal. Here, the compound containing the $Eu^{2+}$ ions may have a molar concentration of 0.001 to 0.95.

According to the manufacturing methods of the third embodiment, the phosphor selectively controlling a desired light emitting region may be manufactured using a relatively simple method. Particularly, the SiON-based phosphor, which selectively emits one of the three primary color light of the green light, the yellow light, and the red light may be manufactured.

Hereinafter, the present disclosure will be described in detail with reference to the third embodiment.

The present disclosure will be described more fully by the third embodiment, and the scope of the present disclosure is not limited to Examples.

<Example 1> $Sr_2Si_4ON_6$:Eu Manufacture

Process 1: Green Phosphor Manufacture

Metal salts containing Sr, Si, Eu ions are quantified, and the quantified metal salts are oxidation-treated at a temperature of about 800° C. to about 1,200° C. for a time period of about 2 hours. Thereafter, the oxidation-treated metal salts are put into a ball mill container to ball-mill the metal salts for a time period of about 2 hours to about 24 hours using acetone as a solvent, and then to dry the ball-milled metal salts. Thereafter, the metal salts are sintered at a temperature of about 1,300° C. for a time period of about 4 hours to about 10 hours under a reducing atmosphere in which a supply velocity of a hydrogen/nitrogen gas (95:5 v/v) is controlled at a flow rate of about 100 sccm to about 300 sccm to manufacture a $Sr_2Si_4ON_6$:Eu phosphor. Here, the manufactured phosphor is a green phosphor, showing the result as illustrated in the XRD spectrum of FIG. 37, which is excited by light having a peak wavelength in a wavelength band of about 380 nm to about 470 nm as shown in the excitation spectrum of FIG. 35 to emit visible light having a peak wavelength in a wavelength band of about 525 nm to about 545 as shown in the emission spectrum of FIG. 36. The green phosphor has the emission spectrum in which a full width at half maximum (FWHM) ranges from about 50 nm to about 100 nm, and more particularly, ranges from about 50 nm to about 80 nm.

Process 2: Red Phosphor Manufacture

The $Sr_2Si_4ON_6$:Eu green phosphor manufactured in process 1 is dried, and then, is sintered at a temperature of about 1500° C. for a time period of about 4 hours to about 10 hours under a reducing atmosphere in which the supply velocity of the hydrogen/nitrogen gas (95:5 v/v) is controlled at a flow rate of about 400 sccm or more.

The phosphor obtained after the sintering process is performed is a red phosphor, which is excited by light having a peak wavelength in a wavelength band of about 395 nm to about 470 nm as shown in the excitation spectrum of FIG. 38 to emit visible light having a peak wavelength in a wavelength band of about 610 nm to about 640 as shown in the emission spectrum of FIG. 39 to show the result as illustrated in the XRD spectrum of FIG. 40. The red phosphor has the emission spectrum in which the FWHM ranges from about 70 nm to about 120 nm, and more particularly, ranges from about 80 nm to about 100 nm.

Also, a crystal structure observed from the result obtained from the XRD spectrum of the $Sr_2Si_4ON_6$:Eu red phosphor is different from that observed from the result obtained from XRD spectrum of the green phosphor manufactured in process 1. According to the third embodiment, even though the phosphors have the same composition as each other, the green phosphor or the red phosphor may be selectively manufactured by performing the sintering temperature condition during the manufacturing process for each stage and controlling the flow rate of the reducing gas. Particularly, the green phosphor may be converted into the red phosphor through the above-described method.

The green phosphor, the red phosphor, and the yellow phosphor may be realized using the $Sr_2Si_4ON_6$:Eu phosphor of Example 1. Thus, according to the third embodiment, it has been confirmed that the SiON-based phosphor, which emits light having a peak wavelength in a desired wavelength band among three primary color light of green light, yellow light, and red light may be selectively manufactured even though the phosphors have the same composition as each other.

<Example 2> $Sr_3Si_7ON_{10}$:Eu Manufacture

Process 1: Green Phosphor and Yellow Phosphor Manufacture

A stoichiometric ratio of metal salts containing Sr, Ba, Si, Eu ions is varied with respect to an alkaline metal salt to respectively weigh the alkaline metal salt and the metal salts. Then, the same process as that of Example 1, except that the metal salts are sintered at a temperature of about 1,300° C. for a time period of about 4 hours to about 10 hours under a reducing atmosphere in which a mixed gas (90:10 v/v) of hydrogen/nitrogen is maintained at a flow rate of about 100 sccm to about 300 sccm, is performed to manufacture a $(Sr,Ba)_3Si_7ON_{10}$:Eu phosphor.

Here, in the manufactured $(Sr,Ba)_3Si_7ON_{10}$:Eu phosphor, a variation of an excitation spectrum according to the alkaline metal salt has been confirmed as illustrated in the excitation spectrum of FIG. 41, and it has been confirmed that the green phosphor and the yellow phosphor are manufactured as illustrated in the emission spectrum of FIG. 42. Also, as illustrated in the XRD spectrum of FIG. 43, the result obtained by comparing the XRD spectrum of the green phosphor to the XRD spectrum of the yellow phosphor is illustrated.

According to the results observed from the spectrums, in case where a molar ratio between alkaline earth metals in the $(Sr,Ba)_3Si_7ON_{10}$:Eu phosphor, i.e., a molar ration (n value) of $Sr_{3-n}$ and $Ba_n$ ranges from 0 to 1, it has been confirmed that a high purity green phosphor having the same crystal structure is manufactured. Also, in case where the n value of $Sr_{3-n}$ and $Ba_n$ ranges from 1.5 to 2, it has been confirmed that the yellow phosphor is manufactured.

The green phosphor has the emission spectrum in which a FWHM ranges from about 50 nm to about 80 nm, and the yellow phosphor has the emission spectrum in which a FWHM ranges from about 60 nm to about 100 nm.

Process 2: Red Phosphor Manufacture

The high-purity $Sr_3Si_7ON_{10}$:Eu green phosphor of the $(Sr,Ba)_3Si_7ON_{10}$:Eu phosphor manufactured in the process 1 is dried. Then, the same process as that of Example 1, except that the green phosphor is sintered at a temperature of about 1500° C. for a time period of about 4 hours to about 10 hours under a reducing atmosphere in which a mixed gas (90:10 v/v) of hydrogen/nitrogen is maintained at a flow rate of about 400 sccm or more, is performed.

<Example 3> $Sr_3Si_8ON_{12}$:Eu Manufacture

Process 1: Green Phosphor Manufacture

The same process as that of Example 1, except that metal salts containing Sr, Si, and Eu ions are respectively weighed to use a source composition material and sintered at a temperature of about 1,300° C. for a time period of about 10 hours under a reducing atmosphere in which a mixed gas (90:10 v/v) of hydrogen/nitrogen is maintained at a flow rate of about 100 sccm to about 300 sccm, is performed to manufacture a $Sr_3Si_8ON_{12}$:Eu phosphor. It has been confirmed that the manufactured $Sr_3Si_8ON_{12}$:Eu phosphor has an excitation spectrum having a peak wavelength in a wavelength band of about 395 nm to about 475 (not shown). Also, it has been confirmed that the high-purity green phosphor is manufactured, by showing the result of the emission spectrum, which emits a visible light having a peak wavelength in a wavelength band of about 520 nm to about 550 nm (not shown).

Process 2: Red Phosphor Manufacture

The same process as that of Example 1, except that metal salts containing Sr, Si, and Eu ions are respectively weighed to use a source composition material and sintered at a temperature of about 1500° C. for a time period of about 12 hours under a reducing atmosphere in which a mixed gas (90:10 v/v) of hydrogen/nitrogen is maintained at a flow rate of about 500 sccm or more, is performed to manufacture a $Sr_3Si_8ON_{12}$:Eu phosphor. Also, it has been confirmed that the high-purity red phosphor is manufactured, through the excitation spectrum and the emission spectrum (not shown) of the $Sr_3Si_8ON_{12}$:Eu phosphor.

<Example 4> $Sr_4Si_7O_3N_{10}$:Eu Manufacture

Process 1: Green Phosphor Manufacture

The same process as that of Example 1, except that metal salts containing Sr, Si, and Eu ions are respectively weighed to use a source composition material and sintered at a temperature of about 1,300° C. for a time period of about 10 hours under a reducing atmosphere in which a mixed gas (90:10 v/v) of hydrogen/nitrogen is maintained at a flow rate of about 100 sccm to about 300 sccm, is performed to manufacture a $Sr_4Si_7ON_{10}$:Eu green phosphor.

Process 2: Red Phosphor Manufacture

The same process as that of Example 1, except that metal salts containing Sr, Si, and Eu ions are respectively weighed to use a source composition material and sintered at a temperature of about 1500° C. for a time period of about 12 hours under a reducing atmosphere in which a mixed gas (90:10 v/v) of hydrogen/nitrogen is maintained at a flow rate of about 500 sccm or more, is performed to manufacture a $Sr_4Si_7ON_{10}$:Eu red phosphor.

FIG. 44 is a graph illustrating a result obtained by comparing the XRD spectrum of the $Sr_3Si_8ON_{12}$:Eu green phosphor of Example 3 to the XRD spectrum of the $Sr_4Si_7O_3N_{10}$:Eu green phosphor of Example 4. According to the results, although the phosphors have compositions different from each other, it has been confirmed that the phosphors have the same crystal structure through the XRD spectrum showing the same pattern of the green phosphor observed as the green phosphor in the excitation spectrum and the emission spectrum.

<Example 5> $Sr_2Si_3O_2N_4$:Eu Manufacture

Process 1: Green Phosphor Manufacture

Phosphor source materials of 0.7222 g of $SrCO_3$, 1.3817 g of $Si_3N_4$, and 0.0479 g of $Eu_2O_3$ are respectively quantified, and the quantified phosphor source materials are oxidation-treated at a temperature of about 800° C. to about 1,200° C. for a time period of about 2 hours. Thereafter, the oxidation-treated phosphor source materials are put into a ball mill container to ball-mill the phosphor source materials for a time period of about 15 hours using acetone as a solvent, and then to dry the ball-milled phosphor source materials. Then, the dried phosphor source materials are sintered at a temperature of about 1,300° C. to about 1,400° C. for a time period of about 4 hours to about 10 hours under a reducing atmosphere in which a supply velocity of a hydrogen/nitrogen gas (95:5 v/v) is controlled at a flow rate of about 100 sccm to about 300 sccm. When the sintering process is performed, a sulfide-based flux may be used as the flux. After the sintering process is performed, the prepared phosphor powder is mixed with water to stir the mixture for a time period of about 40 minutes at a speed of about 150 rpm or less. Then, the mixture is ball-milled and dried. The dried phosphor is sintered at a temperature of about 1,100° C. for a time period of about 3 hours to about 5 hours to remove defects or impurities. Here, hydrochloric acid and water are mixed at a ratio of about 2:8 to clean the detects and impurities, thereby manufacturing the $Sr_2Si_3O_2N_4$:Eu phosphor.

Here, it has been confirmed that the manufactured phosphor is a green phosphor, through the results observed from the excitation spectrum, which emits light having a peak wavelength in a wavelength band of about 380 nm to about 470, the emission spectrum, which emits visible light having a peak wavelength in a wavelength band of about 525 nm to about 545 nm, and the XRD spectrum.

Process 2: Red Phosphor Manufacture

Phosphor source materials of 0.7222 g of $SrCO_3$, 1.3817 g of $Si_3N_4$, and 0.0479 g of $Eu_2O_3$ are respectively quantified, and the quantified phosphor source materials are oxidation-treated at a temperature of about 800° C. to about 1,200° C. for a time period of about 2 hours. Thereafter, the oxidation-treated phosphor source materials are put into a ball mill container to ball-mill the phosphor source materials for a time period of about 15 hours using acetone as a solvent, and then to dry the ball-milled phosphor source materials. Then, the dried phosphor source materials are sintered at a temperature of about 1,500° C. for a time period of about 6 hours under a reducing atmosphere in which a supply velocity of a hydrogen/nitrogen gas (95:5 v/v) is controlled at a flow rate of about 400 sccm or more. When the sintering process is performed, a sulfide-based flux may be used as the flux. After the sintering process is performed, the prepared phosphor powder is mixed with water to stir the mixture for a time period of about 40 minutes at a speed of about 150 rpm or less. Then, the mixture is ball-milled and dried. The dried phosphor is sintered at a temperature of about 1,100° C. for a time period of about 3 hours to about 5 hours to remove defects or impurities. Here, hydrochloric acid and water are mixed at a ratio of about 2:8 to clean the detects and impurities, thereby manufacturing the $Sr_2Si_3O_2N_4$:Eu phosphor. Also, it has been confirmed that the manufactured phosphor is a red phosphor, which is excited by light having a peak wavelength in a wavelength band of about 395 nm to about 470 nm as shown in the excitation spectrum of FIG. 45 to emit visible light having a peak wavelength in a wavelength band of about 610 nm to about 650 as shown in the emission spectrum of FIG. 46. Here, the red phosphor has the emission spectrum in which a FWHM has a wavelength of about 76.7 nm.

As shown in the XRD spectrum of FIG. 47, it has been confirmed that the $Sr_2Si_3O_2N_4$:Eu red phosphor is manufactured, by confirming a crystal structure having the same peak as a $Sr_2Si_5N_8$:$Eu^{2+}$ nitride-based phosphor [JCPAS: 85-0101], that is a well-known red phosphor.

Also, FIG. 48 is a scanning electronic microscope (SEM) (Model name: Philips Model 515) photograph of the $Sr_2Si_3O_2N_4$:Eu red phosphor powder. Here, it has been confirmed that fine particles having a size of about 20 μm are uniformly distributed in the $Sr_2Si_3O_2N_4$:Eu red phosphor.

<Example 6> $Sr_{2.6}Ba_{0.2}Si_6O_3N_8$:$Eu_{0.2}$ Manufacture

Phosphor source materials of 0.7222 g of $SrCO_3$, 0.1137 g of $BaCO_3$, 1.3817 g of $Si_3N_4$, and 0.0479 g of $Eu_2O_3$ are respectively quantified, and the quantified phosphor source materials are oxidation-treated at a temperature of about 800° C. to about 1,200° C. for a time period of about 2 hours. Thereafter, the oxidation-treated phosphor source materials are put into a ball mill container to ball-mill the phosphor source materials for a time period of about 15 hours using acetone as a solvent, and then to dry the ball-milled phosphor source materials. Then, the dried phosphor source materials are sintered at a temperature of about 1,350° C. for a time period of about 6 hours under a reducing atmosphere in which a supply velocity of a hydrogen/nitrogen gas (95:5 v/v) is controlled at a flow rate of about 100 sccm to 300 sccm. When the sintering process is performed, a phosphate-based flux may be used as the flux. After the sintering process is performed, the prepared phosphor powder is mixed with water to stir the mixture for a time period of about 40 minutes at a speed of about 150 rpm or less. Then, the mixture is ball-milled and dried.

In the manufactured phosphor, an excitation band having a near ultraviolet (UV) region (a) and a blue color region (b) has been observed over a wide wavelength band of about 395 nm to about 470 nm as shown in the excitation spectrum of FIG. 49, and a maximum absorption wavelength peak has been observed at a wavelength of about 541.5 nm of a wavelength band of about 500 nm to about 580 nm as shown in FIG. 50. In addition, a FWHM has a wavelength of about 76.7 nm. Thus, it has been confirmed that the manufactured phosphor is a green phosphor.

Also, as shown in the XRD spectrum of FIG. 51, it has been confirmed that the $Sr_{2.6}Ba_{0.2}Si_6O_3N_8:Eu_{0.2}$ phosphor has the same crystal structure as a $SrSi_2O_2N_2$ phosphor that is a well-known green phosphor. Thus, it has been confirmed that the green phosphor is manufactured. Also, it has been confirmed that fine particles having a size of about 3 μm to about 7 μm are uniformly distributed in the $Sr_{2.6}Ba_{0.2}Si_6O_3N_8:Eu_{0.2}$ green phosphor through the result observed from the surface SEM (Model name: Philips Model 515) of FIG. 52.

<Experimental Example 1> Optical Characteristic of White LED Using $Sr_2Si_3O_2N_4$:Eu Red Phosphor A comparison result between a PL emission of a white light emitting device using the $Sr_2Si_3O_2N_4$:Eu red phosphor manufactured in Example 5 and a characteristic of a commercial red phosphor (Comparative example 1) having a CaAlSiN:$Eu^{2+}$ composition was shown in Table 1.

TABLE 1

| Phosphor | EL | CIEx | CIEy | Color Reproduction (vs NTSC) | | Efficiency | Lm |
| --- | --- | --- | --- | --- | --- | --- | --- |
| | | | | 1931 | 1976 | | |
| Comparative example 1 | 100% | 0.231 | 0.215 | 83.6 | 101.4 | 55 lm/W | 10.53 |
| Embodiment 5 | 95% | 0.2367 | 0.201 | 81.6 | 101.9 | 51 lm/W | 10.04 |

According to the comparison result, the $Sr_2Si_3O_2N_4$:Eu red phosphor may be replaced with the commercial red phosphor because the $Sr_2Si_3O_2N_4$:Eu red phosphor has the PL emission equivalent to that of the commercial red phosphor.

<Experimental Example 2> Optical Characteristic of $Sr_{2.6}Ba_{0.2}Si_6O_3N_8:Eu_{0.2}$ Green Phosphor The PL emission according to a temperature variation of the $Sr_{2.6}Ba_{0.2}Si_6O_3N_8:Eu_{0.2}$ green phosphor manufactured in Example 6 was measured, and the measured result was illustrated in FIG. 53. According to the measured result, the PL emission of the $Sr_{2.6}Ba_{0.2}Si_6O_3N_3:Eu_{0.2}$ green phosphor was invariably maintained in various temperature regions from about 25° C. to about 75° C.

As described above, the third embodiment provides the SiON-based phosphors, which have the same composition and selectively emit light having a peak wavelength in a desired wavelength band among three primary color light of green light, yellow light, and red light.

Also, the phosphor according to the third embodiment has the PL emission equivalent to that of the commercial phosphor. Furthermore, since the PL emission the $Sr_{2.6}Ba_{0.2}Si_6O_3N_8:Eu_{0.2}$ green phosphor is maintained in various temperature regions from about 25° C. to about 75° C., the $Sr_{2.6}Ba_{0.2}Si_6O_3N_8:Eu_{0.2}$ green phosphor may be replaceable.

The third embodiment may provide a manufacturing method through which the phosphor emitting light having a peak wavelength in a desired wavelength band among the tree primary color light of green light, yellow light, and red light is selectively manufactured by performing related art sintering conditions in stage and specifying a flow rate of a reducing gas during the manufacturing process according to the embodiments.

Thus, the third embodiment may provide a white light emitting device having superior color purity and color rendering using the SiON-based phosphor.

The third embodiment may provide a white light emitting device having superior color purity and color rendering using the SiON-based phosphor, which selectively emits the green light, the yellow light, and the red light.

The red phosphor of the phosphors according to the manufactured first, second, and third embodiments is uniformly dispersed in an epoxy resin or a silicon resin to manufacture an encapsulant. Thereafter, the encapsulant is coated on a light emitting diode emitting blue light or mounted in a thin film shape on the light emitting diode, and then is hardened at a temperature of about 100° C. to about 160° C. for a time period of about 1 hour to manufacture the white light emitting device.

FIG. 54 is a schematic sectional view of the white light emitting device according to the embodiment. Furthermore, a light emitting diode 110 emitting photons having a peak wavelength in a blue wavelength band is grown. Then, the red phosphor and the green phosphor of the phosphors 151 according to the first, second, and third embodiments are mixed with the epoxy resin or the silicon resin. Thereafter, the mixture of the phosphors and the resin may be dispersed in the encapsulant 150 to manufacture the white light emitting device.

Also, the yellow phosphor manufactured through the manufacturing methods according to the first, second, and third embodiments in addition to the red phosphor and the green phosphor may be additionally added to improve optical efficiency of the device. Also, a garnet-based phosphor (YAG:Ce, TAG:Ce, etc) and/or a silicate-based phosphor may be used as the yellow phosphor.

Also, the yellow phosphor manufactured through the manufacturing methods according to the first, second, and third embodiments instead of the red phosphor and the green phosphor may be dispersed to manufacture the white light emitting device.

A GaN-based light emitting diode, which has a peak wavelength in a wavelength band of about 450 nm to about 480 nm, i.e., in a wavelength of about 465 nm and emits blue light having a FWHM of about 15 nm to about 40 nm may be used as the light emitting diode 110 emitting light having the peak wavelength in the blue wavelength band.

The light emitting diode 110 is adhered and fixed to electrodes 131 or a body 120 using an Ag paste. The light emitting diode 110 may be electrically connected to one of the electrodes 131 through the Ag paste and electrically connected to the other one of the electrodes 131 through a wire 140.

The phosphor 151 prepared according to the embodiment is dispersed in the epoxy resin or the silicon resin to manufacture the encapsulant 150. Thereafter, the manufactured encapsulant 150 is coated on the light emitting diode 110 or mounted in a thin film shape on the light emitting diode 110, and then is hardened and fixed at a temperature of about 100° C. to about 160° C. for a time period of about 1 hour to manufacture the white light emitting device.

Here, an added amount of the red phosphor of the phosphors according to the first, second, and third embodiments with respect to 100 parts by weight of the epoxy resin or the silicon resin may be adjusted according to a desired color coordinate. For example, the added amount of the red phosphor may range from about 0.1 part to about 60 parts by weight. Furthermore, the added amount of the red phosphor may range from about 1 part to about 30 parts by weight. In more detail, the green phosphor of the phosphors according to the first, second, and third embodiments may be further added to the encapsulant 150 to emit white light. Here, the green phosphor may contain about 3 parts to about 50 parts by weight with respect to 100 parts by weight of the epoxy resin or the silicon resin.

Also, when the white light emitting device is manufactured, it should be understood to the ordinary skilled person in the art that a general yellow phosphor may be further added to improve the optical efficiency of the device.

An added amount of the yellow phosphor added for emitting the white light may range from about 0.1 part to about 20 parts by weight with respect to 100 parts by weight of the epoxy resin or the silicon resin.

Particularly, the red phosphor according to the first, second, and third embodiments within the encapsulant 150 uses the blue light emitted from the light emitting diode 110 as an excitation source to optically convert the blue light into visible light having a peak wavelength in a wavelength band of about 480 nm to about 680 nm.

Here, an optical path difference between the phosphors contained in the encapsulant and the light emitting diode may be reduced to improve the optical efficiency of the optically converted white light emitting device. Thus, when compared that a single yellow phosphor uses related art blue light as an excitation source to emit white light, the reduction of the color rendering may be minimized to manufacture the white light emitting device having superior color purity and improved optical efficiency.

Also, a light emitting diode, which emits UV light may be used as the light emitting diode. In this case, the phosphor 151 may include green, red, and blue phosphors.

FIG. 55 is a sectional view of a white light emitting device according to another embodiment.

In a description of the white light emitting device illustrated in FIG. 55, a description duplicated with that of the white light emitting device illustrated in FIG. 54 will be omitted.

Referring to FIG. 55, a white light emitting device may include a light emitting diode 110, a body 120 supporting the light emitting diode 110 and reflecting light emitted from the light emitting diode 110 upwardly, two electrodes 131 providing a power into the light emitting diode 110 and electrically insulated from each other, a wire 140 electrically connecting the two electrodes 131 to each other, a phosphor 151 dispersed in a light transmission resin formed of an epoxy resin or a silicon resin to mold the light emitting diode 110, and encapsulant 150 surrounding the light emitting diode 110, the body 120, the phosphor 151, and the wire 140. The phosphor manufactured according to the embodiments may be used as the phosphor 151 as shown in FIG. 54.

FIG. 56 is a sectional view of a white light emitting device according to another embodiment.

In a description of the white light emitting device illustrated in FIG. 56, a description duplicated with that of the white light emitting device illustrated in FIG. 54 will be omitted.

Referring to FIG. 56, a white light emitting device may include a light emitting diode 110, a body 120 supporting the light emitting diode 110 and reflecting light emitted from the light emitting diode 110 upwardly, two electrodes 131 patterned on the body 120 to provide a power into the light emitting diode 110, a wire 140 electrically connecting the light emitting diode 110 to one of the two electrodes 131, a phosphor 151 dispersed in a light transmission resin molding the light emitting diode 110, and an encapsulant 150 disposed on the body 120 to surround the light emitting diode 110. The phosphor manufactured according to the embodiments may be used as the phosphor 151 as shown in FIG. 54.

FIG. 57 is a sectional view of a white light emitting device according to another embodiment.

In a description of the white light emitting device illustrated in FIG. 57, a description duplicated with that of the white light emitting device illustrated in FIG. 54 will be omitted.

Referring to FIG. 57, a white light emitting device may include a light emitting diode 110, a body 120 supporting the light emitting diode 110 and reflecting light emitted from the light emitting diode 110 upwardly, two electrodes 131 passing through the body 120 and having one side disposed within a cavity defined within the body 120 and the other side disposed on under surface of the body 120 to provide a power into the light emitting diode 110, a wire 140 electrically connecting the light emitting diode 110 to one of the two electrodes 131, an encapsulant including a light transmission resin molding the light emitting diode 110, and a phosphor 151 disposed on the body 120 and/or the encapsulant 150. The phosphor manufactured according to the embodiments may be used as the phosphor 151 as shown in FIG. 54.

The phosphor 151 may be dispersed into the light transmission resin and have a uniform thickness on the body 120 and/or the encapsulant 150. That is, the phosphor 151 may be formed by conformal coating.

The light emitting diode 110 may be disposed within the cavity defined in the body 120 and spaced from the phosphor 151.

FIG. 58 is a sectional view of a white light emitting device according to another embodiment.

In a description of the white light emitting device illustrated in FIG. 58, a description duplicated with that of the white light emitting device illustrated in FIG. 54 will be omitted.

Referring to FIG. 58, a white light emitting device may include a light emitting diode 110, a body 120 supporting the light emitting diode 110 and reflecting light emitted from the light emitting diode 110 upwardly, two electrodes 131 patterned on the body 120 to provide a power into the light emitting diode 110, a wire 140 electrically connecting the light emitting diode 110 to one of the two electrodes 131, a phosphor 151 dispersed on the light emitting diode 110, and an encapsulant 150 disposed on the body 120 to surround the light emitting diode 110. The phosphor manufactured according to the embodiments may be used as the phosphor 151 as shown in FIG. 54.

The phosphor 151 may have a uniform thickness on the light emitting diode 110 and contact a top surface and a lateral surface of the light emitting diode 110.

FIG. 59 is a sectional view of a white light emitting device according to another embodiment.

In a description of the white light emitting device illustrated in FIG. 59, a description duplicated with that of the white light emitting device illustrated in FIG. 54 will be omitted.

Referring to FIG. 59, a white light emitting device may include a light emitting diode 110, a body 120 supporting the light emitting diode 110 and reflecting light emitted from the light emitting diode 110 upwardly, two electrodes 131 disposed on the body 120 to provide a power into the light emitting diode 110, and a wire 140 electrically connecting the light emitting diode 110 to one of the two electrodes 131. The light emitting diode 110 may be disposed on the other one of the two electrodes 131 and electrically connected to the other one of the two electrodes 131.

Also, the white light emitting device may include a first encapsulant 150a surrounding the light emitting diode 110, a first phosphor 151a disposed on the first encapsulant 150a, a second encapsulant 150b disposed on the first phosphor 151a, a second phosphor 151b disposed on the second encapsulant 150b, a third encapsulant 150c disposed on the second phosphor 151b, a third phosphor 151c disposed on the third encapsulant 150c, and a fourth encapsulant 150d disposed on the third phosphor 151c. The first, second, and third phosphors 151a, 151b, and 151c may be spaced from the light emitting diode 110. The first, second, and third phosphors 151a, 151b, and 151c may be spaced from each other.

For example, the first, second, third, and fourth encapsulants 150a, 150b, 150c, and 150d may be formed of an epoxy resin or a silicon resin.

The white light emitting device may include at least two kinds of phosphors. In the present embodiment, three kinds of phosphors, i.e., the first, second, and third phosphors 151a, 151b, and 151c are provided as an example.

For example, in case where the light emitting diode 110 is a blue light emitting diode that emits blue light, only the first and second phosphors 151a and 151b may be provided. Here, the first and second phosphors 151a and 151b may be a yellow phosphor emitting yellow light and a green phosphor emitting green light, or the yellow phosphor emitting the yellow light and a red phosphor emitting red light, respectively. Alternatively, the first and second phosphors 151a and 151b may be the red phosphor emitting the red light and the green phosphor emitting the green light, respectively.

For example, in case where the light emitting diode 110 is a blue light emitting diode that emits blue light, the first, second, and third phosphors 151a, 151b, and 151c may be provided. Here, the first, second, and third phosphors 151a, 151b, and 151c may be a yellow phosphor emitting yellow light, a green phosphor emitting green light, and a red phosphor emitting red light, respectively.

For example, in case where the light emitting diode 110 is an UV light emitting diode that emits UV light, the first, second, and third phosphors 151a, 151b, and 151c may be provided. Here, the first, second, and third phosphors 151a, 151b, and 151c may be a blue phosphor emitting blue light, a green phosphor emitting green light, and a red phosphor emitting red light, respectively.

The first, second, and third phosphors 151a, 151b, and 151c may be disposed on an optical path emitted from the light emitting diode 110. The more the phosphor is adjacent to the light emitting diode 110, the more the phosphor may emit light having a short wavelength. For example, in case where the light emitting diode 110 is the blue light emitting diode, the green phosphor may be used as the first phosphor 151a, the yellow phosphor may be used as the second phosphor 151b, and the red phosphor may be used as the third phosphor 151c. Also, for example, in case where the light emitting diode 110 is the UV light emitting diode, the blue phosphor may be used as the first phosphor 151a, the green phosphor may be used as the second phosphor 151b, and the red phosphor may be used as the third phosphor 151c.

An oxynitride (ON)-based phosphor or a silicate-based phosphor may be used as the green phosphor. A YAG phosphor, a TAG phosphor, or a silicate-based phosphor may be used as the yellow phosphor. The oxynitride (ON)-based phosphor or a nitride (N)-based phosphor may be used as the red phosphor.

Here, the inorganic compounds of the $aMO-bAl_2O_3-cSi_3N_4$ three-component system described in the first embodiment are used as the main component. Where M is one kind or two kinds of elements selected from a group consisting of Mg, Ca, Sr, and Ba. Also, since the phosphor satisfying conditions of $0.2 \leq a/(a+b) \leq 0.9$, $0.05 \leq b/(b+c) \leq 0.85$, $0.4 \leq c/(c+a) \leq 0.9$ may be used as the green, yellow, or red phosphor, it will not be separately described herein.

Also, since the phosphor having the $aMO-bAlN-cSi_3N_4$ three-component system described in the first embodiment may be used as the green, yellow, or red phosphor (where M is one selected from the alkaline earth metals ($0.2 \leq a/(a+b) \leq 0.9$, $0.05 \leq b/(b+c) \leq 0.85$, $0.4 \leq c/(c+a) \leq 0.9$)), it will not be separately described herein.

Also, since the phosphor represented as a chemical formula of $M_aSi_bO_cN_d$:Eu (where M is at least one or more alkaline earth metals selected from a group consisting of Ra, Ba, Sr, Ca, Mg, and Be ($1 \leq a \leq 7$, $2 \leq b \leq 13$, $1 \leq c \leq 18$, and $0 < d \leq 16$)) may be used as the green, yellow, or red phosphor, it will not be separately described herein.

In case where the first, second, and third phosphors 151a, 151b, and 151c are the green, yellow, and red phosphors, respectively, an amount of the yellow phosphor may be largest, an amount of the green phosphor may be the next-largest, and an amount of the red phosphor may be the smallest. Also, the green, yellow, and red phosphors may be varied according to a characteristic of a light source or an intensity of light to be emitted.

A phosphor, which emits light having a FWHM of about 50 nm to about 100 nm, for example, about 60 nm to about 90 nm may be used as the green phosphor. For example, a $(Sr, Ba, Mg, Ca)_2SiO_4$:Eu$^{2+}$ phosphor of the silicate-based phosphor that emits light having the FWHM of about 60 nm to about 100 nm or a $Si_{6-x}Al_xO_xN_{8-x}$:Eu$^{2+}$ ($0<x<6$) phosphor of the oxynitride (ON)-based phosphor that emits light having FWHM of about 50 nm to about 70 nm may be used as the green phosphor. Here, in case of the silicate-based phosphor, when Ba has a molar ratio equal to or greater than that of Sr, light having a green wavelength band may be emitted. In addition, when Sr has a molar ratio greater than that of Ba, light having a yellow wavelength band may be emitted. Also, at least one of Mg and Ca may be selectively used.

A phosphor, which emits light having a FWHM of about 50 nm to about 100 nm or about 120 nm or more may be used as the yellow phosphor. For example, a $Y_3Al_5O_{12}:Ce^{3+}$ phosphor of the YAG phosphor or $Tb_3Al_5O_{12}:Ce^{3+}$ phosphor of the TAG phosphor, which emits light having the FWHM of about 120 nm or more or the $(Sr, Ba, Mg, Ca)_2SiO_4:Eu^{2+}$ phosphor of the silicate-based phosphor that emits light having the FWHM of about 60 nm to about 100 nm may be used as the yellow phosphor.

The nitride (N)-based phosphor that emits light having the FWHM of about 80 nm to about 110 nm, for example, about 90 nm to about 100 nm may be used as the red phosphor. For example, a $CaAlSiN_3:Eu^{2+}$ phosphor that emits light having the FWHM of about 90 nm to about 100 nm may be used as the red phosphor.

For example, the oxynitride (ON)-based phosphor may be provided as the first phosphor 151a, the YAG phosphor may be provided as the second phosphor 151b, and the nitride (N)-based phosphor may be provided as the third phosphor 151c.

Alternatively, the silicate-based phosphor may be provided as the first phosphor 151a, the silicate-based phosphor may be provided as the second phosphor 151b, and the nitride (N)-based phosphor may be provided as the third phosphor 151c.

Alternatively, the silicate-based phosphor may be provided as the first phosphor 151a, the YAG phosphor may be provided as the second phosphor 151b, and the oxynitride (ON)-based phosphor may be provided as the third phosphor 151c.

Alternatively, the YAG phosphor or the silicate-based phosphor may be provided as the first phosphor 151a, the oxynitride (ON)-based phosphor may be provided as the second phosphor 151b, and the oxynitride (ON)-based phosphor may be provided as the third phosphor 151c.

Alternatively, the oxynitride (ON)-based phosphor may be provided as the first phosphor 151a, the oxynitride (ON)-based phosphor may be provided as the second phosphor 151b, and the oxynitride (ON)-based phosphor may be provided as the third phosphor 151c.

Also, as described in FIGS. 1 to 14, in the first, second, and third phosphors 151a, 151b, and 151c, light having a peak wavelength in a wavelength band of about 350 nm to about 480 nm is used as an excitation source. Also, an inorganic compound of the $aMO-bAl_2O_3-cSi_3N_4$ three-component system emitting visible light having a peak wavelength in a wavelength band of about 480 nm to about 680 nm is used as a main component. Where M is at least one or more alkaline earth metals selected from a group consisting of Ra, Ba, Sr, Ca, Mg, and Be. In addition, a phosphor using a composition satisfying the conditions of $0.2 \leq a/(a+b) \leq 0.9$, $0.05 \leq b/(b+c) \leq 0.85$, $0.4 \leq c/(c+a) \leq 0.9$ as a mother material may be used as the the first, second, and third phosphors 151a, 151b, and 151c.

Also, as described in FIGS. 15 to 34, in the first, second, and third phosphors 151a, 151b, and 151c, light having a peak wavelength in a wavelength band of about 350 nm to about 480 nm is used as an excitation source. Also, each of the first, second, and third phosphors 151a, 151b, and 151c may be one of the compositions having the $aMO-bAlN-cSi_3N_4$ three-component system, i.e., M is may be one selected from the alkaline earth metals. In addition, a phosphor using a composition satisfying the conditions of $0.2 \leq a/(a+b) \leq 0.9$, $0.05 \leq b/(b+c) \leq 0.85$, $0.4 \leq c/(c+a) \leq 0.9$ as a mother material may be used as the first, second, and third phosphors 151a, 151b, and 151c.

Also, as described in FIGS. 35 to 53, in the first, second, and third phosphors 151a, 151b, and 151c, light having a peak wavelength in a wavelength band of about 350 nm to about 480 nm is used as an excitation source. Also, a phosphor represented as $M_aSi_bO_cN_d$:Eu (where M ($1 \leq a \leq 7$, $2 \leq b \leq 13$, $1 \leq c \leq 18$, and $0 < d \leq 16$)), which uses light having a peak wavelength in a wavelength band of about 350 nm to about 480 nm as an excitation source to emit visible light having a peak wavelength in a wavelength band of about 480 nm to about 680 nm may be used as the first, second, and third phosphors 151a, 151b, and 151c.

Thus, the white light emitting device illustrated in FIG. 59 may include at least two kinds of phosphors to emit the white light.

FIG. 60 is a sectional view of a white light emitting device according to another embodiment.

In a description of the white light emitting device illustrated in FIG. 60, a description duplicated with that of the white light emitting device illustrated in FIG. 59 will be omitted.

Referring to FIG. 60, a white light emitting device may include a light emitting diode 110, a body 120 supporting the light emitting diode 110 and reflecting light emitted from the light emitting diode 110 upwardly, two electrodes 131 disposed on the body 120 to provide a power into the light emitting diode 110, and a wire 140 electrically connecting the light emitting diode 110 to one of the two electrodes 131. The light emitting diode 110 may be disposed on the other one of the two electrodes 131 and electrically connected to the other one of the two electrodes 131.

Also, the white light emitting device may include a first phosphor 151a disposed on a top surface and a lateral surface of the light emitting diode 110 to surround the light emitting diode 110, a second phosphor 151b disposed on the first phosphor 151a and on a top surface side and a lateral surface side of the light emitting diode 110 to surround the light emitting diode 110, a third phosphor 151c disposed on the second phosphor 151b and on the top surface side and the lateral surface side of the light emitting diode 110 to surround the light emitting diode 110, and an encapsulant 150 surrounding the first, second, and third phosphors 151a, 151b, and 151c.

For example, the first phosphor 151a may contact the light emitting diode 110, the second phosphor 151b may contact the first phosphor 151a and be spaced from the light emitting diode 110, and the third phosphor 151c may contact the second phosphor 151b and be spaced from the light emitting diode 110.

The encapsulant 150 may be formed of an epoxy resin or a silicon resin, and the first, second, and third phosphors 151a, 151b, and 151c may be formed of the same material as that described in FIG. 59.

FIG. 61 is a sectional view of a white light emitting device according to another embodiment.

In a description of the white light emitting device illustrated in FIG. 61, a description duplicated with that of the white light emitting device illustrated in FIG. 59 will be omitted.

Referring to FIG. 61, a white light emitting device may include a light emitting diode 110, a body 120 supporting the light emitting diode 110 and reflecting light emitted from the light emitting diode 110 upwardly, two electrodes 131 disposed on the body 120 to provide a power into the light emitting diode 110, and a wire 140 electrically connecting the light emitting diode 110 to one of the two electrodes 131. The light emitting diode 110 may be disposed on the other one of the two electrodes 131 and electrically connected to the other one of the two electrodes 131.

Also, the white light emitting device may include a first phosphor 151a disposed on a top surface and a lateral surface of the light emitting diode 110 to surround the light emitting diode 110, a second phosphor 151b disposed on the first phosphor 151a and on a top surface side of the light emitting diode 110, a third phosphor 151c disposed on the second phosphor 151b and on the top surface side of the light emitting diode 110, and an encapsulant 150 surrounding the first, second, and third phosphors 151a, 151b, and 151c.

For example, the first phosphor 151a may contact the top surface and the lateral surface of the light emitting diode 110, the second phosphor 151b may be spaced from the light emitting diode 110 to contact the first phosphor 151a, and the third phosphor 151c may be spaced from the light emitting diode 110 to contact the second phosphor 151b.

The encapsulant 150 may be formed of an epoxy resin or a silicon resin, and the first, second, and third phosphors 151a, 151b, and 151c may be formed of the same material as that described in FIG. 59.

FIG. 62 is a sectional view of a white light emitting device according to another embodiment.

In a description of the white light emitting device illustrated in FIG. 62, a description duplicated with that of the white light emitting device illustrated in FIG. 59 will be omitted.

Referring to FIG. 62, a white light emitting device may include a light emitting diode 110, a body 120 supporting the light emitting diode 110 and reflecting light emitted from the light emitting diode 110 upwardly, two electrodes 131 disposed on the body 120 to provide a power into the light emitting diode 110, and a wire 140 electrically connecting the light emitting diode 110 to one of the two electrodes 131. The light emitting diode 110 may be disposed on the other one of the two electrodes 131 and electrically connected to the other one of the two electrodes 131.

Also, the white light emitting device may include an encapsulant 150 surrounding the light emitting diode 110, and first, second, third phosphors 151a, 151b, and 151c, which are dispersed and distributed in the encapsulant 150.

The encapsulant 150 may be formed of an epoxy resin or a silicon resin, and the first, second, and third phosphors 151a, 151b, and 151c may be formed of the same material as that described in FIG. 59.

FIG. 63 is a sectional view of a white light emitting device according to another embodiment.

In a description of the white light emitting device illustrated in FIG. 63, a description duplicated with that of the white light emitting device illustrated in FIG. 59 will be omitted.

Referring to FIG. 63, a white light emitting device may include a light emitting diode 110, a body 120 supporting the light emitting diode 110 and reflecting light emitted from the light emitting diode 110 upwardly, two electrodes 131 disposed on the body 120 to provide a power into the light emitting diode 110, and a wire 140 electrically connecting the light emitting diode 110 to one of the two electrodes 131. The light emitting diode 110 may be disposed on the other one of the two electrodes 131 and electrically connected to the other one of the two electrodes 131.

Also, the white light emitting device may include an encapsulant 150 surrounding the light emitting diode 110, a first phosphor 151a on the encapsulant 150, a second phosphor 151b on the first phosphor 151a, and a third phosphor 151c on the second phosphor 151b.

For example, the first phosphor 151a may be spaced from the light emitting diode 110 and disposed on the encapsulant 150, the second phosphor 151b may contact the first phosphor 151a, and the third phosphor 151c may contact the second phosphor 151b.

The encapsulant 150 may be formed of an epoxy resin or a silicon resin, and the first, second, and third phosphors 151a, 151b, and 151c may be formed of the same material as that described in FIG. 59.

FIG. 64 is a sectional view of a white light emitting device according to another embodiment.

In a description of the white light emitting device illustrated in FIG. 64, a description duplicated with that of the white light emitting device illustrated in FIG. 59 will be omitted.

Referring to FIG. 64, a white light emitting device may include a light emitting diode 110, a body 120 supporting the light emitting diode 110 and reflecting light emitted from the light emitting diode 110 upwardly, two electrodes 131 disposed on the body 120 to provide a power into the light emitting diode 110, and a wire 140 electrically connecting the light emitting diode 110 to one of the two electrodes 131. The light emitting diode 110 may be disposed on the other one of the two electrodes 131 and electrically connected to the other one of the two electrodes 131.

Also, the white light emitting device may include a first encapsulant 150a surrounding the light emitting diode 110, a first phosphor 151a on the first encapsulant 150a, a second encapsulant 150b on the first phosphor 151a, a second phosphor 151b on the second encapsulant 150b, a third encapsulant 150c on the second phosphor 151b, and a third phosphor 151c on the third encapsulant 150c.

For example, the first phosphor 151a may be spaced from the light emitting diode 110, the second phosphor 151b may be spaced from the first phosphor 151a, and the third phosphor 151c may be spaced from the second phosphor 151b.

The first, second, and third encapsulants 150a, 150b, and 150c may be formed of an epoxy resin or a silicon resin, and the first, second, and third phosphors 151a, 151b, and 151c may be formed of the same material as that described in FIG. 59.

FIG. 65 is a sectional view of a white light emitting device according to another embodiment.

In a description of the white light emitting device illustrated in FIG. 65, a description duplicated with that of the white light emitting device illustrated in FIG. 59 will be omitted.

Referring to FIG. 65, a white light emitting device may include a light emitting diode 110, a body 120 supporting the light emitting diode 110 and reflecting light emitted from the light emitting diode 110 upwardly, two electrodes 131 disposed on the body 120 to provide a power into the light emitting diode 110, and a wire 140 electrically connecting the light emitting diode 110 to one of the two electrodes 131. The light emitting diode 110 may be disposed on the other one of the two electrodes 131 and electrically connected to the other one of the two electrodes 131.

Also, the white light emitting device may include a first phosphor 151a disposed on a top surface of the light emitting diode 110, a second phosphor 151b disposed on the first phosphor 151a and on a top surface side of the light emitting diode 110, a third phosphor 151c disposed on the second phosphor 151b and on the top surface side of the light emitting diode 110, and an encapsulant 150 surrounding the first, second, and third phosphors 151a, 151b, and 151c.

For example, the first phosphor 151a may contact the light emitting diode 110, the second phosphor 151b may be spaced from the light emitting diode 110 to contact the first phosphor 151a, and the third phosphor 151c may contact the second phosphor 151b.

The encapsulant 150 may be formed of an epoxy resin or a silicon resin, and the first, second, and third phosphors 151a, 151b, and 151c may be formed of the same material as that described in FIG. 59.

FIG. 66 is a sectional view of a white light emitting device according to another embodiment.

In a description of the white light emitting device illustrated in FIG. 66, a description duplicated with that of the white light emitting device illustrated in FIG. 59 will be omitted.

Referring to FIG. 66, a white light emitting device may include a light emitting diode 110, a body 120 supporting the light emitting diode 110 and reflecting light emitted from the light emitting diode 110 upwardly, two electrodes 131 disposed on the body 120 to provide a power into the light emitting diode 110, and a wire 140 electrically connecting the light emitting diode 110 to one of the two electrodes 131. The light emitting diode 110 may be disposed on the other one of the two electrodes 131 and electrically connected to the other one of the two electrodes 131.

Also, the white light emitting device may include a first phosphor 151a disposed on a top surface of the light emitting diode 110, a first encapsulant 150a surrounding the light emitting diode 110 and the first phosphor 151a, a second phosphor 151b disposed on the first encapsulant 150a, a second encapsulant 150b disposed on the second phosphor 151b, and a third phosphor 151c disposed on the second encapsulant 150b.

For example, the first phosphor 151a may contact the light emitting diode 110, the second phosphor 151b may be spaced from the first phosphor 151a and disposed on the first encapsulant 150a, and the third phosphor 151c may be spaced from the second phosphor 151b and disposed on the second encapsulant 150b.

The first and second encapsulants 150a and 150b may be formed of an epoxy resin or a silicon resin, and the first, second, and third phosphors 151a, 151b, and 151c may be formed of the same material as that described in FIG. 59.

FIG. 67 is a sectional view illustrating an example of a light emitting diode, which is used in the white light emitting device.

A light emitting diode according to an embodiment include a light emitting structure layer including an undoped semiconductor layer 20 on a substrate 10, a first conductive type semiconductor layer on the undoped semiconductor layer 20, an active layer 40, and a second conductive type semiconductor layer 50. A first electrode 60 is disposed on the first conductive type semiconductor layer 30, and a second electrode 90 is disposed on the second conductive type semiconductor layer 50.

Also, a first conductive type InGaN/GaN supperlattice structure or InGaN/InGaN supperlattice structure 35 may be disposed between the first conductive type semiconductor layer 30 and the active layer 40.

Also, a second conductive type AlGaN layer 55 may be disposed between the second conductive type semiconductor layer 50 and the active layer 40.

For example, the substrate 10 may include a sapphire ($Al_2O_3$) substrate or be formed of at least one of SiC, GaAs, GaN, ZnO, Si, GaP, InP, and Ge, but is not limited thereto. For example, the substrate 10 may serve as a growth substrate on which the light emitting structure layer is grown, and the sapphire substrate may be used as the substrate 10.

A plurality of protrusion patterns 11 may be disposed on the substrate 10. The protrusion patterns 11 may scatter light emitted from the active layer 40 to improve optical efficiency.

For example, the respective protrusion patterns 11 may have one of a hemisphere shape, a polygonal shape, a pyramid shape, and a nano pillar shape.

Although a first conductive type impurity is not intentionally injected into the undoped semiconductor layer 20, a nitride layer having a first conductive type conductivity, e.g., the undoped nitride layer 20 may be formed as an undoped-GaN layer. A buffer layer may be disposed between the undoped semiconductor layer 20 and the substrate 10. Also, it is not necessary to form the undoped semiconductor layer 20. Thus, the undoped semiconductor layer 20 may not provided.

For example, the first conductive type semiconductor layer 30 may include an n-type semiconductor layer. The first conductive type semiconductor layer 30 may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., InAlGaN, GaN, AlGaN, AlInN, InGaN, AlN, or InN, and doped with an n-type dopant such as Si, Ge, and Sn.

The active layer 40 is a layer in which electrons (or holes) injected through the first conductive type semiconductor layer 30 meets with electrons (holes) injected through the second conductive type semiconductor layer 50 to emit light by a band gap difference of an energy band depending on a formation material of the active layer 40.

The active layer 30 may have a single quantum well structure, a multi quantum well (MQW) structure, a quantum dot structure, or a quantum wire structure, but is not limited thereto.

The active layer 40 may be formed of a semiconductor material having a compositional formula of $In_xAl_yGa_{1-x-y}N$ ($0 \leq x \leq 1$, $0 \leq y \leq 1$, $0 \leq x+y \leq 1$). When the active layer 40 has the MQW structure, a plurality of well layers and a plurality of barrier layers may be stacked to form the active layer 40. For example, the active layer 30 may have a cycle of InGaN well layer/GaN barrier layer.

A clad layer (not shown) in which an n-type or p-type dopant is doped may be disposed above/below the active layer 40. The clad layer (not shown) may be realized by an AlGaN layer or an InAlGaN layer.

For example, the second conductive semiconductor layer 50 may be realized by the P-type semiconductor layer. The second conductive type semiconductor layer 50 may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., InAlGaN, GaN, AlGaN, AlInN, InGaN, AlN, or InN, and doped with a p-type dopant such as Mg, Zn, Ca, Sr, and Ba.

The first conductive type semiconductor layer 30 may include the p-type semiconductor layer, and the second conductive type semiconductor layer 50 may include the n-type semiconductor layer. Also, a third conductive type semiconductor layer (not shown) including the n-type or p-type semiconductor layer may be disposed on the second conductive type semiconductor layer 50. Thus, the light emitting structure layer may have at least one of an np junction structure, a pn junction structure, an npn junction structure, and a pnp junction structure. Also, impurities may be doped into the first conductive type semiconductor layer 30 and the second conductive type semiconductor layer 50 with uniform or ununiform concentration. That is, the light emitting structure layer may have various structures, but is not limited thereto.

The first electrode 60 is disposed on the first conductive type semiconductor layer 30 and the second electrode 70 is disposed on the second conductive type semiconductor layer 50 to provide a power to the active layer 40.

The light emitting diode may be a GaN-based light emitting diode, which emits blue light having a peak wavelength in a wavelength band of about 450 nm to about 480 nm, for example, a wavelength of about 465 nm and a FWHM of about 15 nm to about 40 nm.

FIG. 68 is a sectional view illustrating another example of the light emitting diode, which is used in the white light emitting device. In a description of the light emitting diode illustrated in FIG. 68, a description duplicated with that of the light emitting device illustrated in FIG. 67 will be omitted.

Referring to FIG. 68, a light emitting diode may include a conductive support substrate 80, a light emitting structure layer including a first conductive type semiconductor layer 30, an active layer 40, and a second conductive type semiconductor layer 50, which are disposed on the conductive support substrate 80, and a first electrode 60 disposed on the first conductive type semiconductor layer 30.

Also, a first conductive type InGaN/GaN supperlattice structure or InGaN/InGaN supperlattice structure 35 may be disposed between the first conductive type semiconductor layer 30 and the active layer 40.

Also, a second conductive type AlGaN layer 55 may be disposed between the second conductive type semiconductor layer 50 and the active layer 40.

A light extraction structure 31 having a pillar or hole shape may be disposed on the first conductive type semiconductor layer 30. The light extraction structure 31 may effectively extract light emitted from the active layer 40 to the outside.

For example, the light extraction structure 31 may have one of a hemisphere shape, a polygonal shape, a pyramid shape, and a nano pillar shape. Also, the light extraction structure 31 may be formed by photonic crystal.

The conductive support substrate 80 may support the light emitting structure layer. In addition, the conductive support substrate 80 together with the first electrode 60 may provide a power to the light emitting structure layer.

The conductive support substrate 80 may include a support layer, a reflective layer, and an ohmic contact layer. The support layer may be formed of at least one of copper, gold, nickel, molybdenum, copper-tungsten alloy, or carrier wafer (e.g., Si, Ge, GaAs, ZnO, SiC, etc). Also, the reflective layer may be formed of a metal containing Ag or Al. The ohmic contact layer may be formed of a material, which ohmic-contacts the second conductive type semiconductor layer 50. For example, the ohmic contact layer may be formed in a single or multi-layer using at least one or more of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni, Ag, Ni/IrOx/Au, and Ni/IrOx/Au/ITO.

The light emitting structure layer may include a plurality of compound semiconductor layers of III-V Group elements. For example, the first conductive type semiconductor layer 30 may include an n-type semiconductor layer. The first conductive type semiconductor layer 30 may be formed of a semiconductor material having a compositional formula of $In_xAl_yGa1_{-x-y}N$ ($0 \le x \le 1$, $0 \le y \le 1$, $0 \le x+y \le 1$), e.g., InAlGaN, GaN, AlGaN, AlInN, InGaN, AlN, or InN, and doped with an n-type dopant such as Si, Ge, and Sn.

The active layer 40 is a layer in which electrons (or holes) injected through the first conductive type semiconductor layer 30 meets with electrons (holes) injected through the second conductive type semiconductor layer 50 to emit light by a band gap difference of an energy band depending on a formation material of the active layer 40.

The active layer 30 may have a single quantum well structure, a multi quantum well (MQW) structure, a quantum dot structure, or a quantum wire structure, but is not limited thereto.

The active layer 40 may be formed of a semiconductor material having a compositional formula of $In_xAl_yGa1_{-x-y}N$ ($0 \le x \le 1$, $0 \le y \le 1$, $0 \le x+y \le 1$). When the active layer 40 has the MQW structure, a plurality of well layers and a plurality of barrier layers may be stacked to form the active layer 40. For example, the active layer 30 may have a cycle of InGaN well layer/GaN barrier layer.

A clad layer (not shown) in which an n-type or p-type dopant is doped may be disposed above/below the active layer 40. The clad layer (not shown) may be realized by an AlGaN layer or an InAlGaN layer.

For example, the second conductive semiconductor layer 50 may be realized by the P-type semiconductor layer. The second conductive type semiconductor layer 50 may be formed of a semiconductor material having a compositional formula of $In_xAl_yGa_{1-x-y}N$ ($0 \le x \le 1$, $0 \le y \le 1$, $0 \le x+y \le 1$), e.g., InAlGaN, GaN, AlGaN, AlInN, InGaN, AlN, or InN, and doped with a p-type dopant such as Mg, Zn, Ca, Sr, and Ba.

The first conductive type semiconductor layer 30 may include the p-type semiconductor layer, and the second conductive type semiconductor layer 50 may include the n-type semiconductor layer. Also, a third conductive type semiconductor layer (not shown) including the n-type or p-type semiconductor layer may be disposed on the second conductive type semiconductor layer 50. Thus, the light emitting structure layer may have at least one of an np junction structure, a pn junction structure, an npn junction structure, and a pnp junction structure. Also, impurities may be doped into the first conductive type semiconductor layer 30 and the second conductive type semiconductor layer 50 with uniform or non-uniform concentration. That is, the light emitting structure layer may have various structures, but is not limited thereto.

Also, a current interruption region (not shown) may be defined at a position, which partially overlaps the first electrode 60 between the second conductive type semiconductor layer 50 and the conductive support substrate 80. The current interruption region may be formed of a material having conductivity less than that of the conductive support substrate 80 or an electrical insulation material. Alternatively, plasma damage may be applied to the second conductive type semiconductor layer 50 to form the current interruption region. The current may be widely spread out by the current interruption region to improve optical efficiency of the active layer 40.

The light emitting diode may be a GaN-based light emitting diode, which emits blue light having a peak wavelength in a wavelength band of about 450 nm to about 480 nm, for example, a wavelength of about 465 nm and a FWHM of about 15 nm to about 40 nm.

It will be apparent to those skilled in the art that various modifications and variations can be made in the present invention. Thus, it is intended that the present invention covers the modifications and variations of this invention provided they come within the scope of the appended claims and their equivalents.

INDUSTRIAL APPLICABILITY

The present disclosure may be applied to a phosphor, a phosphor manufacturing method, and a white light emitting device.

The invention claimed is:

1. A luminescent material for use with a light emitting device, comprising a composition of one of $Sr_3AlSi_2O_{9/2}N_{8/3}$:Eu, $Sr_2AlSi_3O_{7/2}N_4$:Eu$_2$, $Sr_2Al_3Si_2O_{13/2}N_{8/3}$:Eu$_2$, or $Sr_2Al_3SiO_{13/2}N_{4/3}$:Eu$_2$, wherein at least one peak intensity of light in a wavelength of between about 480 nm to about 680 nm is provided by the luminescent material when excited by light from the light emitting device, and
wherein the composition has a crystal structure in which a portion of a Si—N bonding of a silicon nitride is substituted for an Al—N bonding or an Al—O bonding, and
further wherein the luminescent material of said composition has peak wavelengths in different wavelength bands, and the crystal structure for the luminescent material of said composition having one of the peak wavelengths in the different wavelength bands is different from the crystal structure of the luminescent material of said composition having another one of the peak wavelengths in the different wavelength bands.

2. The luminescent material of claim 1, wherein the light emitting device emits one of UV light and blue light.

3. The luminescent material of claim 1, wherein at least one peak intensity of light in a wavelength of about 350 to about 480 nm is included in the light emitted by the light emitting device.

4. The luminescent material of claim 1, wherein the luminescent material includes a yellow phosphor, a green phosphor and red phosphor,
wherein by weight, an amount of the yellow phosphor is greater than the red phosphor which is less than the green phosphor, and
wherein the amount of yellow phosphor and the green phosphor is different.

5. The luminescent material of claim 4, wherein the green phosphor emits light having a full width at half maximum (FWHM) of about 50 nm to about 100 nm, the yellow phosphor emits light having a FWHM of about 50 nm to about 100 nm or 120 nm or more, and the red phosphor emits light having a FWHM of about 70 nm to about 120 nm.

6. The luminescent material of claim 4, wherein the green phosphor is an oxynitride (ON)-based phosphor or a silicate-based phosphor.

7. The luminescent material of claim 4, wherein the yellow phosphor is a YAG phosphor, a TAG phosphor, or a silicate-based phosphor.

8. The luminescent material of claim 4, wherein the red phosphor is a phosphor having at least one element selected from Mg, Ca, Sr, and Ba, and Al, Si, O, and N.

9. The luminescent material of claim 4, wherein an amount of the yellow phosphor is the largest, an amount of the red phosphor is the smallest, and an amount of the green phosphor is less than that of the yellow phosphor and greater than that of the red phosphor.

10. A light emitting device, comprising:
a substrate;
a light emitting diode having active layer provided between first and second semiconductor layer, the first semiconductor layer includes a first superlattice structure and the second semiconductor layer includes a layer having Al, Ga and N,
phosphor provided over the light emitting diode, the phosphor including a yellow phosphor, a green phosphor and red phosphor, wherein by weight, amount of yellow phosphor is greater than the red phosphor which is less than the green phosphor, and the amount of yellow phosphor and the green phosphor is different, wherein
at least one of a composition of $Sr_3AlSi_2O_{9/2}N_{8/3}$:Eu, $Sr_2AlSi_3O_{7/2}N_4$:Eu$_2$, $Sr_2Al_3Si_2O_{13/2}N_{8/3}$:Eu$_2$, and the yellow phosphor comprises one of garnet-based phosphor, a silicate-based phosphor and nitride based phosphor,
the green phosphor emits light having a full width at half maximum (FWHM) of about 50 nm to about 100 nm, the yellow phosphor emits light having a FWHM of about 50 nm to about 100 nm or about 120 nm or more, and the red phosphor emits light having a FWHM of about 70 nm to about 120 nm, and
wherein the composition has a crystal structure in which a portion of a Si—N bonding of a silicon nitride is substituted for an Al—N bonding or an Al—O bonding, and
further wherein said composition has peak wavelengths in different wavelength bands, and the crystal structure for the composition having one of the peak wavelengths in the different wavelength bands is different from the crystal structure of said composition having another one of the peak wavelengths in the different wavelength bands.

11. The light emitting device according to claim 10, wherein the light emitting diode emits one of UV light and blue light.

12. The light emitting device according to claim 10, wherein at least one peak intensity of light in a wavelength of about 350 to about 480 nm is included in the light emitted by the light emitting diode.

13. The light emitting device according to claim 10, further comprising an encapsulant surrounds the light emitting diode, and
wherein the yellow phosphor, the green phosphor and the red phosphor are dispersed and distributed in the encapsulant.

14. The light emitting device according to claim 10, wherein the first superlattice structure comprises a first conductive type InGaN/GaN superlattice structure or InGaN/InGaN superlattice structure disposed between the first conductive type semiconductor layer and the active layer.

15. The light emitting device according to claim 10, wherein the second semiconductor layer comprises a second conductive type AlGaN layer disposed between the second conductive type semiconductor layer and the active layer.

16. The light emitting device according to claim 10, wherein the green phosphor is an oxynitride (ON)-based phosphor or a silicate-based phosphor.

17. The light emitting device according to claim 10, wherein the yellow phosphor is a YAG phosphor, a TAG phosphor, or a silicate-based phosphor.

18. The light emitting device according to claim 10, wherein the red phosphor is a phosphor having at least one element selected from Mg, Ca, Sr, and Ba, and Al, Si, O, and N.

* * * * *